US012590112B2

(12) United States Patent
Yamada et al.

(10) Patent No.: US 12,590,112 B2
(45) Date of Patent: Mar. 31, 2026

(54) ORGANIC COMPOUND AND ORGANIC LIGHT-EMITTING DEVICE

(71) Applicant: CANON KABUSHIKI KAISHA, Tokyo (JP)

(72) Inventors: Naoki Yamada, Tokyo (JP); Jun Kamatani, Tokyo (JP); Hironobu Iwawaki, Kanagawa (JP); Yosuke Nishide, Kanagawa (JP); Hirokazu Miyashita, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 857 days.

(21) Appl. No.: 17/935,352

(22) Filed: Sep. 26, 2022

(65) Prior Publication Data

US 2023/0139115 A1 May 4, 2023

(30) Foreign Application Priority Data

Sep. 28, 2021 (JP) ................................ 2021-158239

(51) Int. Cl.
*C07F 15/00* (2006.01)
*H10K 50/11* (2023.01)
(Continued)

(52) U.S. Cl.
CPC .......... *C07F 15/0033* (2013.01); *H10K 50/11* (2023.02); *H10K 50/12* (2023.02); (Continued)

(58) Field of Classification Search
None
See application file for complete search history.

(56) References Cited

U.S. PATENT DOCUMENTS

2009/0123720 A1* 5/2009 Chen .................. C07F 15/0033 252/301.16
2010/0109515 A1* 5/2010 Boerner ................ H05B 33/14 313/504

(Continued)

FOREIGN PATENT DOCUMENTS

CN 108395456 A * 8/2018 ............ C09K 11/06
JP 2008531684 A 8/2008

(Continued)

OTHER PUBLICATIONS

Machine translation of CN-108395456-A, translation generated Sep. 2025, 10 pages. (Year: 2025).*

*Primary Examiner* — Robert S Loewe

(74) *Attorney, Agent, or Firm* — Canon U.S.A., Inc. IP Division

(57) ABSTRACT

An organic compound represented by general formula [1]:

[1]

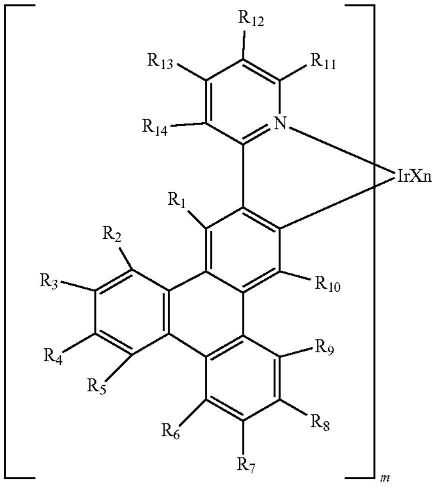

[2]

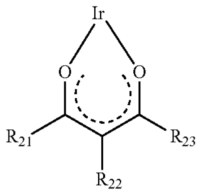

[3]

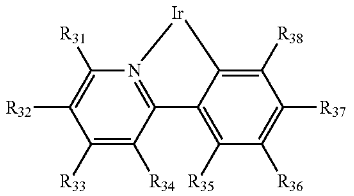

where in formula [1], $R_1$ to $R_{14}$ are each independently selected from, for example, a hydrogen atom and an alkyl group, provided that at least one of $R_1$ to $R_{14}$ is a tertiary alkyl group, m is an integer of 1 or more and 3 or less, and n is an integer of 0 or more and 2 or less, provided that m+n is 3, X is a bidentate ligand, and a partial structure IrX is any of structures represented by general formulae [2] and [3], where in formulae [2] and [3], $R_{21}$ to $R_{23}$, and $R_{31}$ to $R_{38}$ are each independently selected from, for example, a hydrogen atom and an alkyl group, and adjacent groups of $R_{35}$ to $R_{38}$ are optionally taken together to form a ring.

19 Claims, 7 Drawing Sheets

(51) Int. Cl.
*H10K 50/12* (2023.01)
*H10K 85/30* (2023.01)
*H10K 101/10* (2023.01)
*H10K 101/40* (2023.01)

(52) U.S. Cl.
CPC ....... *H10K 85/342* (2023.02); *H10K 2101/10* (2023.02); *H10K 2101/40* (2023.02)

(56) References Cited

U.S. PATENT DOCUMENTS

| | | | | |
|---|---|---|---|---|
| 2010/0127215 | A1* | 5/2010 | Boerner | C09K 11/06 252/301.16 |
| 2016/0164012 | A1 | 6/2016 | Lee et al. | |
| 2020/0087334 | A1 | 3/2020 | Ji et al. | |
| 2022/0127289 | A1* | 4/2022 | Kwon | H10K 85/342 |
| 2022/0185834 | A1* | 6/2022 | Kwon | H10K 85/342 |
| 2023/0122211 | A1* | 4/2023 | Kwon | C07F 15/0033 257/40 |
| 2023/0192719 | A1* | 6/2023 | Miyashita | C07F 15/0033 257/40 |
| 2023/0322691 | A1* | 10/2023 | Nishide | C07D 497/04 257/40 |

FOREIGN PATENT DOCUMENTS

| | | | |
|---|---|---|---|
| JP | 2010523528 | A | 7/2010 |
| JP | 2014141425 | A | 8/2014 |
| JP | 2014143405 | A | 8/2014 |
| JP | 2020125290 | A | 8/2020 |

* cited by examiner

ORGANIC COMPOUND AND ORGANIC LIGHT-EMITTING DEVICE

BACKGROUND OF THE INVENTION

Field of the Invention

The present disclosure relates to an organic compound and an organic light-emitting device.

Description of the Related Art

An organic light-emitting device (hereinafter, also referred to as an "organic electroluminescent device" or "organic EL device") is an electronic device including a pair of electrodes and an organic compound layer disposed between these electrodes. The injection of electrons and holes from these pairs of electrodes generates excitons in the light-emitting organic compound in the organic compound layer, and when the excitons return to the ground state, the organic light-emitting device emits light.

Recent progress in organic light-emitting devices has been remarkable, and their features include low driving voltage, various emission wavelengths, fast response time, and a contribution to enabling light-emitting apparatuses to be thinner and lighter.

Examples of high-efficiency light-emitting devices include devices containing high-efficiency materials, such as phosphorescent materials.

U.S. Patent Application Publication No. 2016/0164012 (PTL 1) describes an organic light-emitting device in which compound a-1 described below is used as a light-emitting dopant in a host material composed of a non-hydrocarbon compound.

U.S. Patent Application Publication No. 2020/0087334 (PTL 2) describes an organic light-emitting device in which compound a-2 described below is used as a light-emitting dopant in a host material composed of a non-hydrocarbon compound.

PCT Japanese Translation Patent Publication No. 2010-523528 (PTL 3) describes an organic light-emitting device in which compound a-3 described below is used as a light-emitting dopant in a host material composed of a non-hydrocarbon compound.

U.S. Patent Application Publication No. 2009/0123720 (PTL 4) describes an organic light-emitting device in which compound a-4 described below is used as a light-emitting dopant in a host material composed of a non-hydrocarbon compound.

a-1

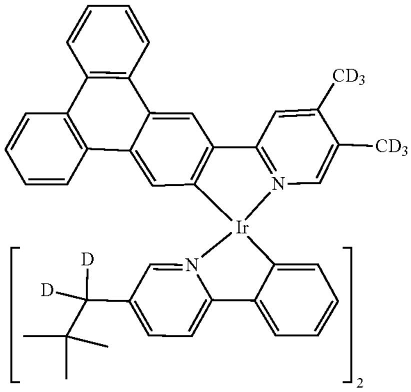

-continued a-2

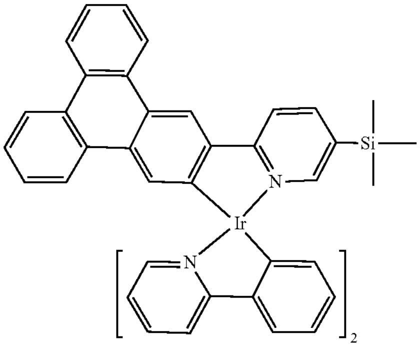

a-3

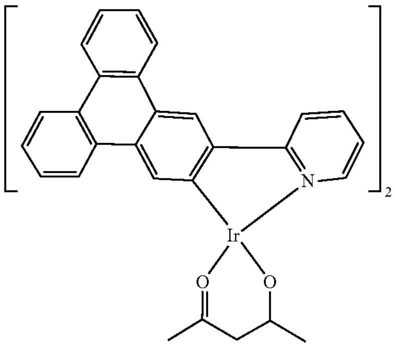

a-4

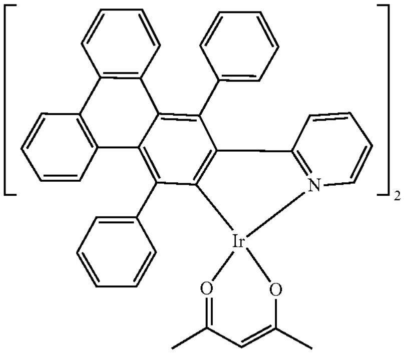

When compound a-4 is used for a light-emitting layer in an organic light-emitting device, the compound can be decomposed during vapor deposition for the production of the light-emitting device, and the compounds a-1 to a-3 have problems with luminous efficiency and driving durability characteristics in an organic light-emitting device containing a non-hydrocarbon compound as a host.

SUMMARY OF THE INVENTION

The present disclosure has been made in light of the foregoing disadvantages and provides an organic compound having high color purity and superior luminous efficiency.

One aspect of the present disclosure is directed to providing an organic compound,

[1]

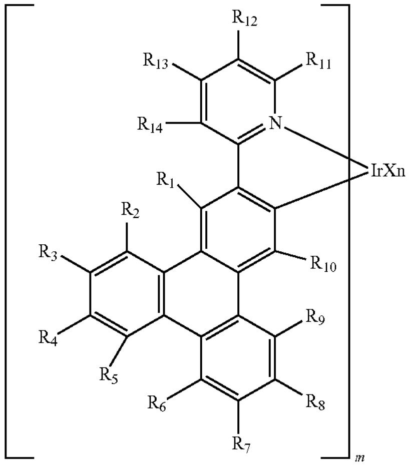

where in formula [1], $R_1$ to $R_{14}$ are each independently selected from a hydrogen atom, a deuterium atom, a halogen atom, a cyano group, a substituted or unsubstituted alkyl group, a substituted or unsubstituted aralkyl group, a substituted or unsubstituted alkoxy group, a substituted or unsubstituted aryloxy group, a substituted or unsubstituted heteroaryloxy group, a substituted or unsubstituted aryl group, and a substituted or unsubstituted heterocyclic group, provided that at least one of $R_1$ to $R_{14}$ is a tertiary alkyl group, m is an integer of 1 or more and 3 or less, and n is an integer of 0 or more and 2 or less, provided that m+n is 3, X is a bidentate ligand, and a partial structure IrX is any of structures represented by general formulae [2] and [3]:

[2]

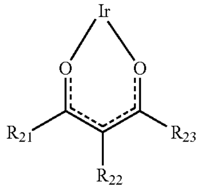

[3]

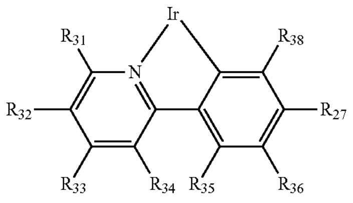

where in formulae [2] and [3], $R_{21}$ to $R_{23}$, and $R_{31}$ to $R_{38}$ are each independently selected from a hydrogen atom, a deuterium atom, a halogen atom, a cyano group, a substituted or unsubstituted alkyl group, a substituted or unsubstituted aralkyl group, a substituted or unsubstituted alkoxy group, a substituted or unsubstituted aryloxy group, a substituted or unsubstituted heteroaryloxy group, a substituted or unsubstituted aryl group, and a substituted or unsubstituted heterocyclic group, and adjacent groups of $R_{35}$ to $R_{38}$ are optionally taken together to form a ring.

Another aspect of the present disclosure is directed to providing an organic light-emitting device including, in sequence, a first electrode, a light-emitting layer, and a second electrode, in which the light-emitting layer contains a dopant material and a first compound having a higher lowest excited triplet energy level than the dopant material, the dopant material is a compound represented by general formula [1], and the first compound is a hydrocarbon compound,

[1]

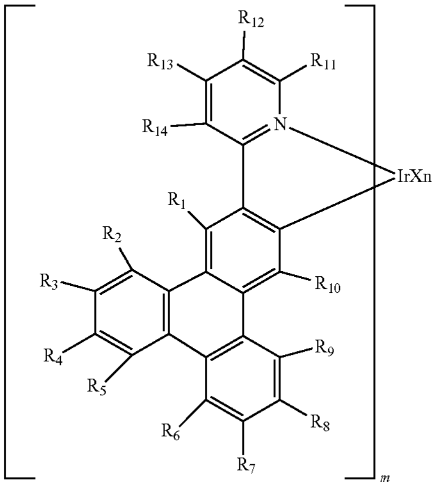

where in formula [1], $R_1$ to $R_{14}$ are each independently selected from a hydrogen atom, a deuterium atom, a halogen atom, a cyano group, a substituted or unsubstituted alkyl group, a substituted or unsubstituted aralkyl group, a substituted or unsubstituted alkoxy group, a substituted or unsubstituted aryloxy group, a substituted or unsubstituted heteroaryloxy group, a substituted or unsubstituted aryl group, and a substituted or unsubstituted heterocyclic group, provided that $R_1$ to $R_{14}$ do not contain a Si atom, m is an integer of 1 or more and 3 or less, and n is an integer of 0 or more and 2 or less, provided that m+n is 3, X is a bidentate ligand, and a partial structure IrX is any of structures represented by general formulae [2] and [3]:

[2]

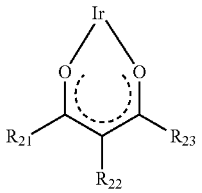

[3]

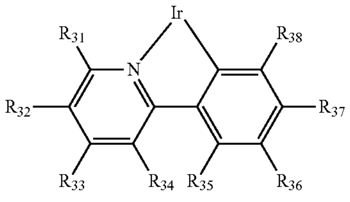

where in formulae [2] and [3], $R_{21}$ to $R_{23}$, and $R_{31}$ to $R_{38}$ are each independently selected from a hydrogen atom, a deuterium atom, a halogen atom, a cyano group, a substituted or unsubstituted alkyl group, a substituted or unsubstituted aralkyl group, a substituted or unsubstituted alkoxy group, a substituted or unsubstituted aryloxy group, a substituted or unsubstituted heteroaryloxy group, a substituted or unsubstituted aryl group, and a substituted or unsubstituted heterocyclic group, and adjacent groups of $R_{35}$ to $R_{38}$ are optionally taken together to form a ring.

Further features of the present disclosure will become apparent from the following description of exemplary embodiments with reference to the attached drawings.

Figure 1A:
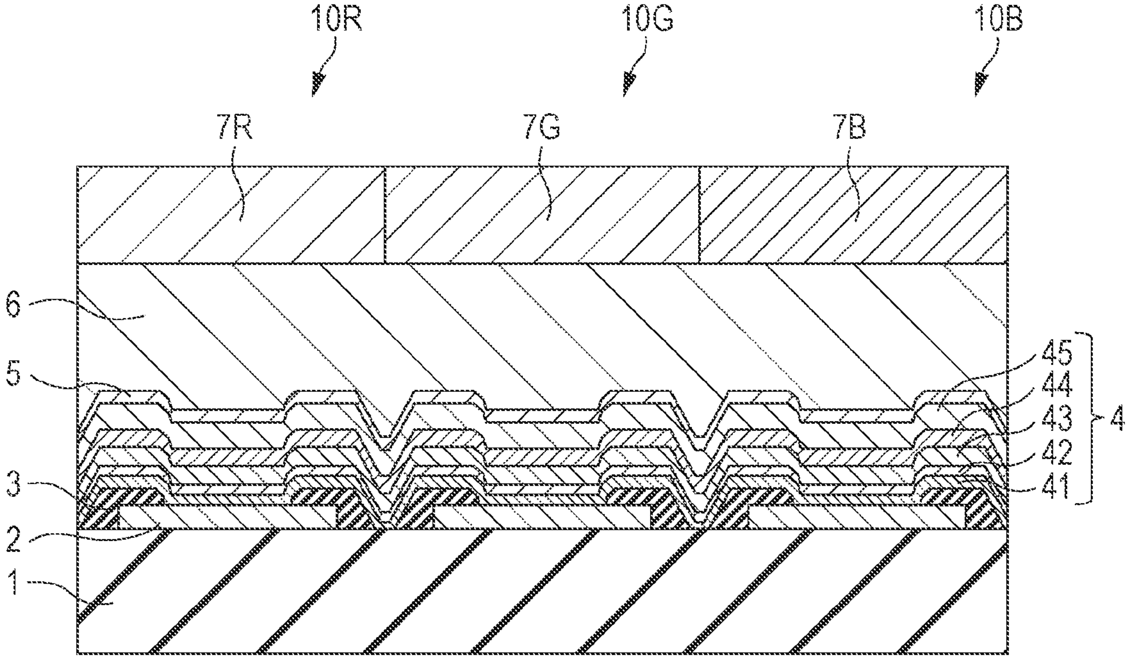
FIG. 1A is a schematic cross-sectional view of an example of a pixel of a display apparatus according to an embodiment of the present disclosure.

DESCRIPTION OF THE EMBODIMENTS (1) Organic Compound and Dopant Material According to Embodiment of the Present Disclosure An organic compound and a dopant material according to an embodiment of the present disclosure are each a compound represented by general formula [1]. The organic compound according to an embodiment of the present disclosure is a compound in which at least one of $R_1$ to $R_{14}$ is a tertiary alkyl group. The dopant material according to an embodiment of the present disclosure is a compound in which $R_1$ to $R_{14}$ do not contain a Si atom.

In this specification, a coordinate bond is indicated by a straight line or an arrow.

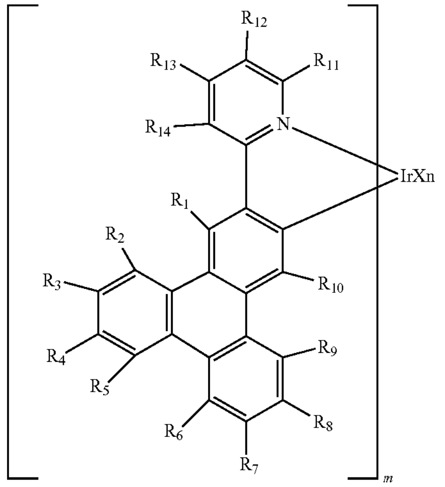

[1]

$R_1$ to $R_{14}$

In formula [1], $R_1$ to $R_{14}$ are each independently selected from a hydrogen atom, a deuterium atom, a halogen atom, a cyano group, a substituted or unsubstituted alkyl group, a substituted or unsubstituted aralkyl group, a substituted or unsubstituted alkoxy group, a substituted or unsubstituted aryloxy group, a substituted or unsubstituted heteroaryloxy group, a substituted or unsubstituted aryl group, and a substituted or unsubstituted heterocyclic group, provided that in the organic compound according to an embodiment of the present disclosure, at least one of $R_1$ to $R_{14}$ is a tertiary alkyl group. In the dopant material according to an embodiment of the present disclosure, $R_1$ to $R_{14}$ can be free of a Si atom.

Non-limiting examples of the halogen atom include fluorine, chlorine, bromine, and iodine.

Non-limiting examples of the alkyl group include a methyl group, an ethyl group, a n-propyl group, an isopropyl group, a n-butyl group, a tert-butyl group, a sec-butyl group, an octyl group, a cyclohexyl group, a tert-pentyl group, a 3-methylpentan-3-yl group, a 1-adamantyl group, and a 2-adamantyl group.

Among these, examples of the tertiary alkyl group include a tert-butyl group, a tert-pentyl group, a 3-methylpentan-3-yl group, and a 1-adamantyl group. The tert-butyl group can be used. As the alkyl group, an alkyl group having 1 or more and 10 or less carbon atoms can be used.

A non-limiting example of the aralkyl group is a benzyl group.

Non-limiting examples of the alkoxy group include a methoxy group, an ethoxy group, a propoxy group, a 2-ethyloctyloxy group, and a benzyloxy group. As the alkoxy group, an alkoxy group having 1 or more and 10 or less carbon atoms can be used.

Non-limiting examples of the aryloxy group include a phenoxy group and a naphthoxy group.

Non-limiting examples of the heteroaryloxy group include a furanyloxy group and a thienyloxy group.

Non-limiting examples of the aryl group include a phenyl group, a naphthyl group, an indenyl group, a biphenyl group, a terphenyl group, a fluorenyl group, a phenanthryl group, a triphenylenyl group, a pyrenyl group, an anthracenyl group, a perylenyl group, a chrysenyl group, and a fluoranthenyl group. As the aryl group, an aryl group having 6 or more and 30 or less carbon atoms can be used.

Non-limiting examples of the heterocyclic group include a pyridyl group, a pyrimidinyl group, a pyrazinyl group, a triazinyl group, a benzofuranyl group, a benzothiophenyl group, a dibenzofuranyl group, a dibenzothiophenyl group, an oxazolyl group, an oxadiazolyl group, a thiazolyl group, a thiadiazolyl group, a carbazolyl group, an acridinyl group, and a phenanthrolinyl group. As the heterocyclic group, a heterocyclic group having 3 or more and 27 or less carbon atoms can be used.

Non-limiting examples of substituents that may be further contained in the alkyl group, the aralkyl group, the alkoxy group, the aryloxy group, the heteroaryloxy group, the aryl group, and the heterocyclic group include a deuterium atom, alkyl groups, such as a methyl group, an ethyl group, a n-propyl group, an isopropyl group, a n-butyl group, and a tert-butyl group; aralkyl groups, such as a benzyl group; aryl groups, such as a phenyl group and a biphenyl group; heterocyclic groups, such as a pyridyl group and a pyrrolyl group; alkoxy groups, such as a methoxy group, an ethoxy group, and a propoxy group; aryloxy groups, such as a phenoxy group; halogen atoms, such as a fluorine atom, a chlorine atom, a bromine atom, and an iodine atom; a cyano group; and a thiol group.

In the organic compound according to an embodiment of the present disclosure, $R_1$ to $R_{14}$ can be free of a Si atom.

In the dopant material according to an embodiment of the present disclosure, at least one of $R_1$ to $R_{14}$ can be a tertiary alkyl group.

In the organic compound and the dopant material according to an embodiment of the present disclosure, at least one of $R_1$ to $R_{14}$ can be a hydrogen atom, a deuterium atom, a halogen atom, a cyano group, a substituted or unsubstituted alkyl group, or a substituted or unsubstituted alkoxy group. At least one of $R_{11}$ to $R_{14}$ can be a tertiary alkyl group. $R_{13}$ can be a tert-butyl group.

m and n

In formula [1], m is an integer of 1 or more and 3 or less, and n is an integer of 0 or more and 2 or less, provided that m+n is 3.

X

In formula [1], X is a bidentate ligand, and a partial structure IrX is any of structures represented by the following general formulae [2] and [3]:

[2]

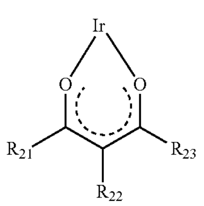

[3]

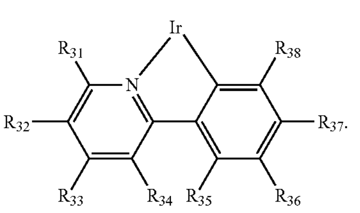

$R_{21}$ to $R_{23}$, and $R_{31}$ to $R_{38}$

In formulae [2] and [3], $R_{21}$ to $R_{23}$, and $R_{31}$ to $R_{38}$ are each independently selected from a hydrogen atom, a deuterium atom, a halogen atom, a cyano group, a substituted or unsubstituted alkyl group, a substituted or unsubstituted aralkyl group, a substituted or unsubstituted alkoxy group, a substituted or unsubstituted aryloxy group, a substituted or unsubstituted heteroaryloxy group, a substituted or unsubstituted aryl group, and a substituted or unsubstituted heterocyclic group.

Specific examples of the halogen atom, the alkyl group, the aralkyl group, the alkoxy group, the aryloxy group, the heteroaryloxy group, the aryl group, and the heterocyclic group that are represented by $R_{21}$ to $R_{23}$ and $R_{31}$ to $R_{38}$ include, but are not limited to, the same as those described for $R_1$ to $R_{14}$. As the alkyl group, an alkyl group having 1 or more and 10 or less carbon atoms can be used. As the alkoxy group, an alkoxy group having 1 or more and 10 or less carbon atoms can be used.

As the aryl group, an aryl group having 6 or more and 30 or less carbon atoms can be used. As the heterocyclic group, a heterocyclic group having 3 or more and 27 or less carbon atoms can be used. Specific examples of substituents that may further be contained in the alkyl group, the aralkyl group, the alkoxy group, the aryloxy group, the heteroaryloxy group, the aryl group, and the heterocyclic group include, but are not limited to, the same as those described for $R_1$ to $R_{14}$.

Adjacent groups of $R_{35}$ to $R_{38}$ are optionally taken together to form a ring. The expression "adjacent groups of $R_{35}$ to $R_{38}$ are taken together to form a ring" means that a ring formed by taking $R_{35}$ and $R_{36}$, $R_{36}$ and $R_{37}$, or $R_{37}$ and $R_{38}$ together and the benzene ring to which $R_{35}$ to $R_{38}$ are attached form a fused ring.

The compound illustrated in general formula [1] has the following features. (1-1) The ligand contains a triphenylene ring; thus, the compound has an emission wavelength of 520 nm to 550 nm, which is required as a green light-emitting dopant. (1-2) The ligand contains the triphenylene ring; thus, the compound has high hole transportability.

These features will be described below.

(1-1) The ligand contains a triphenylene ring; thus, the compound has an emission wavelength of 520 nm to 550 nm, which is required as a green light-emitting dopant.

The iridium complex illustrated in general formula [1] has high oscillator strength and high quantum yield of the complex due to the coordination of the triphenylene ring, which is formed of three fused benzene rings. As presented in Table 1, it was found that compound 1 in which the ligand contained a triphenylene ring had a longer emission wavelength than comparative compound 1 and had an emission wavelength of 520 nm to 550 nm, which is required for a green light-emitting dopant. Compound 1 is exemplified compound B-1 described below. The wavelength of a green emission line is 546 nm. A green phosphorescent material has a peak broadening to the long-wavelength side of a first emission peak. Thus, when the wavelength of the first emission peak is shorter than 546 nm, higher color purity is obtained, in some cases. Accordingly, an emission wavelength range of 520 nm to 550 nm can be used for the green light-emitting dopant. Regarding the emission wavelength described below, the peak value of an emission spectrum in a dilute toluene solution was used as the emission wavelength.

TABLE 1

| Compound | Structure | Emission wavelength |
|---|---|---|
| Compound 1 (B-1) | 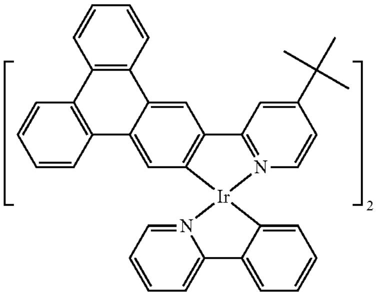 | 527 nm |
| Comparative compound 1 | 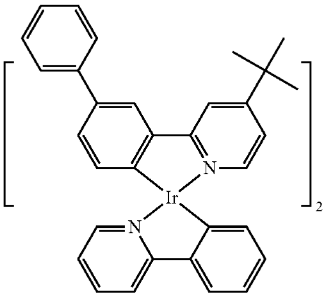 | 513 nm |

(1-2) The ligand contains the triphenylene ring; thus, the compound has high hole transportability.

The iridium complex represented by general formula [1] contains the triphenylene ring in the ligand and thus has high hole transportability. This seems to be due to the structure in which the triphenylene rings of the ligands easily overlap each other and thus hole hopping occurs easily between the ligands.

Moreover, the compound illustrated in general formula [1] can have the following features.

(1-3) At least one of $R_1$ to $R_{14}$ is a tertiary alkyl group; thus, the compound has improved sublimability.

(1-4) At least one of $R_{11}$ to $R_{14}$ can be a tertiary alkyl group.

(1-5) At least one of $R_1$ to $R_{14}$ can be a hydrogen atom, a deuterium atom, a halogen atom, a cyano group, a substituted or unsubstituted alkyl group, or a substituted or unsubstituted alkoxy group.

These features will be described below.

(1-3) At least one of $R_1$ to $R_{14}$ is a tertiary alkyl group; thus, the compound has improved sublimability.

The iridium complex represented by general formula [1] has the above-described features (1-1) and (1-2) because the triphenylene ring is contained. Meanwhile, since the iridium complex has such a fused polycyclic moiety, the iridium complex has a high molecular weight and thus may have inferior sublimability. Specifically, the temperature during sublimation purification may be high. The complex may be partially decomposed after sublimation purification. Thus, at least one of $R_1$ to $R_{14}$ can be a tertiary alkyl group. This suppresses molecular stacking of the complexes and reduces the sublimation temperature. The tertiary alkyl group is sterically bulky as compared with the hydrogen atom or the primary or secondary alkyl group; thus, the tertiary alkyl group has a greater exclusion effect between the complexes and is more effective in suppressing molecular stacking. The presence of the tertiary alkyl group can reduce the temperature-induced radical cleavage of a carbon-hydrogen bond located at the benzyl position in the case of a high temperature load.

Table 2 presents the bond dissociation energies of carbon-hydrogen bonds described in ACC. Chem. Res. 36, 255-263 (2003).

TABLE 2

| | Bond | Bond dissociation energy (kcal/mol) |
|---|---|---|
| Methyl group | 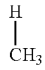 | 105 |
| Ethyl group | 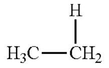 | 101 |
| Phenyl group | 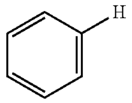 | 113 |
| Benzyl group | 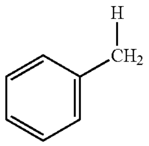 | 90 |

A larger value of the bond dissociation energy indicates a stronger bond, and a smaller value thereof indicates a weaker bond. That is, it can be seen that the carbon-hydrogen bond located at the benzyl position is a weak bond. This is because when a hydrogen atom located at the benzyl position is eliminated to generate a radical, the radical is stabilized owing to the π-electron resonance with the neighboring benzene ring. Thus, the carbon-hydrogen bond located at the benzyl position is a weak bond. That is, when a compound has a molecular structure that does not contain a moiety such as a benzyl group, the compound can be one in which the carbon-hydrogen bond is not easily cleaved.

Table 3 presents the sublimation temperatures of materials during sublimation purification. The degree of vacuum during the sublimation purification is in the range of $1\times10^{-3}$ to $1\times10^{-2}$ Pa. Compound 3 is exemplified compound A-1 described later, and comparative compound 2 is compound a-2. Table 3 indicates that when at least one of $R_1$ to $R_{14}$ is a tertiary alkyl group, the compound has a low sublimation temperature.

TABLE 3

| Compound | Structure | Sublimation temperature |
| --- | --- | --- |
| Compound 1 (B-1) | 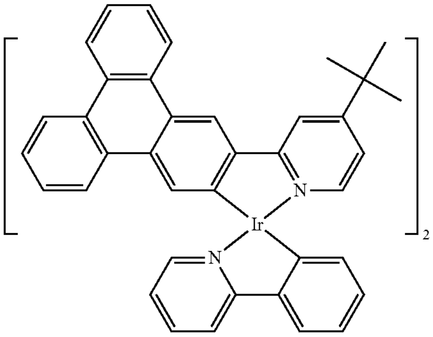 | 410° C. |
| Compound 2 | 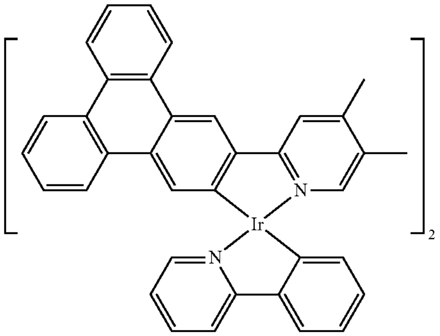 | 430° C. |
| Compound 3 (A-1) | 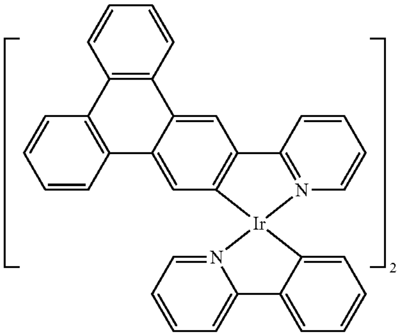 | 440° C. |
| Comparative compound 2 (a-2) | 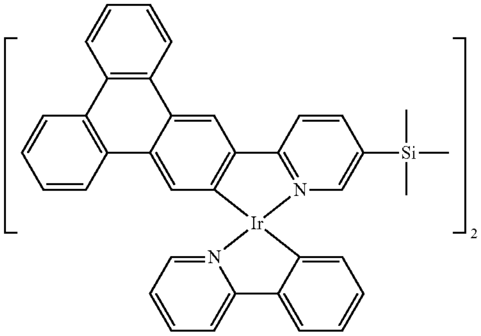 | 420° C. |

(1-4) At least one of $R_1$ to $R_{14}$ can be a tertiary alkyl group.

The tertiary alkyl group described in (1-3) is a highly electron-donating group. In the iridium complex represented by general formula [1], the lowest unoccupied molecular orbital (LUMO) is distributed on the side of the pyridine ring attached to the triphenylene ring of the ligand. Accordingly, when at least one of $R_{11}$ to $R_{14}$ is a tertiary alkyl group, the compound emits shorter-wavelength light with better color purity in terms of green. Table 4 presents the difference in emission wavelength depending on whether $R_{13}$ in general formula [1] is a tert-butyl group. When $R_{13}$ is a tert-butyl group, the emission wavelength is shortened by 5 nm, and the compound emits light with better color purity in terms of green.

TABLE 4

| Compound | Structure | Emission wavelength |
|---|---|---|
| Compound 1 (B-1) | 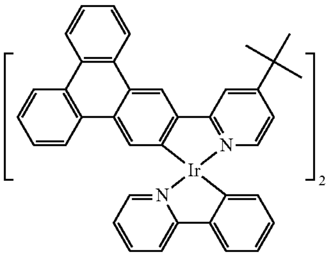 | 527 nm |
| Compound 3 (A-1) | 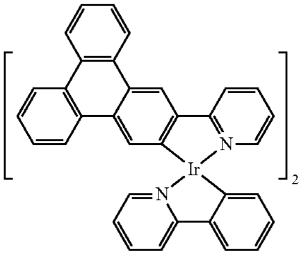 | 533 nm |

As described in (1-2), the iridium complex represented by general formula [1] contains the triphenylene ring in the ligand and thus has high hole transportability. The reason for this is presumably due to the structure in which the triphenylene rings of the ligands easily overlap each other and thus hole hopping occurs easily between the ligands. Thus, in order not to reduce the overlap between the triphenylene rings, at least one of $R_{11}$ to $R_{14}$ can be a tertiary alkyl group. (1-5) At least one of $R_1$ to $R_{14}$ can be a hydrogen atom, a deuterium atom, a halogen atom, a cyano group, a substituted or unsubstituted alkyl group, or a substituted or unsubstituted alkoxy group.

As described in (1-3), at least one of $R_1$ to $R_{14}$ is a tertiary alkyl group; thus, the compound has improved sublimability. Moreover, at least one of $R_1$ to $R_{14}$ can be a hydrogen atom, a deuterium atom, a halogen atom, a cyano group, a substituted or unsubstituted alkyl group, or a substituted or unsubstituted alkoxy group, which has low planarity and high bond energy.

The iridium complex represented by general formula [1] has a high molecular weight and strong ligand stacking properties; thus, the iridium complex has inferior sublimability, in some cases. The use of a hydrogen atom, a deuterium atom, a halogen atom, a cyano group, an alkyl group, or an alkoxy group can be less likely to lead to a high sublimation temperature than highly planar groups, such as a phenyl group and fused polycyclic groups.

A hydrogen atom, a deuterium atom, a halogen atom, a cyano group, an alkyl group, and an alkoxy group have high bond energy with carbon of the triphenylene ring, compared with an amino group and a carbon-silicon bond such as a silyl group. Thus, at a high sublimation temperature, the possibility of the decomposition during sublimation or deposition can be reduced. Comparative compound 2 presented in Table 3 has a trimethylsilyl group having low bond dissociation energy and was decomposed during sublimation purification.

SPECIFIC EXAMPLES

While specific examples of the organic compound and the dopant material according to an embodiment of the present disclosure are illustrated below, they are not limited thereto.

A-1

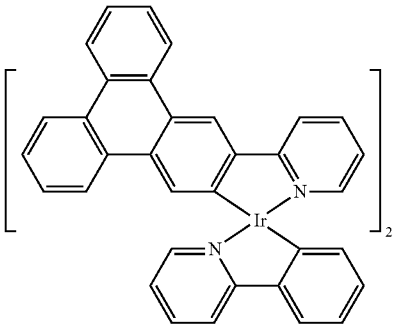

A-2

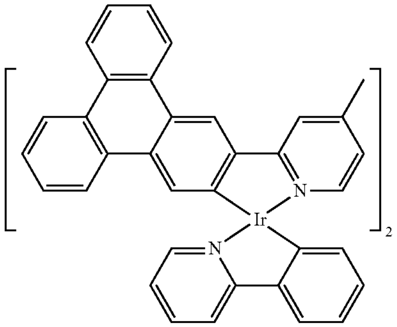

A-3

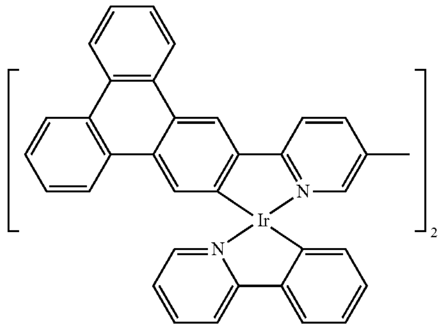

A-4

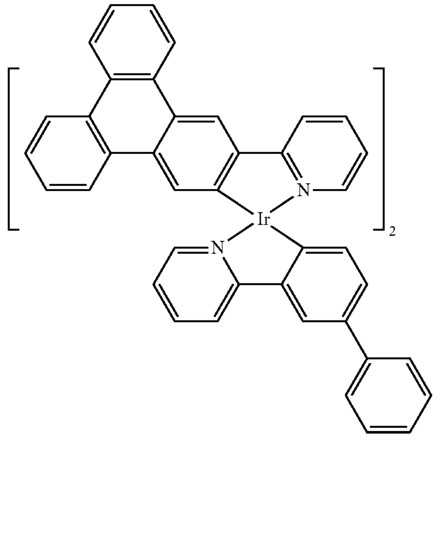

-continued
A-5
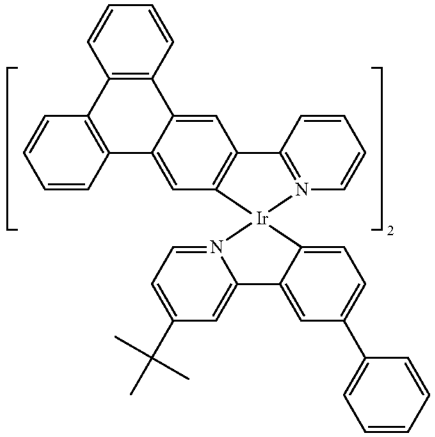
A-6
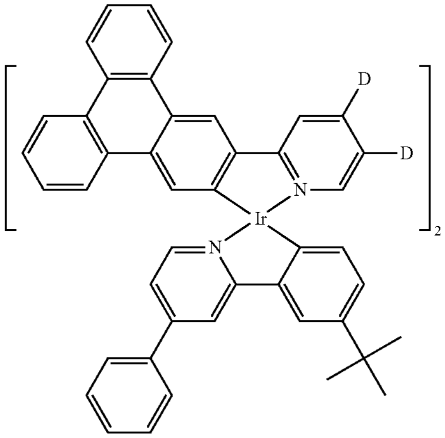
A-7
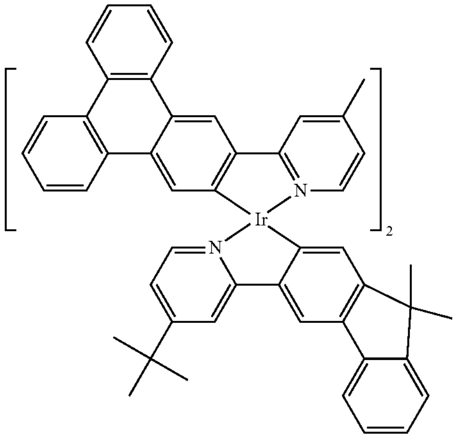
-continued
A-8
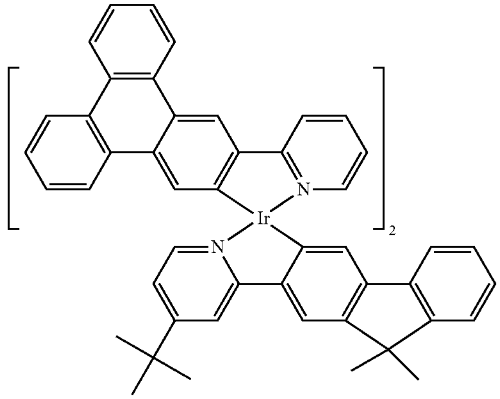
A-9
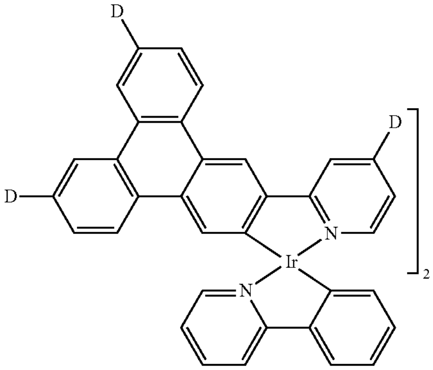
A-10
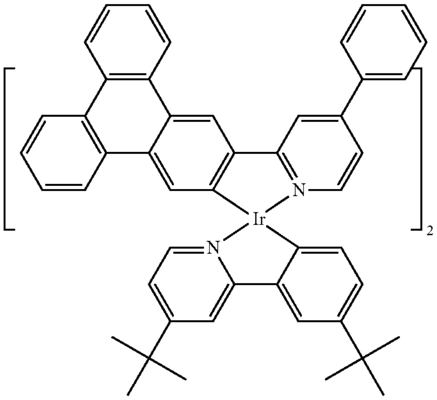
A-11
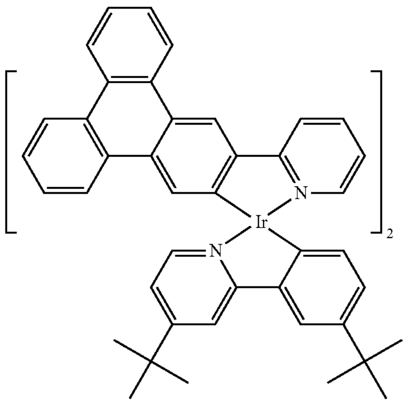

-continued
A-12
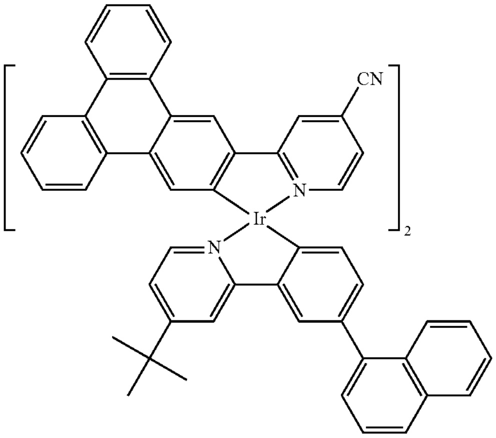
A-13
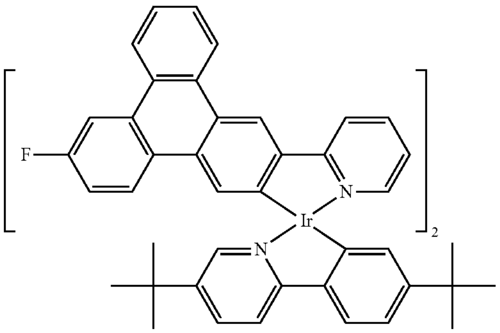
A-14
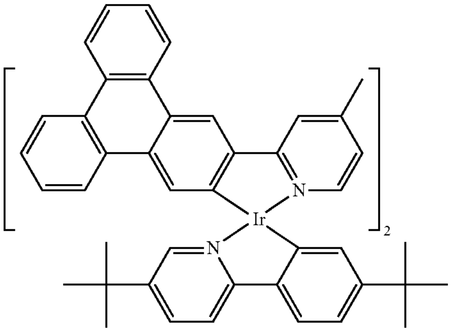
A-15
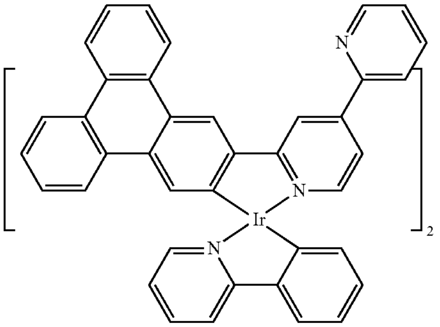
-continued
A-16
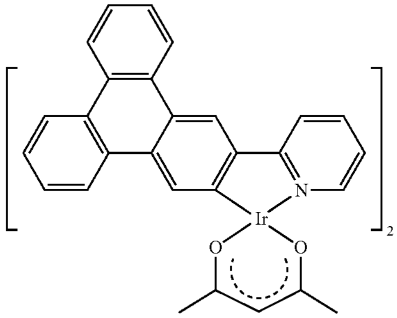
A-17
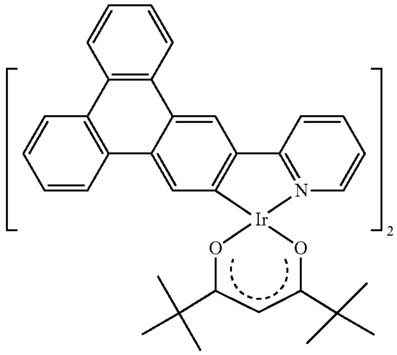
A-18
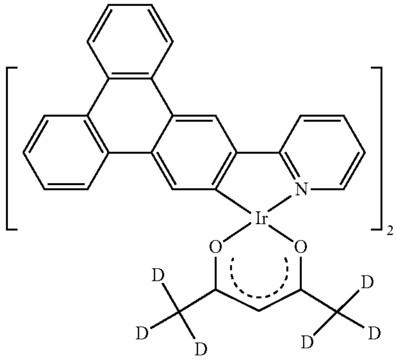
A-19
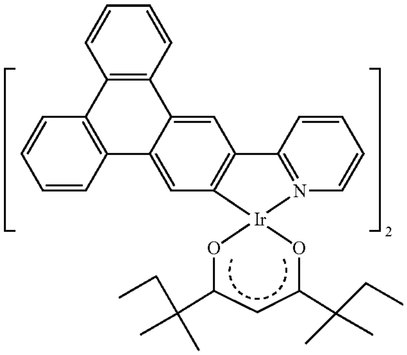

-continued
A-20
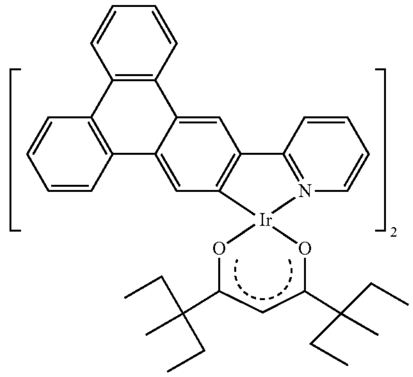
B-1
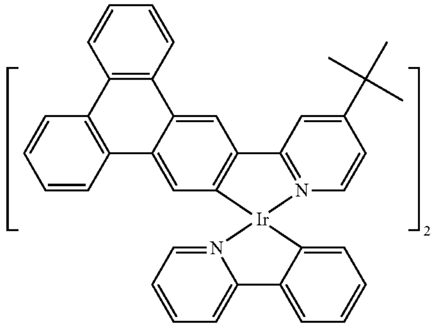
B-2
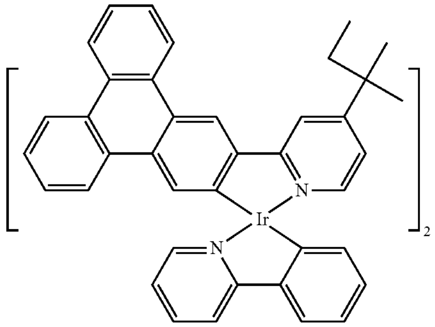
B-3
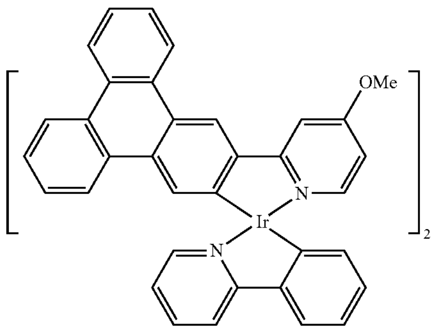
-continued
B-4
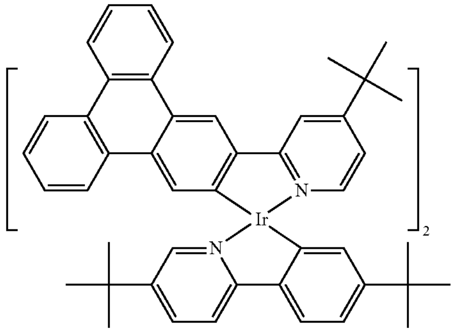
B-5
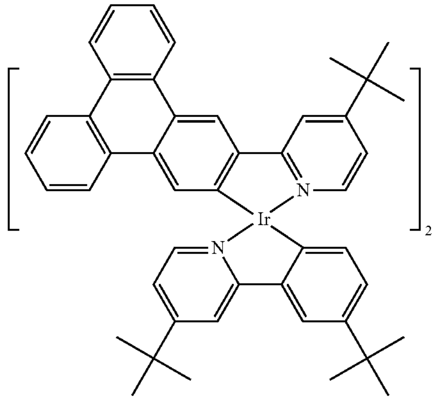
B-6
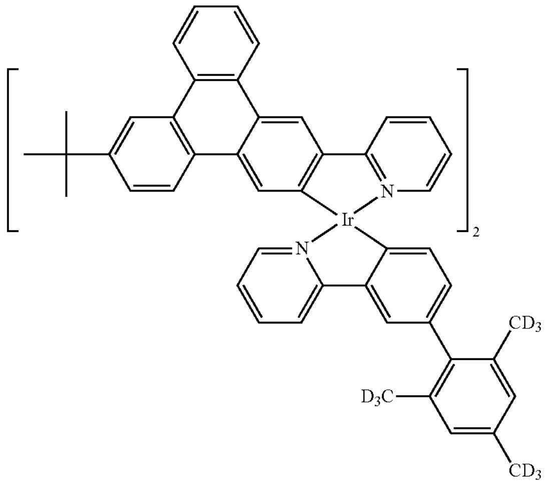
B-7
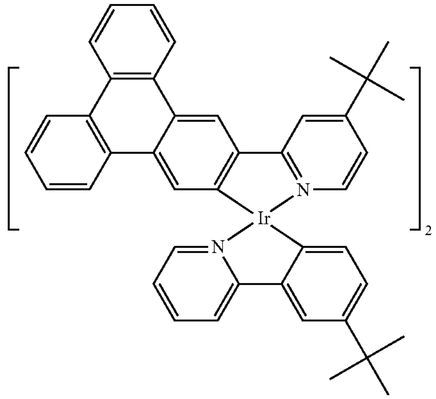

-continued
B-8
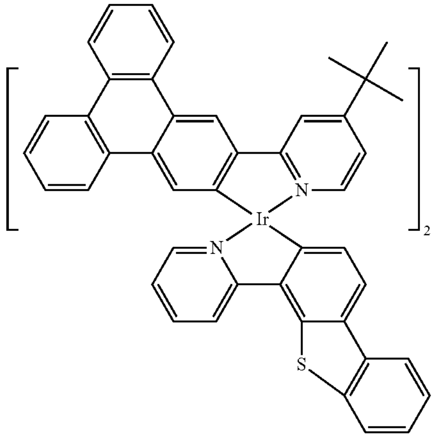
B-9
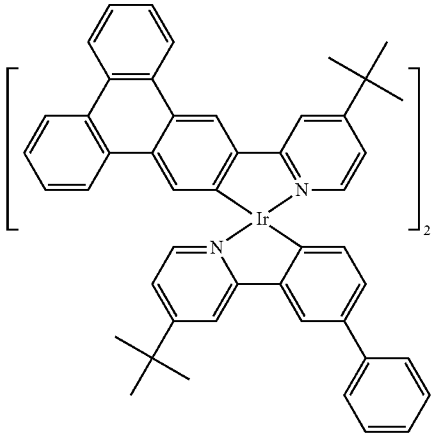
B-10
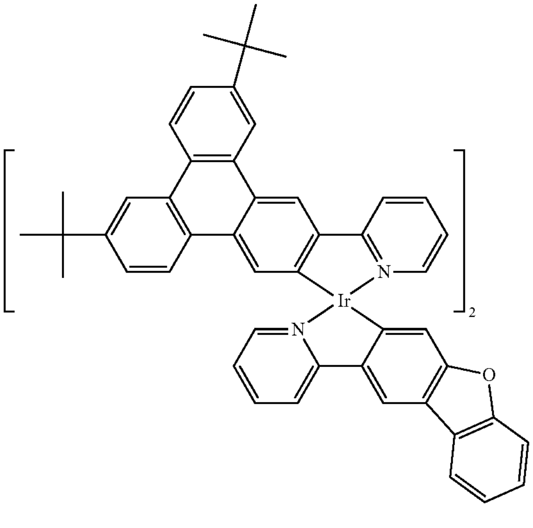
-continued
B-11
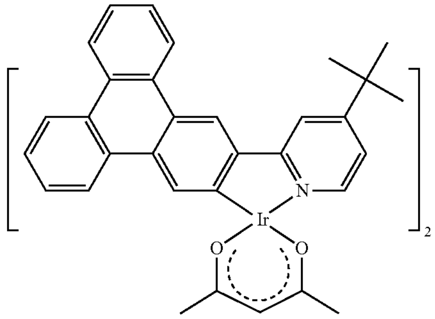
B-12
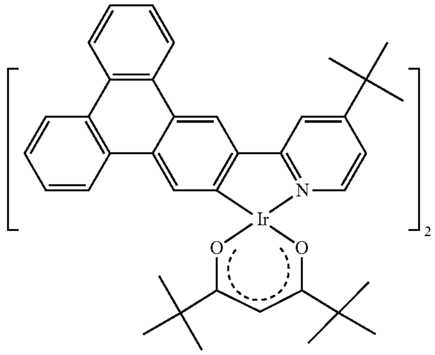
B-13
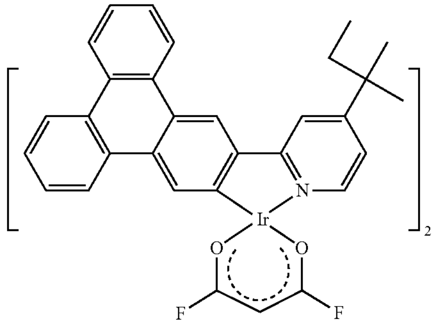
B-14
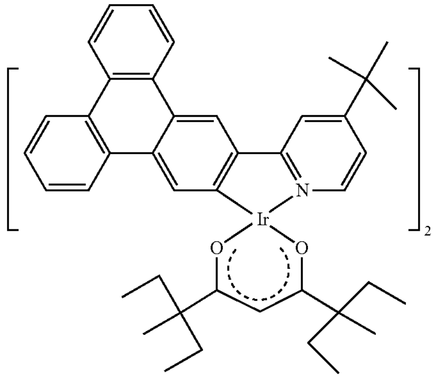

-continued
B-15
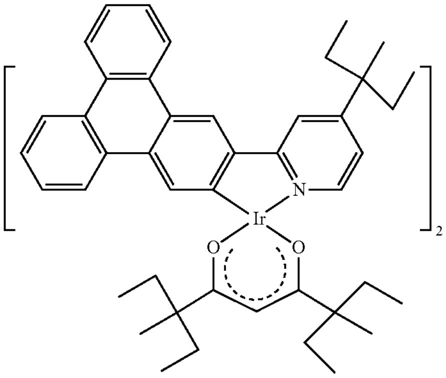
C-1
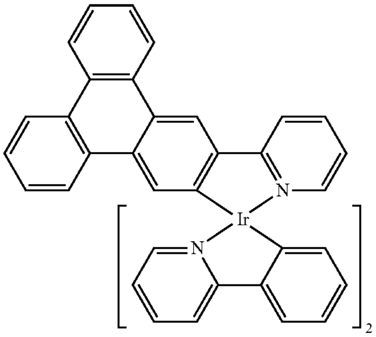
C-2
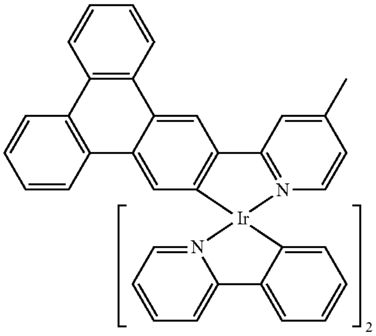
C-3
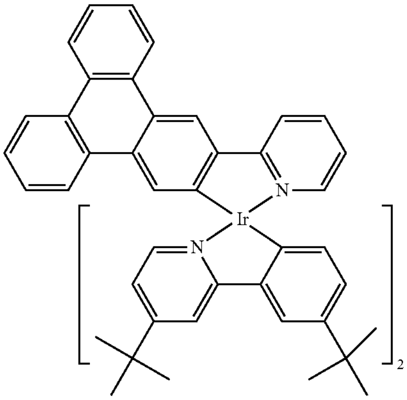
-continued
C-4
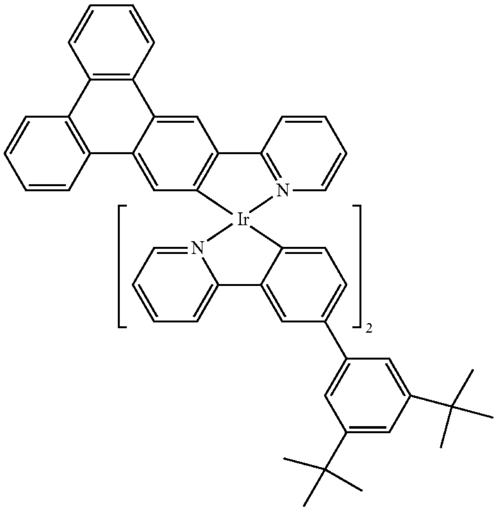
C-5
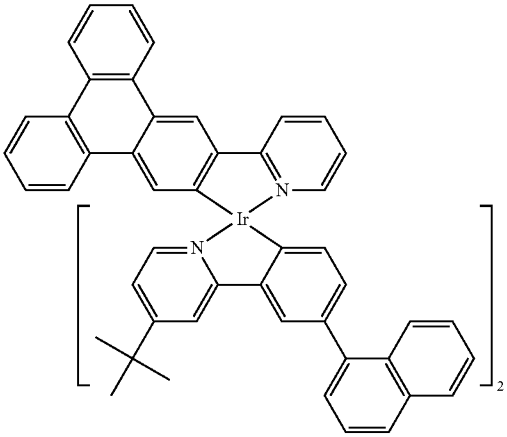
C-6
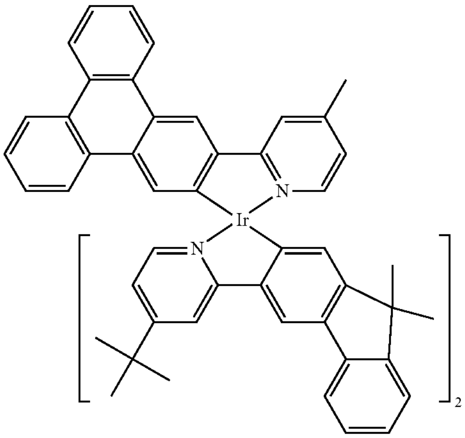

-continued
C-7
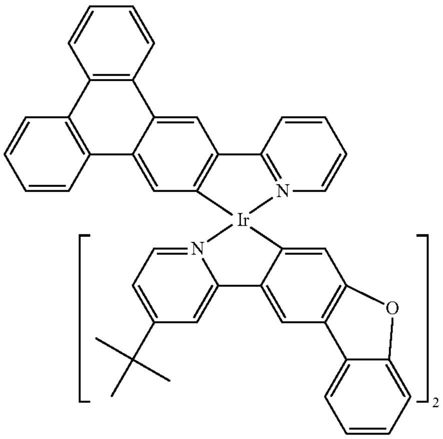
C-8
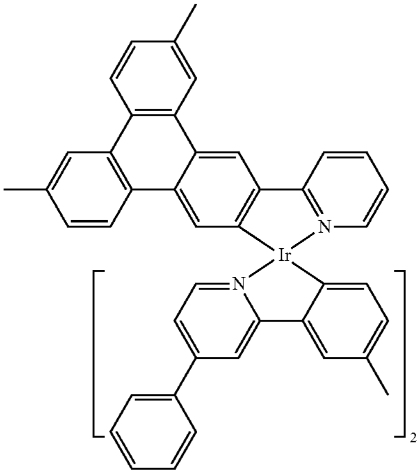
C-9
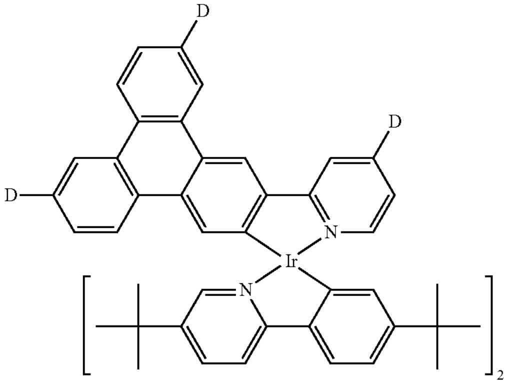
-continued
C-10
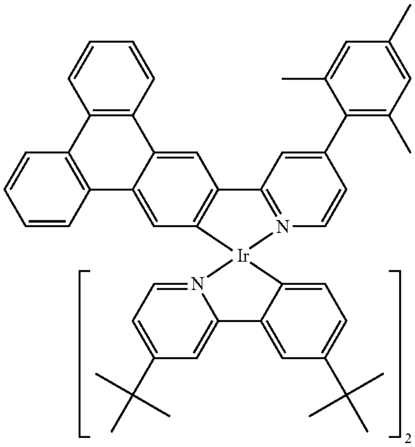
C-11
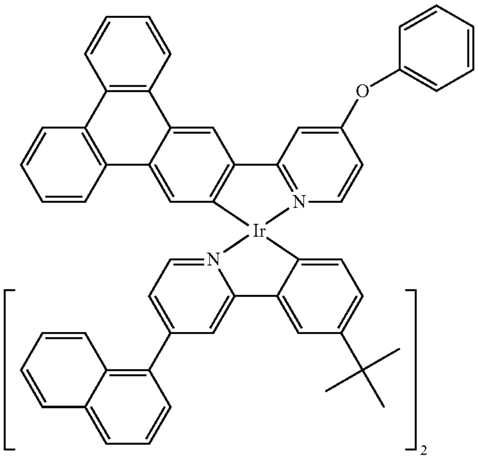
C-12
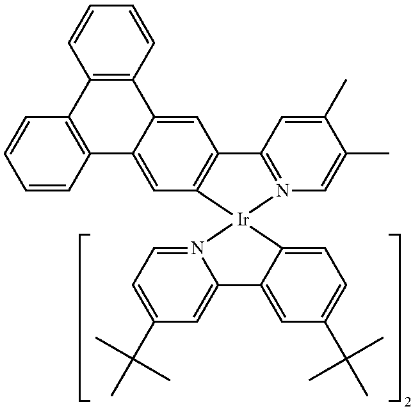

-continued
C-13
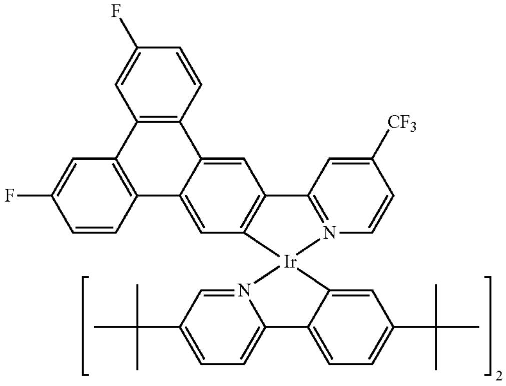
C-14
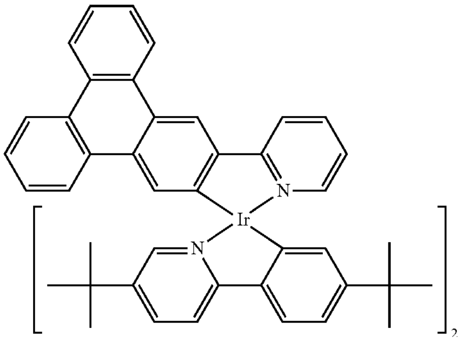
C-15
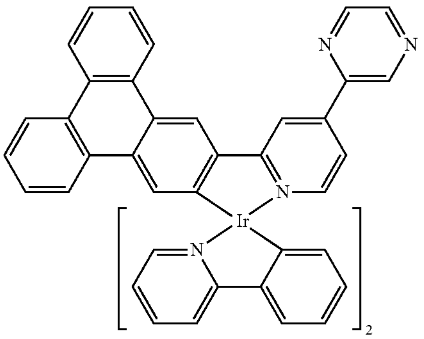
C-16
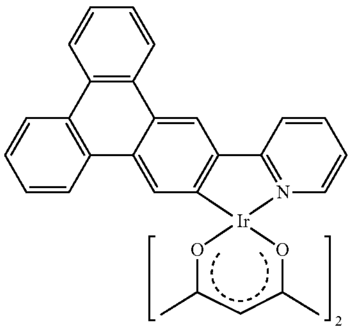
-continued
C-17
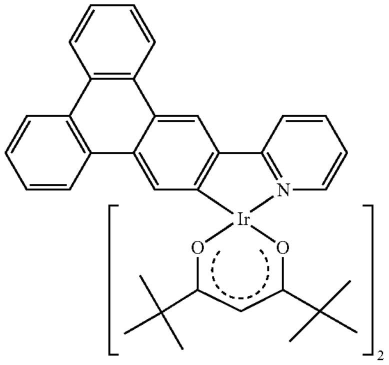
C-18
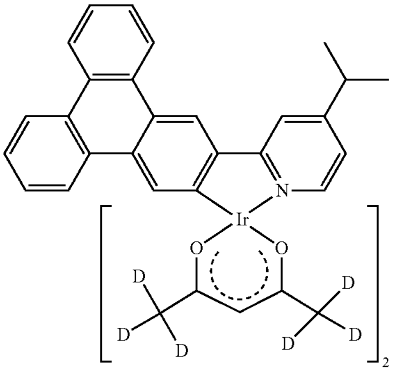
C-19
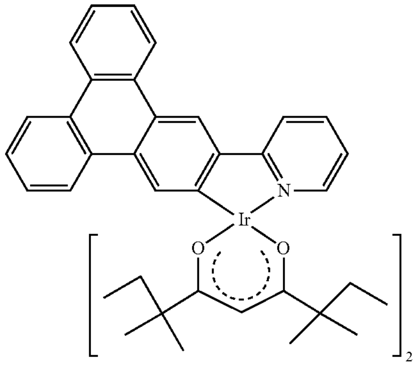
C-20
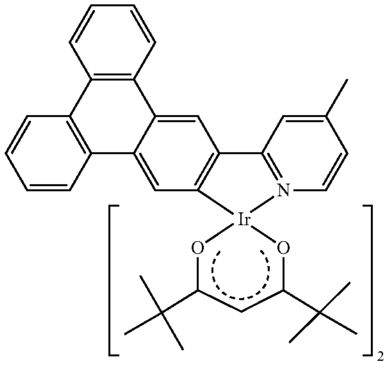

-continued
D-1
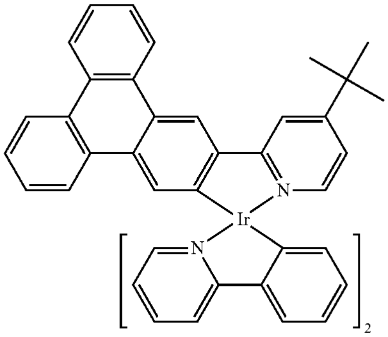
D-2
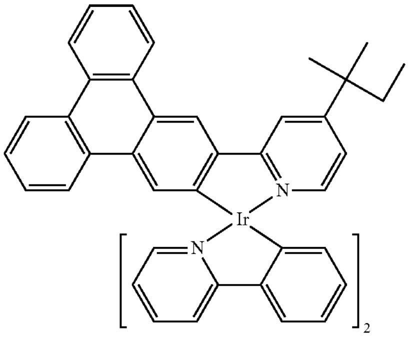
D-3
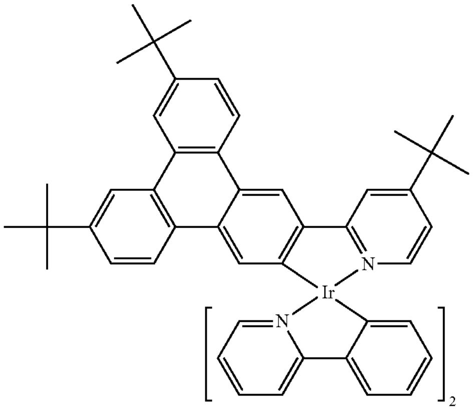
D-4
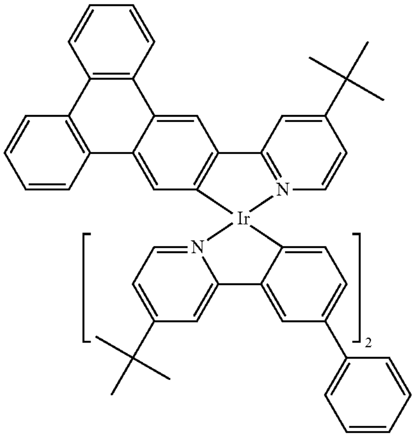
-continued
D-5
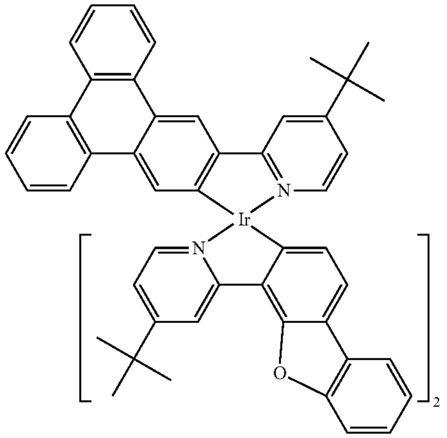
D-6
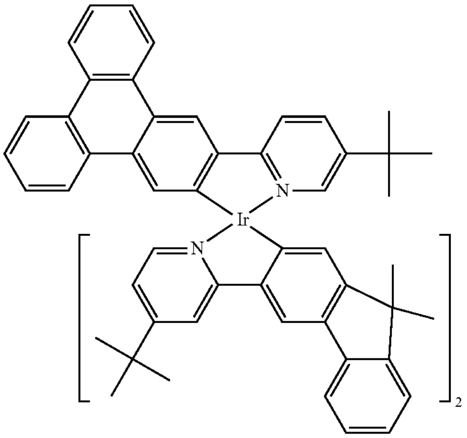
D-7
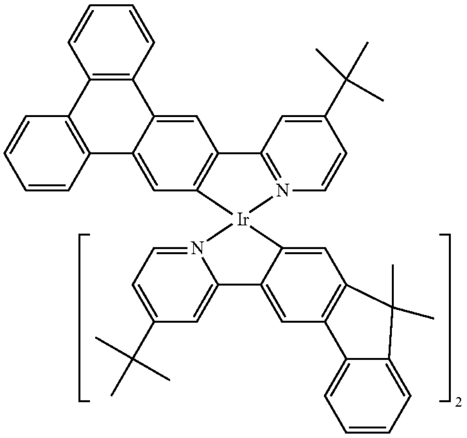

-continued
D-8
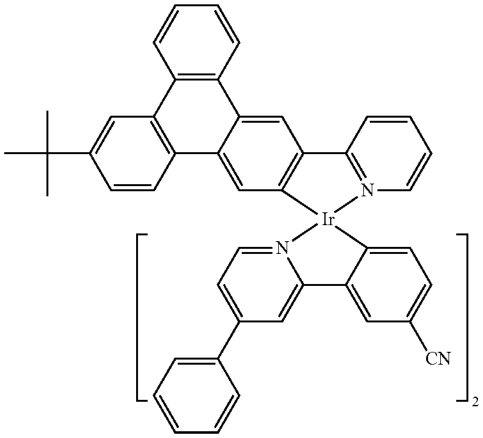
D-9
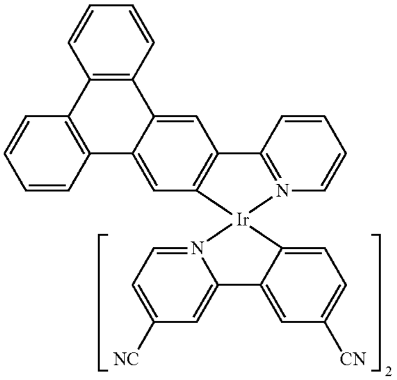
D-10
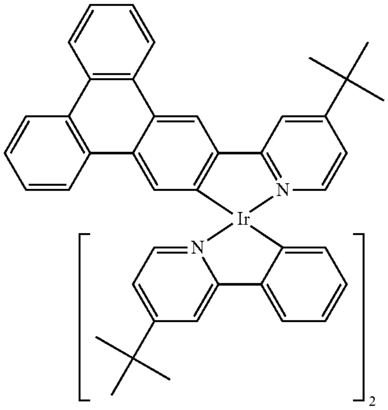
D-11
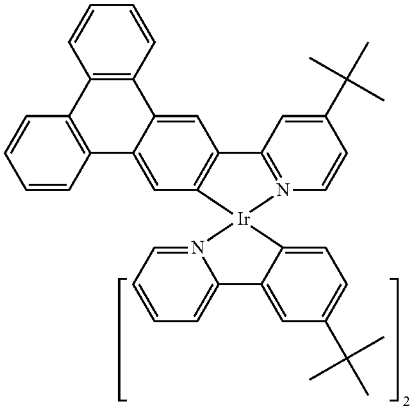
-continued
D-12
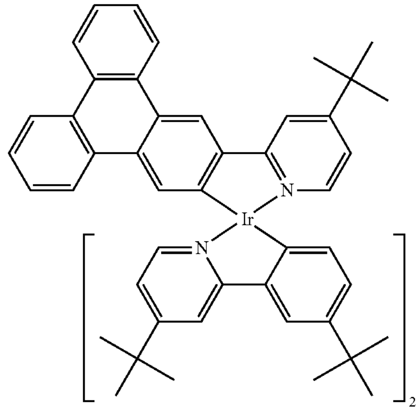
D-13
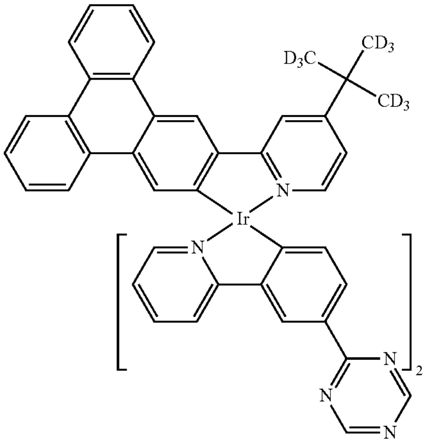
D-14
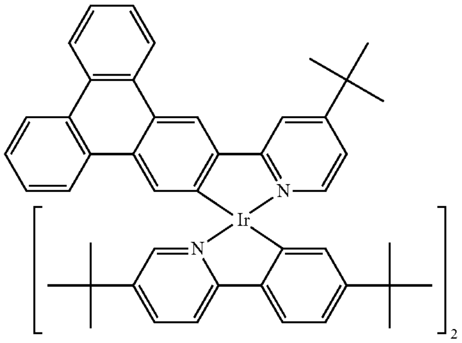
D-15
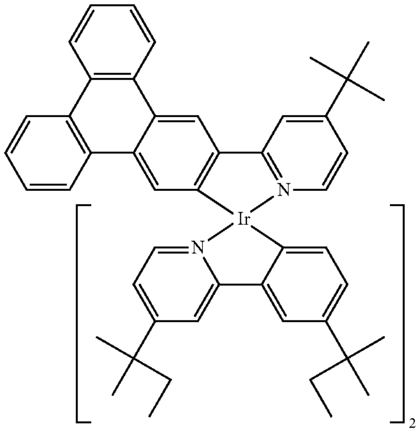

-continued
D-16
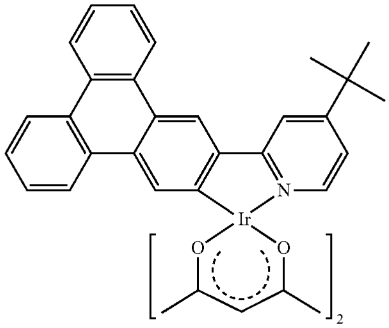
D-17
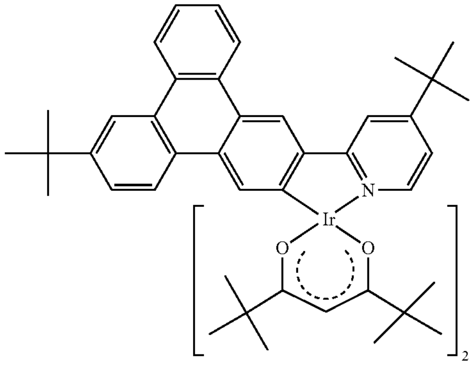
D-18
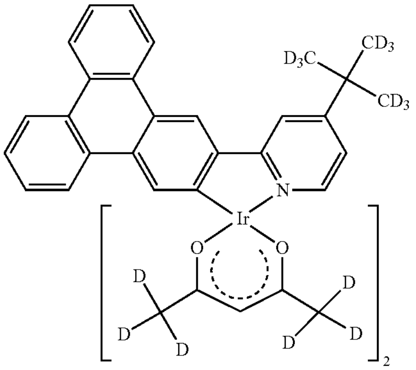
D-19
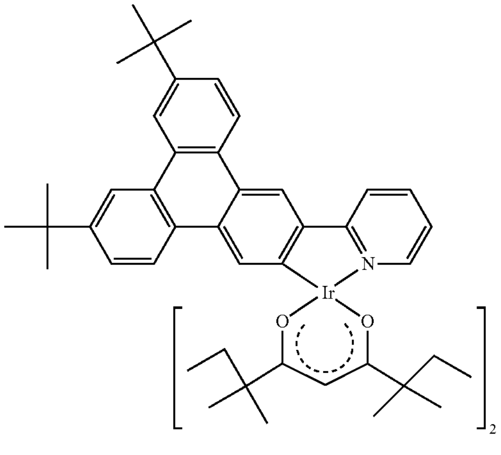
-continued
D-20
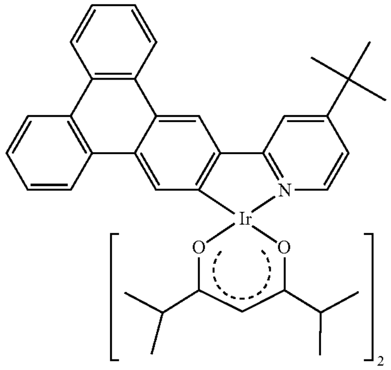
E-1
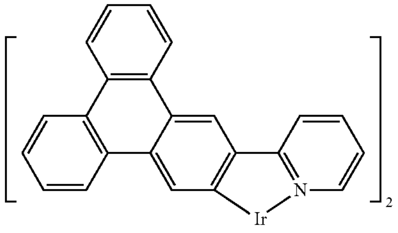
E-2
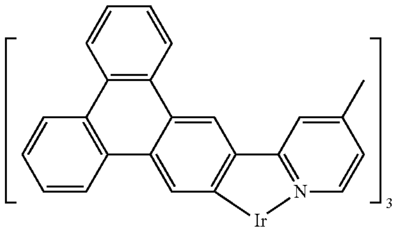
E-3
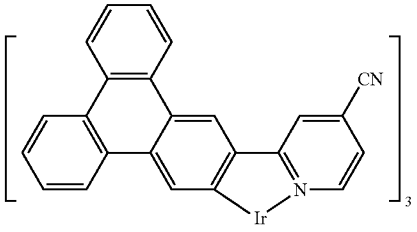
E-4
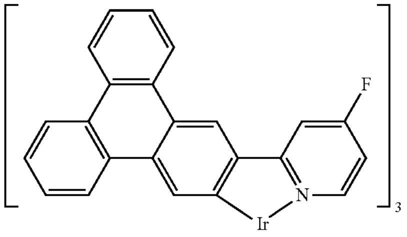
E-5
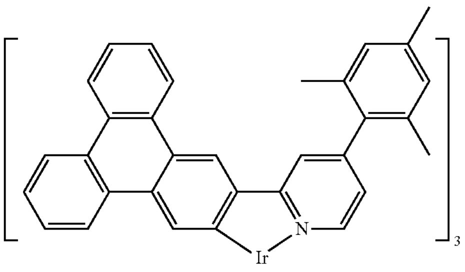

-continued

F-1

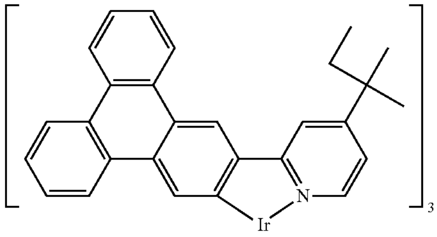

F-2

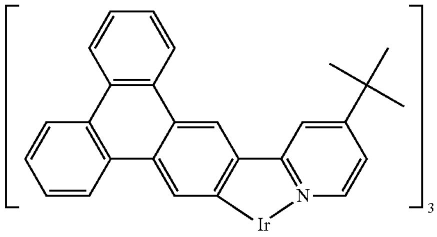

F-3

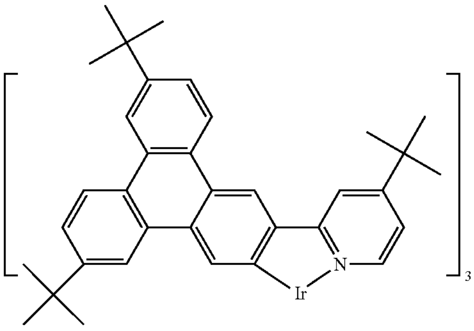

F-4

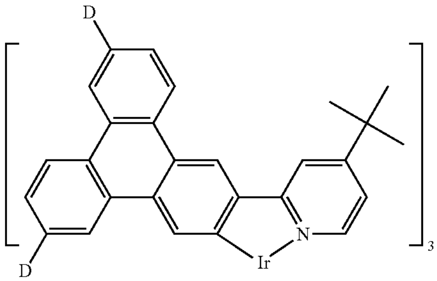

F-5

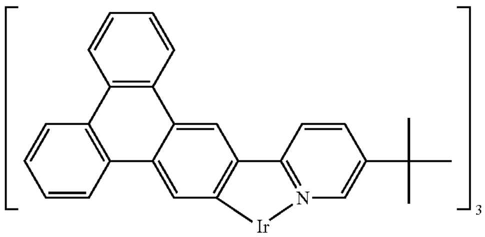

Exemplified compounds belonging to group A and exemplified compound B-3 are each a compound that is represented by general formula [1] and that contains two ligands each containing a triphenylene ring. Each of the compounds has two highly planar triphenylene rings and thus has high hole mobility and a high degree of orientation, thereby resulting in improved light extraction efficiency of the light-emitting device.

Exemplified compounds belonging to group B, excluding exemplified compound B-3, are each a compound that is represented by general formula [1] and that has two ligands each containing a triphenylene ring, in which each ligand containing the triphenylene ring contains a tertiary alkyl group. Reducing intermolecular stacking can result in improved sublimability and suppression of concentration quenching in the light-emitting layer.

Exemplified compounds belonging to group C and exemplified compound D-9 are each a compound that is represented by general formula [1] and that contains one ligand containing a triphenylene ring. Each of the compounds contains the highly planar triphenylene ring and thus has high hole mobility. In addition, each compound has a lower molecular weight and a lower sublimation temperature than compounds belonging to group A and exemplified compound B-3.

Exemplified compounds belonging to group D, excluding exemplified compound D-9, are each a compound that is represented by general formula [1] and that contains one ligand containing a triphenylene ring, in which the ligand containing the triphenylene ring contains a tertiary alkyl group. The intermolecular stacking is reduced as compared with the compounds of group C and exemplified compound D-9. This can result in improved sublimability and suppression of concentration quenching in the light-emitting layer.

Exemplified compounds belonging to group E are each a compound that is represented by general formula [1] and that contains three ligands each containing a triphenylene ring. The compound has three highly planar triphenylene rings and thus has very high hole mobility.

Exemplified compounds belonging to group F are each a compound that is represented by general formula [1] and that contains three ligands each containing a triphenylene ring, in which each ligand containing the triphenylene ring contains a tertiary alkyl group. The intermolecular stacking is reduced as compared with the compounds of group E. This can result in improved sublimability and suppression of concentration quenching in the light-emitting layer.

Among these, the compounds illustrated below can be used.

B-1

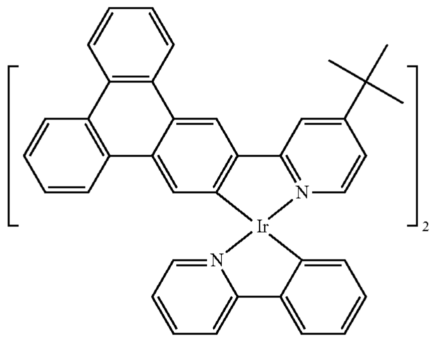

-continued

B-4

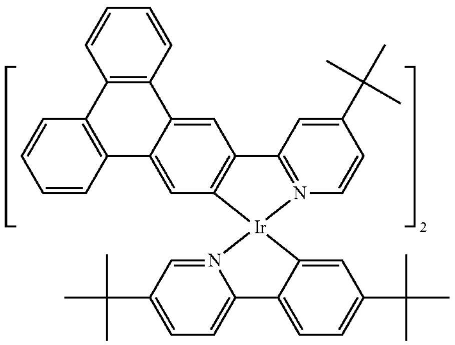

B-5

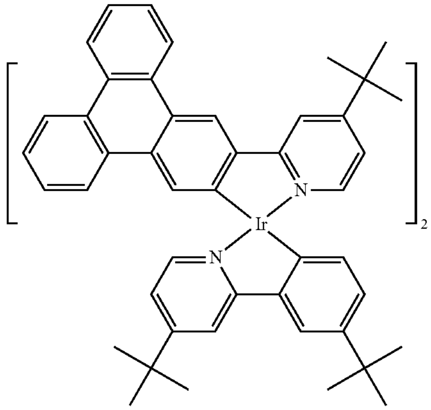

B-9

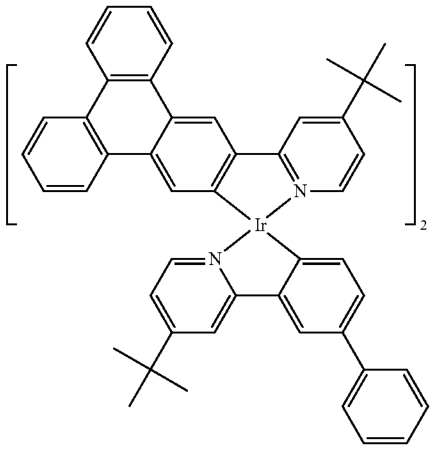

D-1

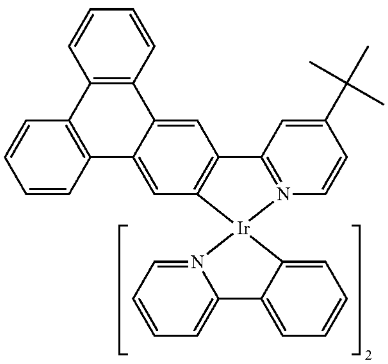

-continued

D-14

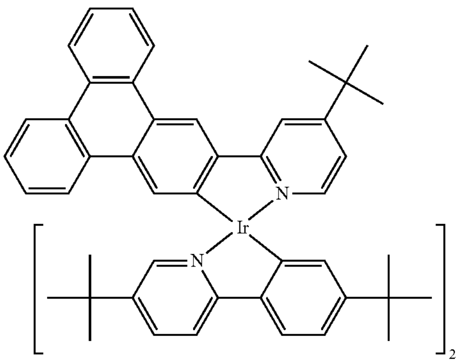

D-12

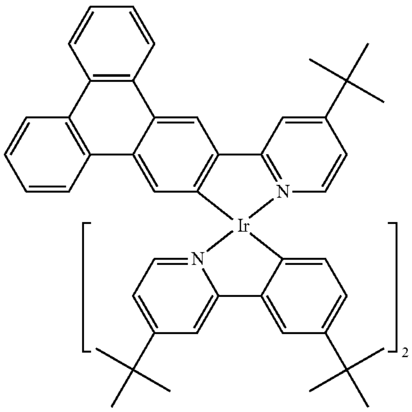

D-4

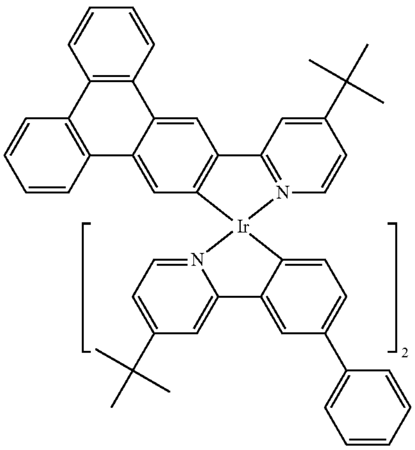

(2) Features of Organic Light-Emitting Device

An organic light-emitting device according to an embodiment of the present disclosure includes, in sequence, a first electrode, a light-emitting layer, and a second electrode, in which the light-emitting layer contains a dopant material and a first compound having a higher lowest excited triplet energy level than the dopant material. The organic light-emitting device has the following features.

(2-1) The dopant material in the light-emitting layer is a compound represented by general formula [1], and the first compound is a hydrocarbon compound, thereby resulting in a strong interaction between the dopant material and the first compound and easy energy transfer.

(2-2) The effect of (2-1) promotes the hole hopping transport between the dopant material and a host material and thus improves the hole transportability in the light-emitting layer.

These features will be described below.

(2-1) The dopant material in the light-emitting layer is a compound represented by general formula [1], and the first compound is a hydrocarbon compound, thereby resulting in a strong interaction between the dopant material and the first compound and easy energy transfer.

The compound represented by general formula [1] contains a ligand containing a very highly planar triphenylene ring, which is a fused polycyclic compound composed of a hydrocarbon compound containing four fused benzene rings. As the first compound (host material), a hydrocarbon compound is used. A highly planar fused polycyclic compound can be used. Each of the host and the ligand of the dopant material (guest material) contains a hydrocarbon compound and can have a highly planar analogous structure. This facilitates the π-π interaction and energy transfer from the first compound to the dopant material.

It is known that in the triplet energy used in phosphorescent devices, energy transfer occurs by the Dexter mechanism. In the Dexter mechanism, energy transfer occurs through contact between molecules. That is, the intermolecular distance between the host material and the guest material is reduced by the π-π interaction, thereby resulting in efficient energy transfer from the host material to the guest material.

Due to the above-described effect, the triplet excitons generated in the host material are rapidly consumed for light emission, thus resulting in an organic light-emitting device having high luminous efficiency. It is also possible to reduce the deterioration of the material due to a high-energy triplet excited state caused by further excitation of triplet excitons that are not used for light emission. Thus, the organic light-emitting device has good driving durability characteristics.

A compound other than hydrocarbon compounds, for example, a compound containing a highly polar atom, such as nitrogen, oxygen, or sulfur, and containing an amino group, or a compound containing a heterocyclic moiety, such as a carbazolyl group or a dibenzothiophenyl group, has high polarity. Thus, when the host material is a compound other than hydrocarbon compounds, the interaction with the highly planar triphenylene ring is reduced, thereby hindering the above-described effect of promoting energy transfer.

The concentration of the dopant material is preferably 0.01% or more by mass and 20% or less by mass, more preferably 0.1% or more by mass and 10% or less by mass, based on the entire light-emitting layer.

(2-2) The effect of (2-1) promotes the hole hopping transport between the dopant material and a host material and thus improves the hole transportability in the light-emitting layer.

The compound represented by general formula [1] tends to have a lower highest occupied molecular orbital (HOMO) level (closer to the vacuum level) than the host material due to the effect of containing the triphenylene ring in the ligand. Holes injected from the hole transport layer are transported by the host material. These holes are transported while being repeatedly trapped and de-trapped between the dopant material and the host material. In this case, similar skeletons can be used for the host material and the dopant material. In such a case, the overlap between the fused rings of the host material and the dopant material is strong, thus resulting in efficient hole transfer between the dopant material and the host material. This suppresses a voltage rise at the light-emitting layer and provides an organic light-emitting device operable at a low voltage with good driving durability characteristics.

Moreover, the organic light-emitting device according to the present embodiment can have the following features.

(2-3) The light-emitting layer further contains an assist material, and the LUMO level of the assist material is lower than the LUMO level of the first compound (farther from the vacuum level). This confines both electron and hole carriers in the light-emitting layer, thus providing a highly efficient device.

(2-4) The effect of (2-3) reduces the injection of carriers into an adjacent transport layer through the light-emitting layer to reduce the deterioration of the transport layer, thereby providing a highly durable device.

These features will be described below.

(2-3) The light-emitting layer further contains an assist material, and the LUMO level of the assist material is lower than the LUMO level of the first compound (farther from the vacuum level). This confines both electron and hole carriers in the light-emitting layer, thus providing a highly efficient device.

The iridium complex illustrated in general formula [1] promotes the injection of holes into the light-emitting layer. Thus, the efficiency can be increased by injecting electrons and holes into the light-emitting layer in a well-balanced manner. The injection of electrons into the light-emitting layer can be promoted. The host material is a hydrocarbon compound and thus characterized by a wide band gap. Thus, the host material has a high LUMO level (close to the vacuum level), thus possibly making it difficult for electrons to be injected from an electron transport layer and a hole-blocking layer. To facilitate the injection of electrons into the light-emitting layer, an assist material can be further contained. The assist material can have a lower LUMO level than the first compound (host material). This improves the injectability of both holes and electrons into the light-emitting layer to maintain a good carrier balance in the light-emitting layer, thus providing a highly efficient light-emitting device.

(2-4) The effect of (2-3) reduces the injection of carriers into an adjacent transport layer through the light-emitting layer to reduce the deterioration of the transport layer, thereby providing a highly durable device.

In the device according to the present embodiment, as described above, the dopant material has the effects of promoting the hole injectability in the light-emitting layer and confining holes in the light-emitting layer by hole trapping. This reduces the injection of holes from the light-emitting layer into the hole-blocking layer and the electron transport layer to reduce the deterioration of the hole-blocking layer and the electron transport layer due to holes.

The assist material having a lower LUMO level than the host material has the effect of promoting the electron injectability and confining electrons in the light-emitting layer by electron trapping. This reduces the injection of electrons from the light-emitting layer to an electron-blocking layer and the hole transport layer to reduce the deterioration of the electron-blocking layer and the hole transport layer due to electrons.

(3) First Compound (Host Material)

The first compound may be a host (hereinafter also referred to as a host material). The first compound as a host material is a hydrocarbon compound. The first compound needs to have a higher lowest triplet excitation energy ($T_1$) level than the iridium complex represented by general formula [1], which serves as a dopant material. Specifically, the dopant material according to the present embodiment has a light emission range of 520 nm to 550 nm; thus, $T_1$ can be 2.4 eV or more. As described above, in order to enhance the interaction with the triphenylene ring of the ligand of the dopant material, a fused polycyclic compound containing three or more rings can be used.

Moreover, the first compound can have the following features.

(3-1) The first compound contains, in its skeleton, at least one selected from the group consisting of a triphenylene ring, a phenanthrene ring, a chrysene ring, and a fluoranthene ring.

(3-2) The first compound contains no $SP^3$ carbon.

These features will be described below.

(3-1) The first compound contains, in its skeleton, at least one selected from the group consisting of a triphenylene ring, a phenanthrene ring, a chrysene ring, and a fluoranthene ring.

The dopant material according to the present embodiment contains a triphenylene skeleton in its ligand. The triphenylene skeleton has a highly planar structure. The dopant material and the first compound interact with each other as described in (2-1) and (2-2) above; thus, the first compound can also have a highly planar structure. This is because the presence of the highly planar structures allows highly planar moieties to approach each other through interaction. More specifically, the triphenylene moiety of the dopant material easily approaches the planar moiety of the first compound. Thus, the intermolecular distance between the dopant material and the first compound should be reduced. The above effect leads to the effect of increasing the efficiency of energy transfer described in (2-1).

Examples of the highly planar structure include structures that are hydrocarbon compounds and contain fused polycycles, such as a triphenylene ring, a phenanthrene ring, a chrysene ring, and a fluoranthene ring.

(3-2) The first compound contains no $SP^3$ carbon.

As described in (3-1) above, the dopant material according to the present embodiment is a compound characterized in that the interaction and the luminescence properties are improved by improving the distance between the dopant material and the first compound. The first compound is a compound that contains no $SP^3$ carbon, so that the distance from the dopant material can be reduced.

SPECIFIC EXAMPLES

While specific examples of the first compound are illustrated below, the first compound is not limited thereto.

Q-1-1

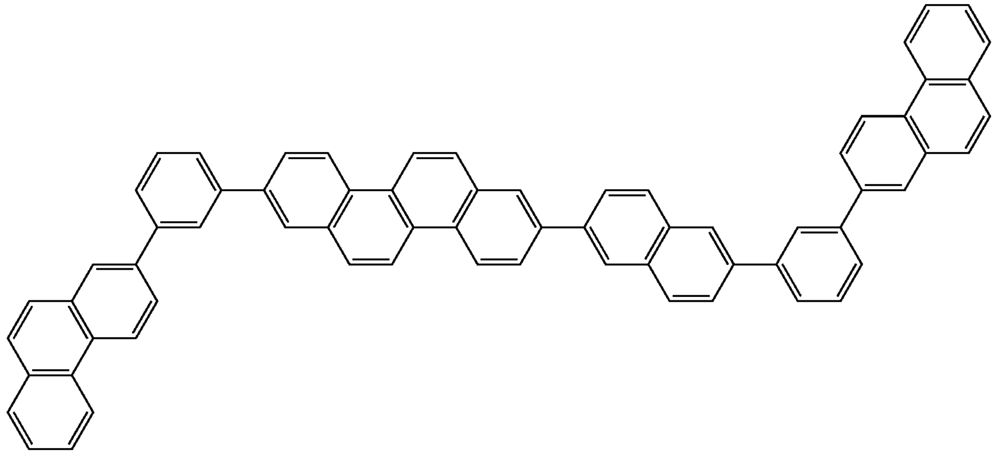

Q-1-2

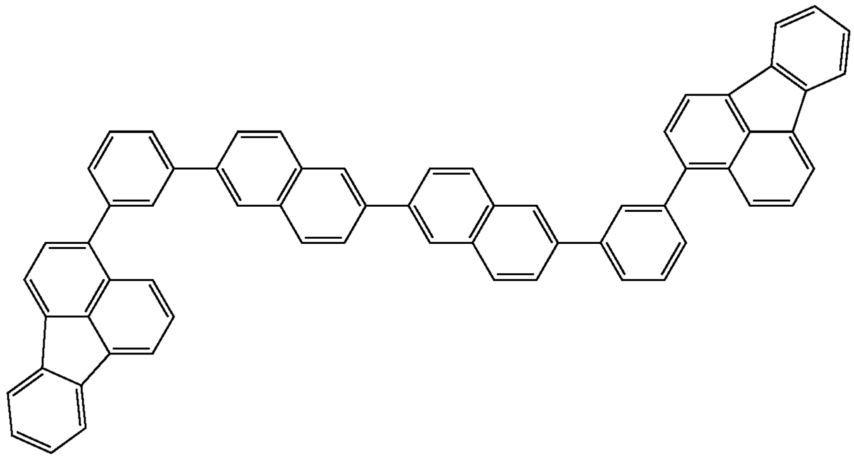

-continued
Q-1-3
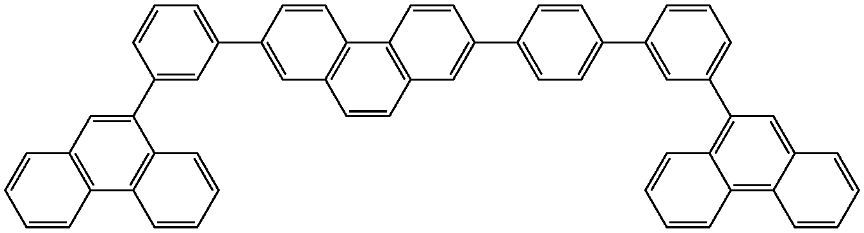
Q-1-4
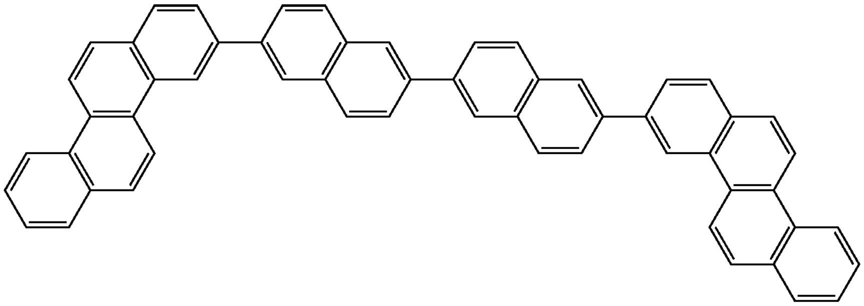
Q-1-5
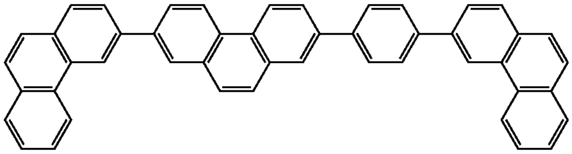
Q-1-6
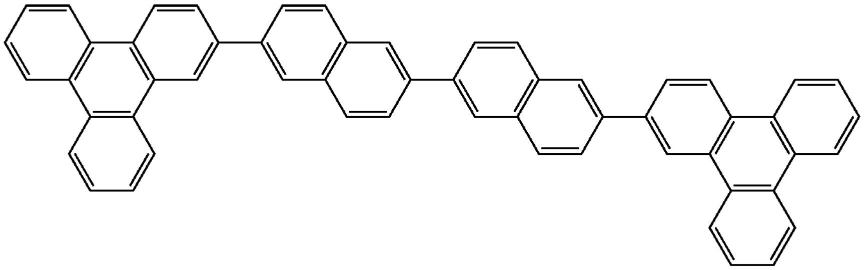
Q-1-7
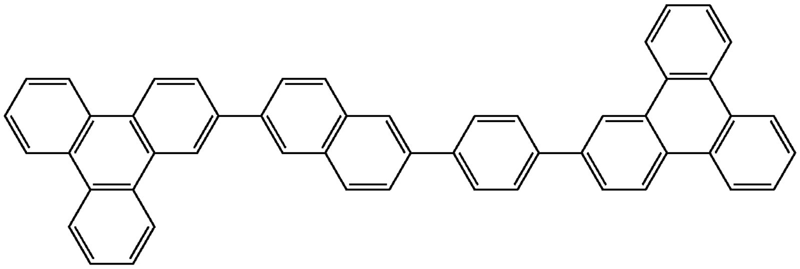
Q-1-8
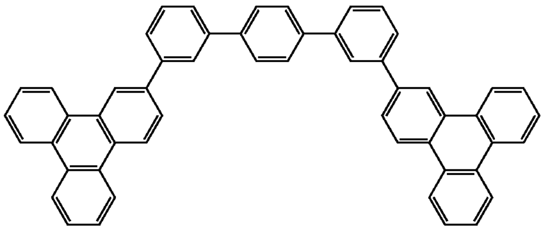
Q-1-9
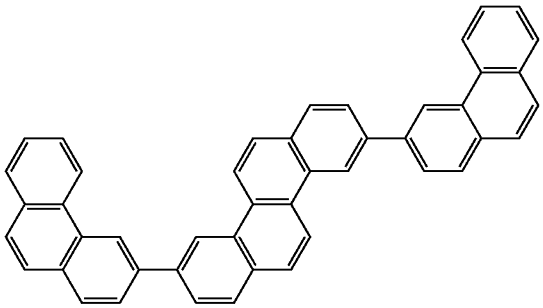

-continued
Q-1-10
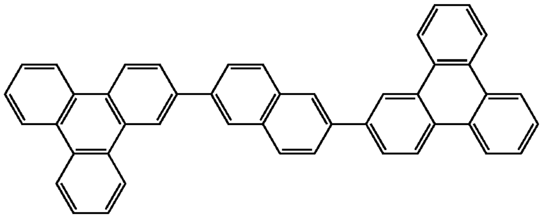
Q-1-11
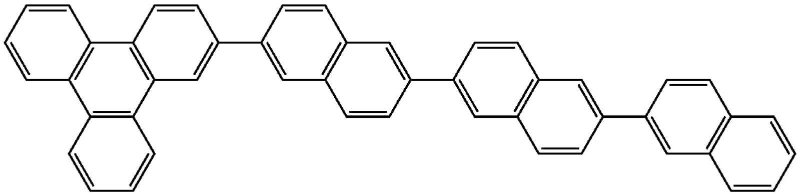
Q-1-12
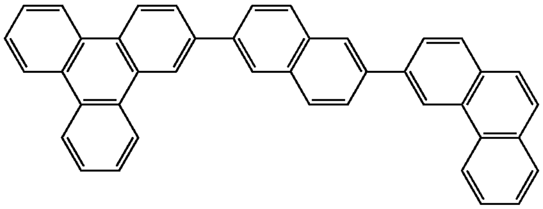
Q-1-13
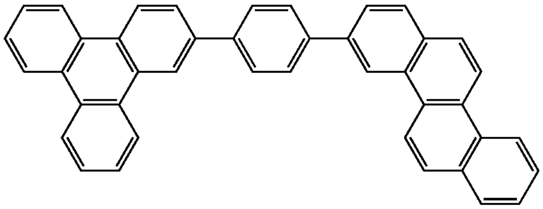
Q-1-14
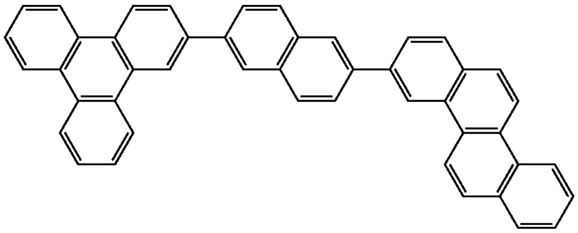
Q-1-15
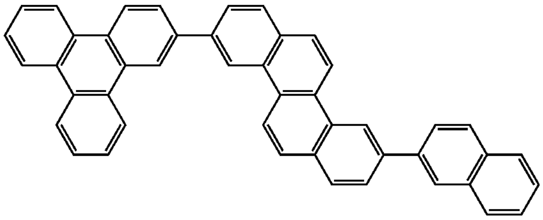
Q-1-16
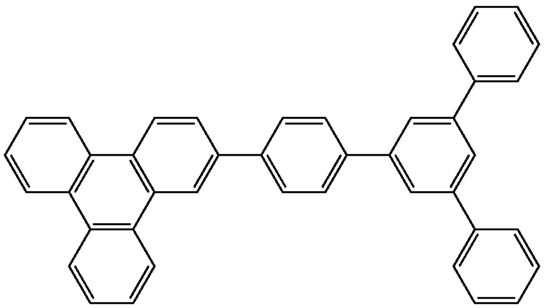
Q-1-17
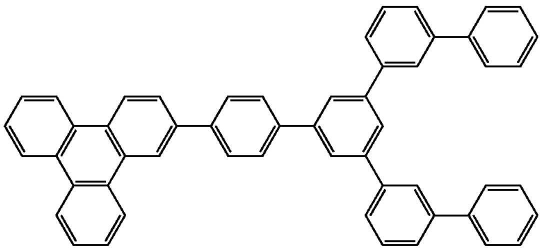
Q-1-18
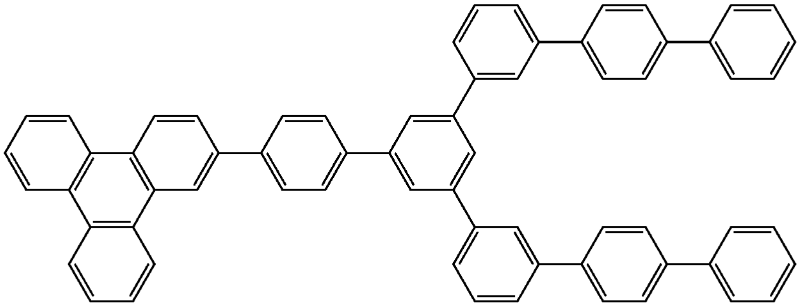

-continued
Q-1-19
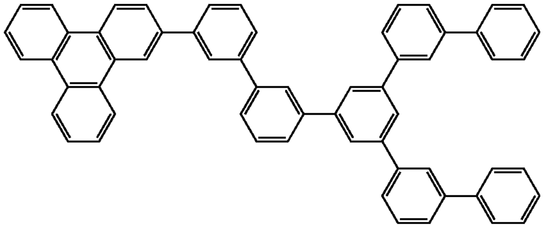
Q-1-20
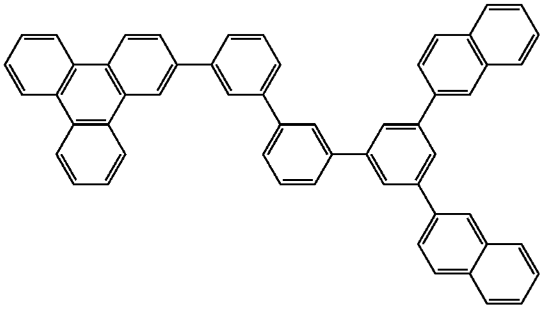
Q-1-21
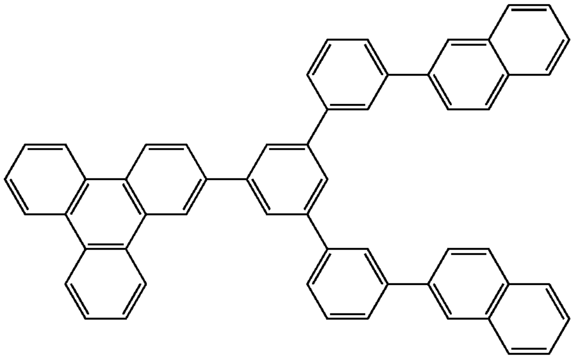
Q-1-22
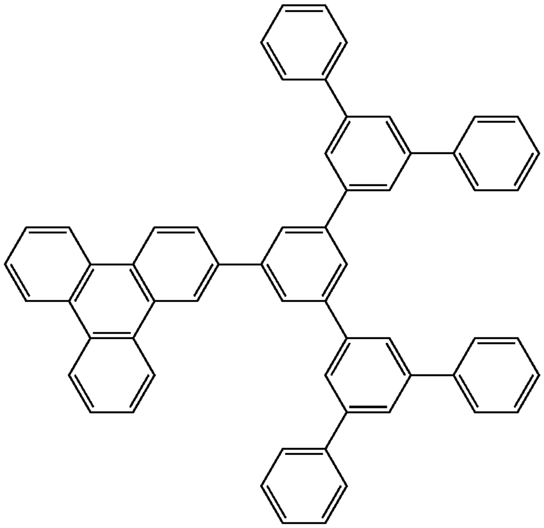

-continued
Q-1-23
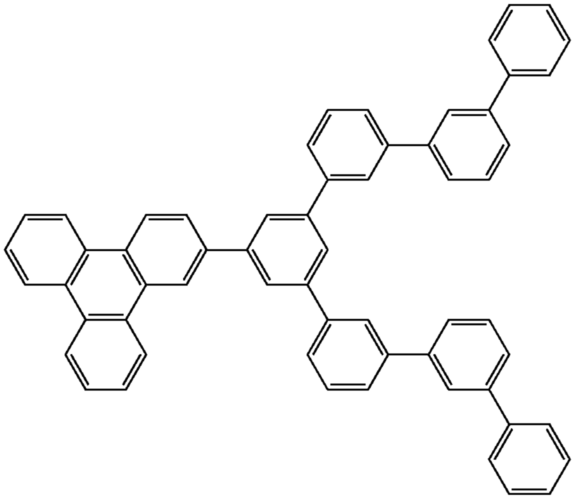
Q-1-24
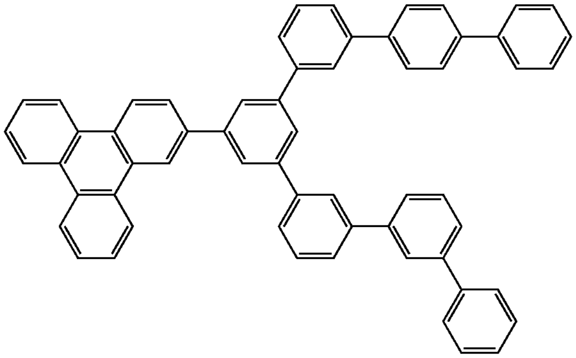
Q-1-25
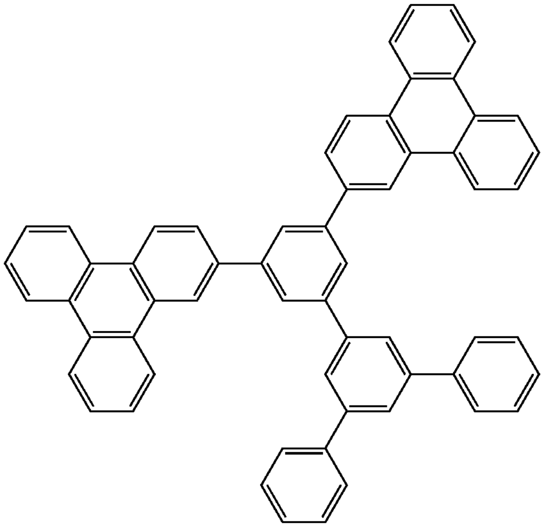

-continued
Q-1-26
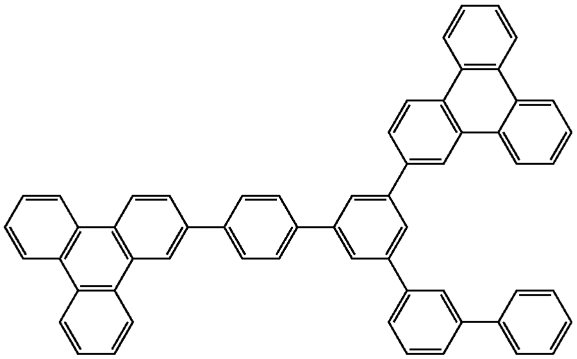
Q-1-27
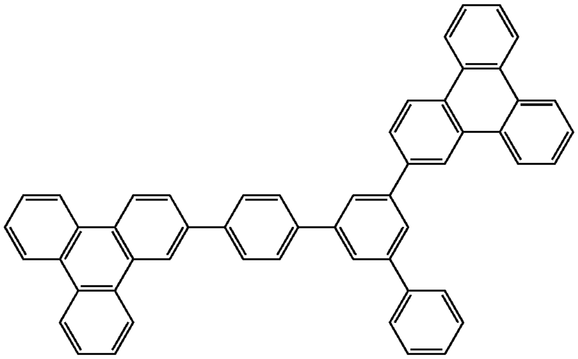
Q-1-28
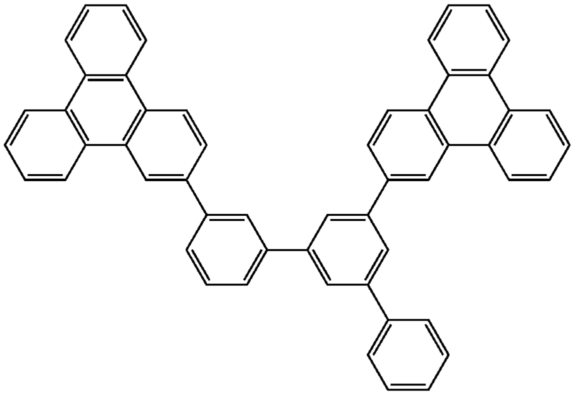
Q-1-29
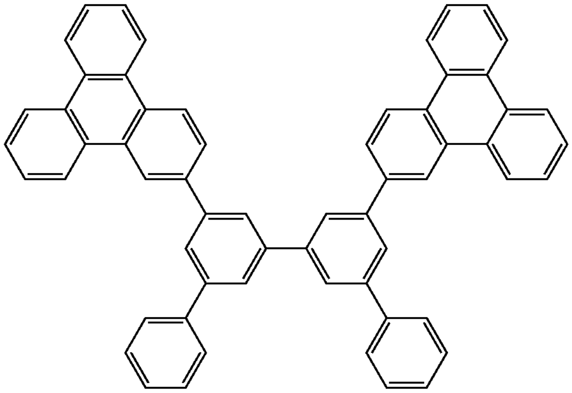

-continued
Q-1-30
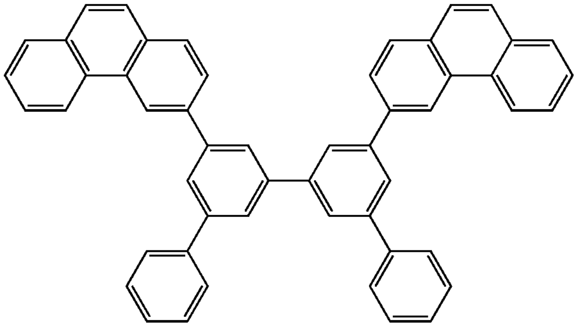
Q-1-31
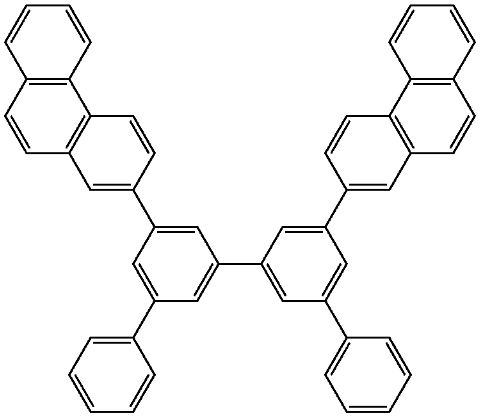
Q-1-32
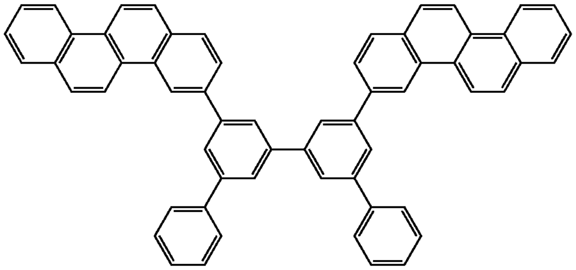
Q-1-33
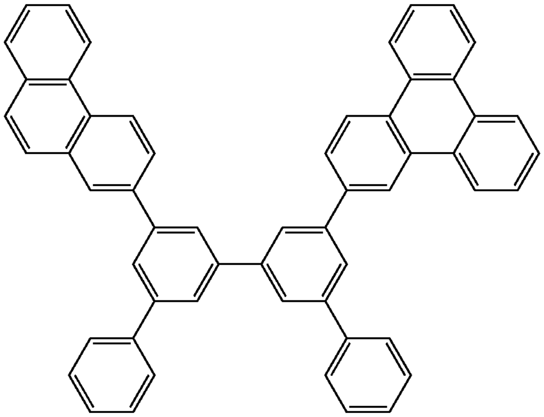
Q-1-34
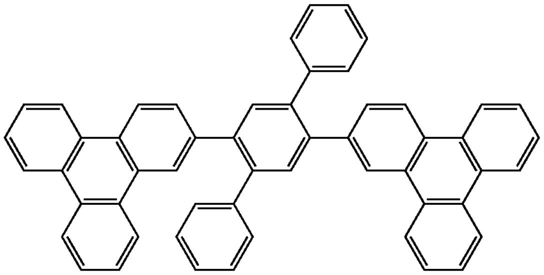

-continued
Q-1-35
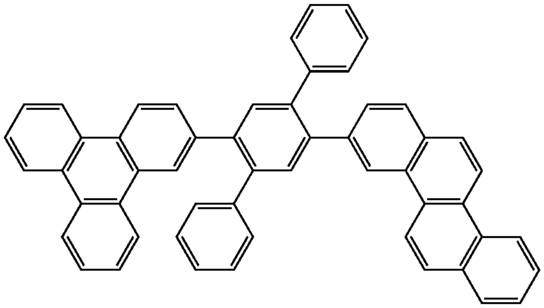
Q-1-36
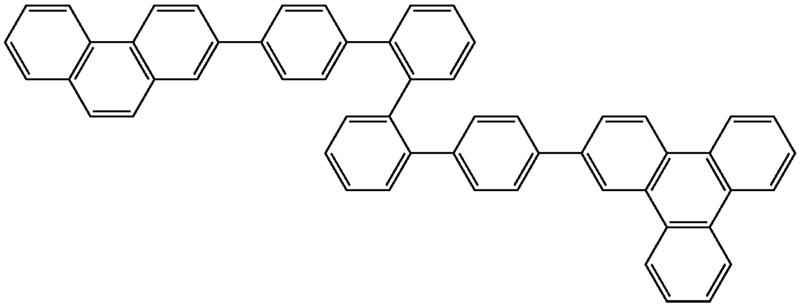
Q-1-37
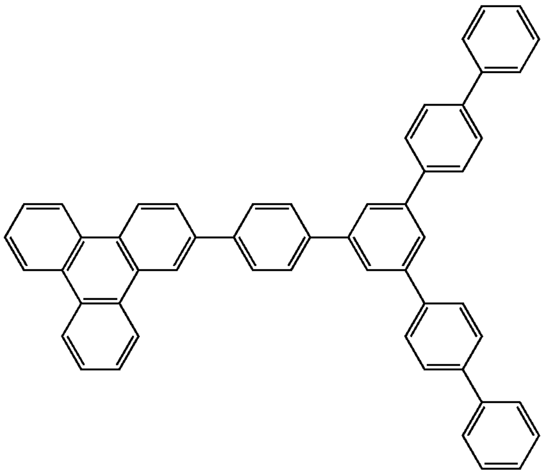
Q-1-38
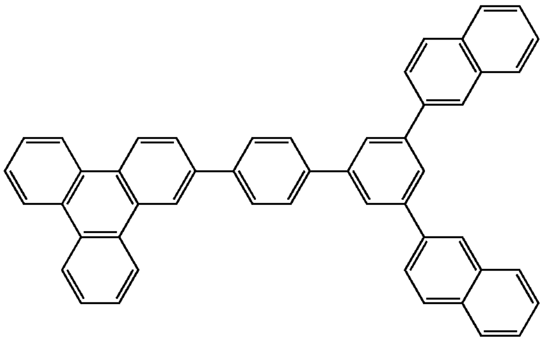
Q-1-39
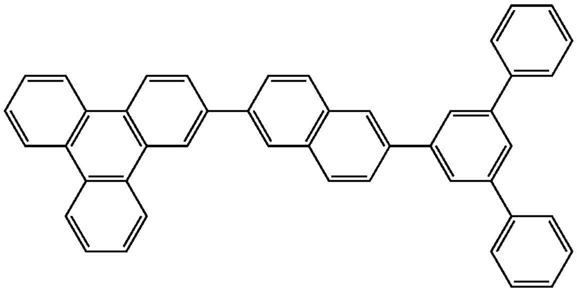

-continued

Q-1-40

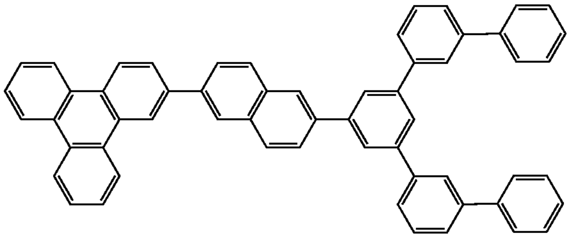

Q-1-41

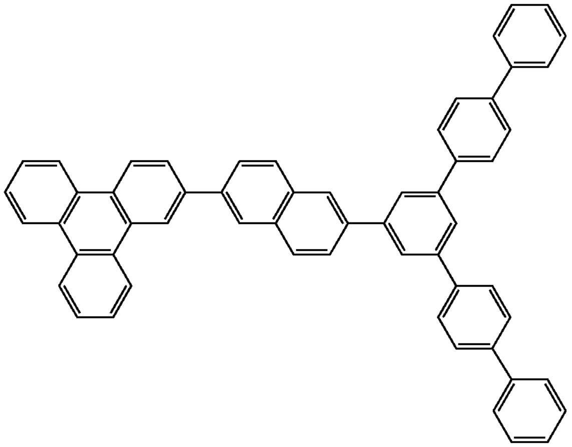

Q-1-42

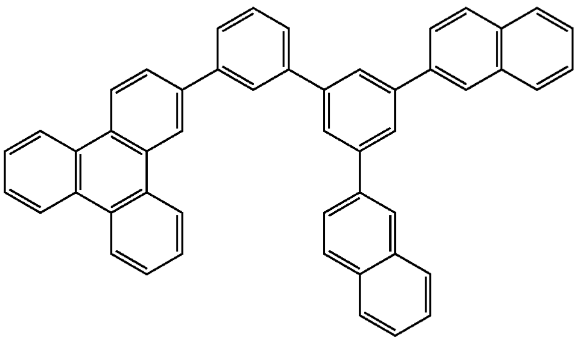

The above-mentioned exemplified compounds are each a compound containing, in its skeleton, at least any of a triphenylene ring, a phenanthrene ring, a chrysene ring, and a fluoranthene ring, and containing no $SP^3$ carbon. Thus, these compounds can each have a shorter distance from the dopant material according to the present embodiment, so that each of the compounds serves as the host material that has a strong interaction and that satisfactorily transfers energy to the dopant material. Of these, a compound containing, in its skeleton, a triphenylene ring has a high degree of planarity and can be particularly used.

When no assist material is contained, the concentration of the first compound is preferably 50% or more by mass and 99.9% or less by mass, more preferably 75% or more by mass and 99% or less by mass, based on the entire light-emitting layer. When an assist material is contained, the concentration of the first compound is preferably 40% or more by mass and 90% or less by mass, more preferably 60% or more by mass and 80% or less by mass, based on the entire light-emitting layer.

(4) Second Material (Assist Material)

The second compound may be an assist (hereinafter also referred to as an assist material). The light-emitting layer can further contain an assist material. The assist material can have a lower LUMO level (farther from the vacuum level) than the first compound.

The iridium complex represented by general formula [1] promotes the injection of holes into the light-emitting layer. Thus, the efficiency can be increased by injecting electrons and holes into the light-emitting layer in a well-balanced manner. The injection of electrons into the light-emitting layer can be promoted. The first compound is a hydrocarbon compound, contains no electron-withdrawing group, and has a high LUMO level, thus possibly resulting in poor electron injectability from the electron transport layer. However, the incorporation of an assist material can improve the electron injectability. The assist material can have a lower LUMO level than the first compound. This improves the injectability of both holes and electrons into the light-emitting layer to maintain a good carrier balance in the light-emitting layer, thus providing a highly efficient light-emitting device.

The assist material can be a compound that partially contains any of the following structures:

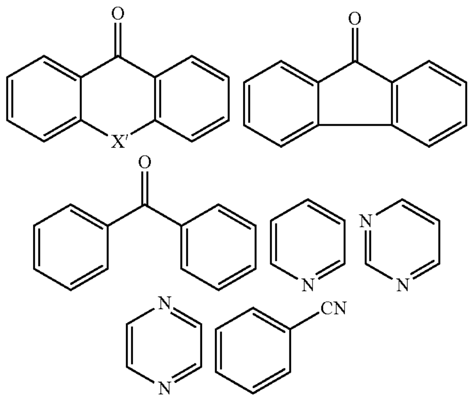

where X' in the above structure is an oxygen atom, a sulfur atom, or a substituted or unsubstituted carbon atom.

Each of the above structures is useful because it has electron-withdrawing properties and can lower the LUMO level of the assist material. Assist materials containing the above structures as partial structures can be used because they have moderately high electron-withdrawing performance and structures moderate in size and thus are presumably less likely to form exciplexes with the dopant material according to the present embodiment. Examples of the assist materials that seem to be likely to form exciplexes with the dopant material according to the present embodiment include compounds each containing a triazine ring as a partial structure.

The above structures may be unsubstituted or substituted with substituents. The carbon atom represented by X' may be unsubstituted or substituted with a substituent. Examples of the substituent include a halogen atom, an alkyl group, an alkoxy group, an aryloxy group, a heteroaryloxy group, an aryl group, a heterocyclic group, a silyl group, and an amino group.

Non-limiting examples of the halogen atom include fluorine, chlorine, bromine, and iodine.

Non-limiting examples of the alkyl group include a methyl group, an ethyl group, a n-propyl group, an isopropyl group, a n-butyl group, a tert-butyl group, a sec-butyl group, an octyl group, a cyclohexyl group, a 1-adamantyl group, and a 2-adamantyl group.

Non-limiting examples of the alkoxy group include a methoxy group, an ethoxy group, a propoxy group, a 2-ethyloctyloxy group, and a benzyloxy group.

Non-limiting examples of the aryloxy group include a phenoxy group and a naphthoxy group.

Non-limiting examples of the heteroaryloxy group include a furanyloxy group and a thienyloxy group.

Non-limiting examples of the aryl group include a phenyl group, a naphthyl group, an indenyl group, a biphenyl group, a terphenyl group, a fluorenyl group, a phenanthryl group, a triphenylenyl group, a pyrenyl group, an anthracenyl group, a perylenyl group, a chrysenyl group, and a fluoranthenyl group.

Non-limiting examples of the heterocyclic group include a pyridyl group, a pyrimidinyl group, a pyrazinyl group, a triazinyl group, a benzofuranyl group, a benzothiophenyl group, a dibenzofuranyl group, a dibenzothiophenyl group, an oxazolyl group, an oxadiazolyl group, a thiazolyl group, a thiadiazolyl group, a carbazolyl group, an acridinyl group, and a phenanthrolinyl group.

Non-limiting examples of the silyl group include a trimethylsilyl group and a triphenylsilyl group.

Non-limiting examples of the amino group include an N-methylamino group, an N-ethylamino group, an N,N-dimethylamino group, an N,N-diethylamino group, an N-methyl-N-ethylamino group, an N-benzylamino group, an N-methyl-N-benzylamino group, an N,N-dibenzylamino group, an anilino group, an N,N-diphenylamino group, an N,N-dinaphthylamino group, an N,N-difluorenylamino group, an N-phenyl-N-tolylamino group, an N,N-ditolylamino group, an N-methyl-N-phenylamino group, an N,N-dianisolylamino group, an N-mesityl-N-phenylamino group, an N,N-dimesitylamino group, an N-phenyl-N-(4-tert-butylphenyl)amino group, an N-phenyl-N-(4-trifluoromethylphenyl)amino group, an N-piperidyl group, a carbazolyl group, and an acridyl group.

Non-limiting examples of a substituent that may further be contained in the alkyl group, the alkoxy group, the aryloxy group, the heteroaryloxy group, the aryl group, the heterocyclic group, the amino group, and the silyl group include a deuterium atom; alkyl groups, such as a methyl group, an ethyl group, a n-propyl group, an isopropyl group, a n-butyl group, and a tert-butyl group; aralkyl groups, such as a benzyl group; aryl groups, such as a phenyl group and a biphenyl group; heterocyclic groups, such as a pyridyl group and a pyrrolyl group; amino groups, such as a dimethylamino group, a diethylamino group, a dibenzylamino group, a diphenylamino group, and a ditolylamino group: alkoxy groups, such as a methoxy group, an ethoxy group, and a propoxy group; aryloxy groups, such as a phenoxy group; halogen atoms, such as a fluorine atom, a chlorine atom, a bromine atom, and an iodine atom; and a cyano group.

SPECIFIC EXAMPLES

While specific examples of the assist material are illustrated below, the assist material is not limited thereto.

S-1-1

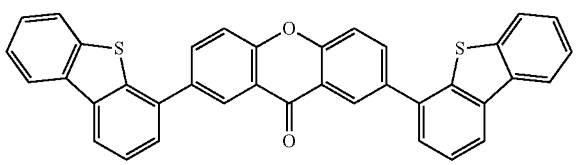

S-1-2

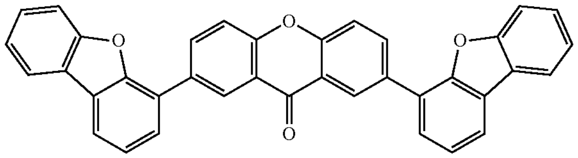

S-1-3

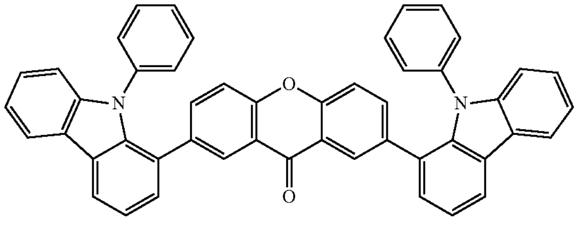

-continued
S-1-4
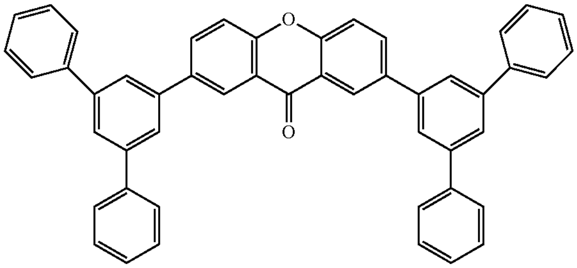
S-1-5
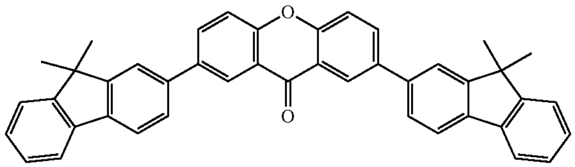
S-1-6
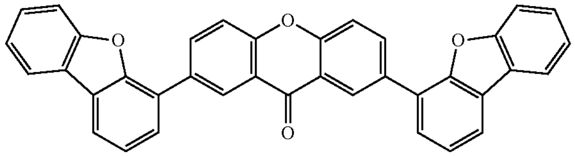
S-1-7
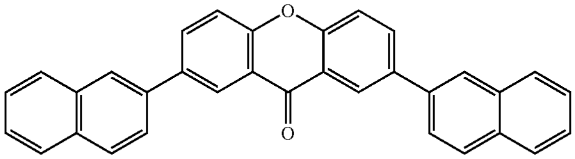
S-1-8
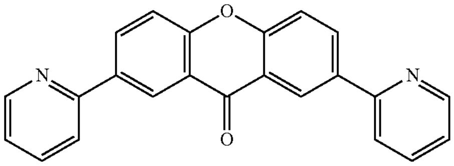
S-1-9
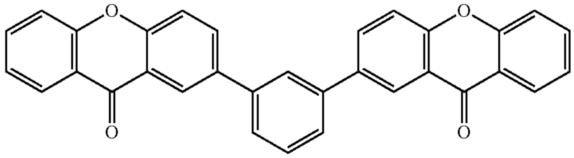
S-1-10
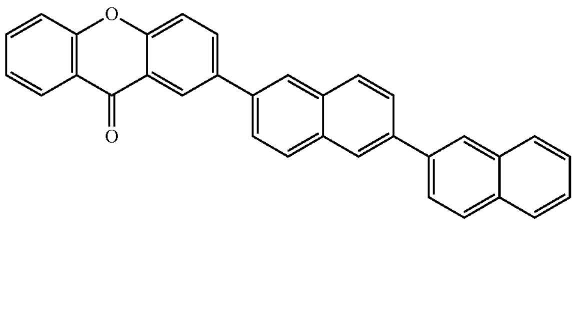
-continued
S-1-11
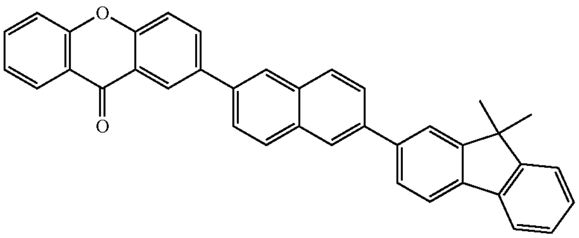
S-1-12
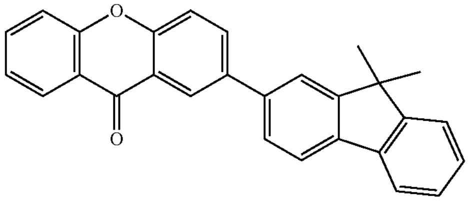
S-1-13
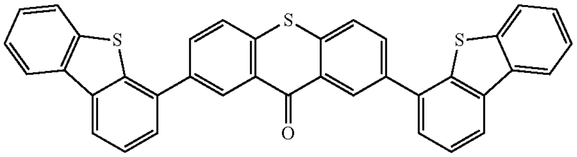
S-1-14
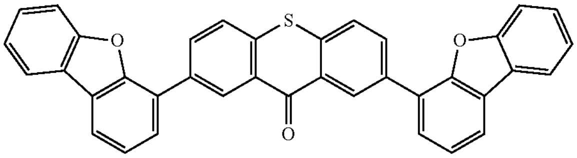
S-1-15
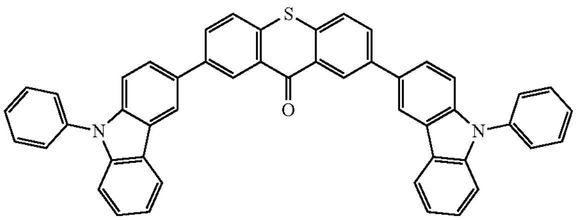
S-1-16
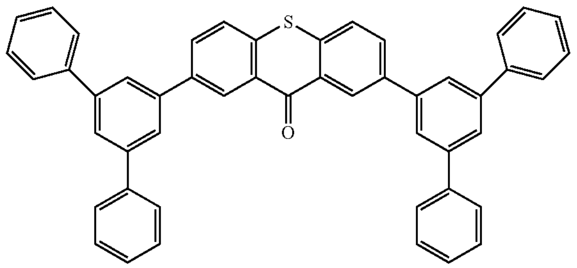
S-1-17
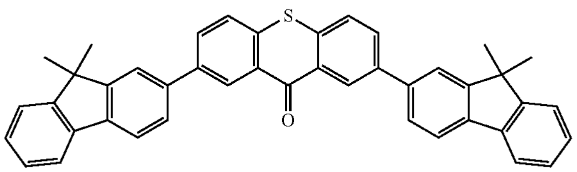

-continued
S-1-18
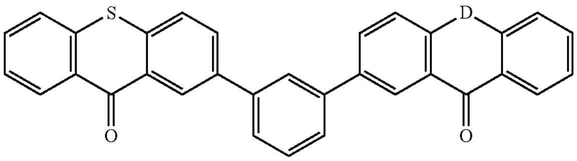
S-1-19
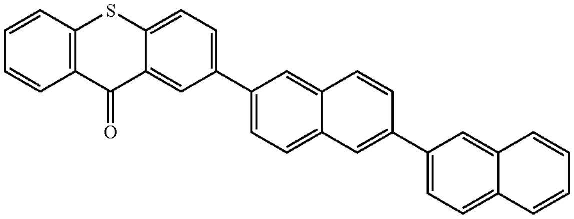
S-1-20
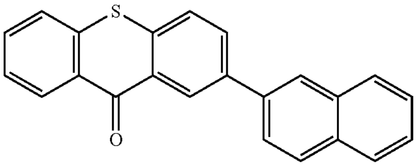
S-1-21
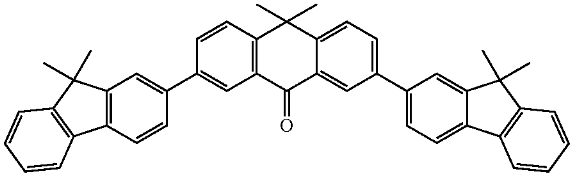
S-1-22
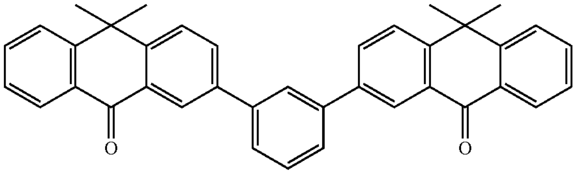
S-1-23
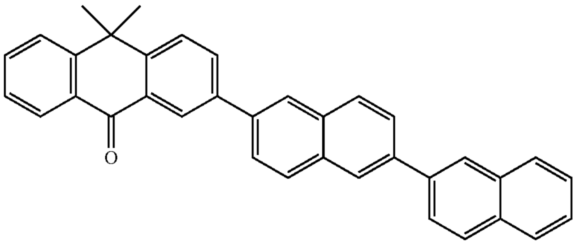
S-1-24
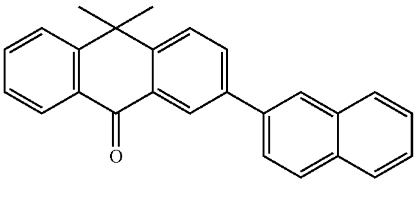
-continued
S-1-25
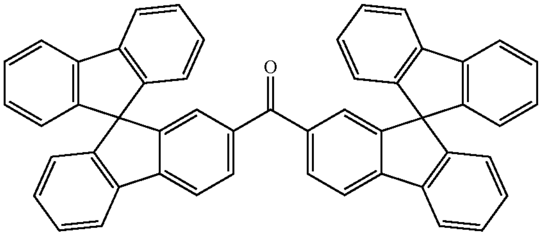
S-1-26
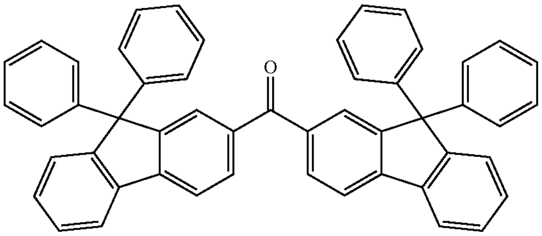
S-1-27
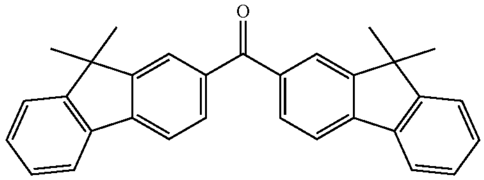
S-1-28
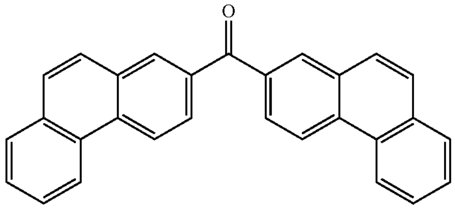
S-1-29
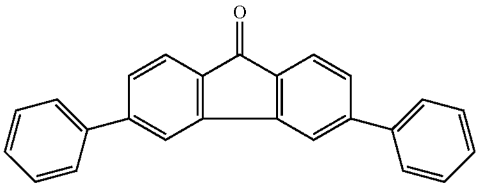
S-1-30
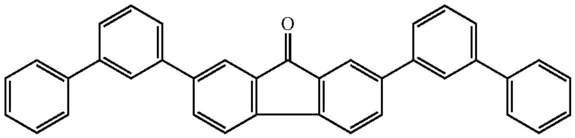
S-1-31
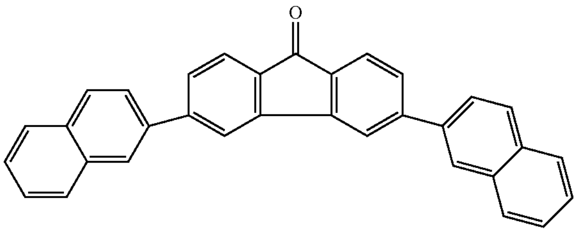

-continued
S-1-32
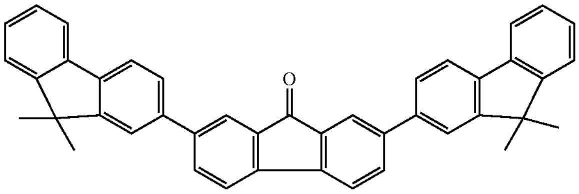
S-2-1
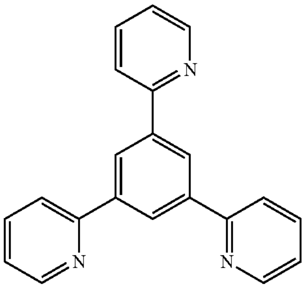
S-2-2
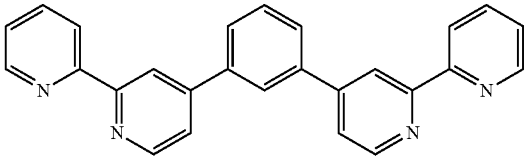
S-2-3
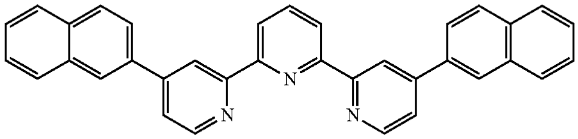
S-2-4
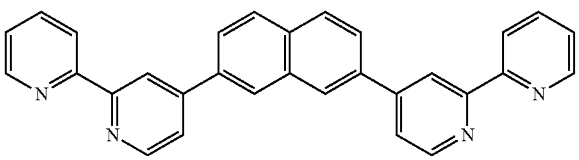
S-2-5
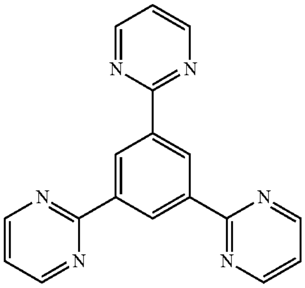
-continued
S-2-6
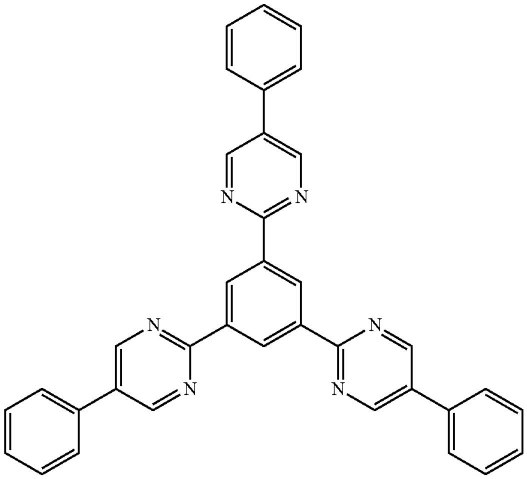
S-2-7
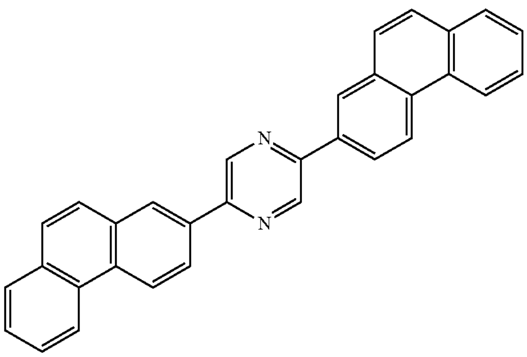
S-2-8
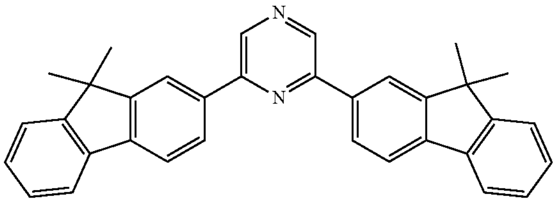
S-3-1
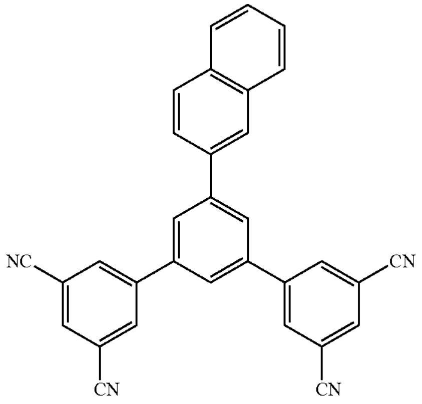

-continued

S-3-2

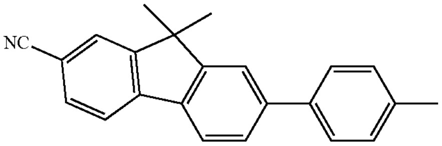

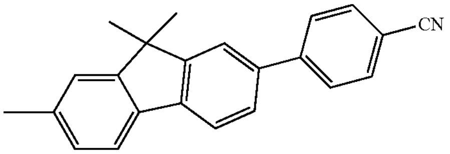

S-3-3

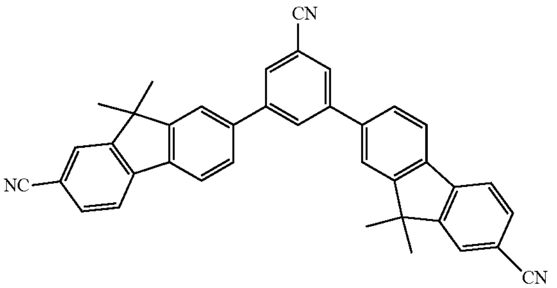

S-3-4

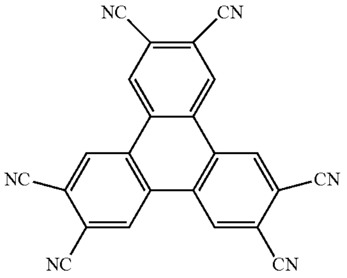

The concentration of the assist material is preferably 10% or more by mass and 60% or less by mass, more preferably 20% or more by mass and 40% or less by mass, based on the entire light-emitting layer.

(5) Details of Organic Light-Emitting Device

An organic light-emitting device according to the present embodiment will be described below.

The organic light-emitting device according to the present embodiment includes at least a first electrode, a second electrode, and an organic compound layer disposed between these electrodes. One of the first electrode and the second electrode is an anode, and the other is a cathode. In the organic light-emitting device according to the present embodiment, the organic compound layer may be formed of a single layer or a laminate including multiple layers, as long as it includes a light-emitting layer. When the organic compound layer is formed of a laminate including multiple layers, the organic compound layer may include, in addition to the light-emitting layer, a hole injection layer, a hole transport layer, an electron-blocking layer, a hole/exciton-blocking layer, an electron transport layer, and an electron injection layer, for example. The light-emitting layer may be formed of a single layer or a laminate including multiple layers.

In the organic light-emitting device according to the present embodiment, at least one organic compound layer contains the organic compound according to the present embodiment. Specifically, the organic compound according to the present embodiment is contained in any of the light-emitting layer, the hole injection layer, the hole transport layer, the electron-blocking layer, the hole/exciton-blocking layer, the electron transport layer, the electron injection layer, and so forth described above. The organic compound according to the present embodiment can be contained in the light-emitting layer.

In the organic light-emitting device according to the present embodiment, when the organic compound according to the present embodiment is contained in the light-emitting layer, the light-emitting layer may consist of only the organic compound according to the present embodiment or may be composed of the organic compound according to the present embodiment and another compound. When the light-emitting layer is composed of the organic compound according to the present embodiment and another compound, the organic compound according to the present embodiment may be used as a host or a guest (dopant) in the light-emitting layer. The organic compound may be used as an assist material that can be contained in the light-emitting layer.

The term "host" used here refers to a compound having the highest proportion by mass in compounds contained in the light-emitting layer.

The term "guest" refers to a compound that has a lower proportion by mass than the host in the compounds contained in the light-emitting layer and that is responsible for main light emission. The term "assist material" refers to a compound that has a lower proportion by mass than the host in the compounds contained in the light-emitting layer and that assists the light emission of the guest. The assist material is also referred to as a "second host". The host material may be referred to as the "first compound". The assist material may be referred to as a "second compound".

When the organic compound according to the present embodiment is used as a guest in the light-emitting layer, the concentration of the guest is preferably 0.01% or more by mass and 20% or less by mass, more preferably 0.1% or more by mass and 10% or less by mass, based on the entire light-emitting layer.

The inventors have conducted various studies and have found that when the organic compound according to the present embodiment is used as a host or guest of a light-emitting layer, especially as a guest of a light-emitting layer, a device that emits light with high efficiency and high luminance, and that is extremely durable can be provided. This light-emitting layer can be formed of a single layer or multiple layers and can also contain a light-emitting material having another emission color in order to conduct the color mixture of the green emission color of the present embodiment and the another emission color. The term "multiple layers" means a state in which a light-emitting layer and another light-emitting layer are stacked. In this case, the emission color of the organic light-emitting device is not limited to green. More specifically, the emission color may be white or an intermediate color. In the case of white, another light-emitting layer emits light of a color other than green, that is, blue or red.

A film-forming method is vapor deposition or coating. Details will be described in Examples below.

The organic compound according to the present embodiment can be used as a component material of an organic compound layer other than the light-emitting layer included in the organic light-emitting device according to the present embodiment. Specifically, the organic compound may be used as a component material of the electron transport layer, the electron injection layer, the hole transport layer, the hole injection layer, the hole-blocking layer, and so forth. In this case, the emission color of the organic light-emitting device is not limited to green. More specifically, the emission color may be white or an intermediate color.

For example, a hole injection compound, a hole transport compound, a compound to be used as a host, a light-emitting compound, an electron injection compound, or an electron transport compound, which is known and has a low or high molecular weight, can be used together with the organic compound according to the present embodiment, as needed. Examples of these compounds will be described below.

As a hole injection-transport material, a material having a high hole mobility can be used so as to facilitate the injection of holes from the anode and to transport the injected holes to the light-emitting layer. To suppress a deterioration in film quality, such as crystallization, in the organic light-emitting device, a material having a high glass transition temperature can be used. Examples of a low- or high-molecular-weight material having the ability to inject and transport holes include triarylamine derivatives, aryl carbazole derivatives, phenylenediamine derivatives, stilbene derivatives, phthalocyanine derivatives, porphyrin derivatives, poly(vinyl carbazole), polythiophene, and other conductive polymers. Moreover, the hole injection-transport material can also be used for the electron-blocking layer. Non-limiting specific examples of a compound used as the hole injection-transport material will be illustrated below.

HT1

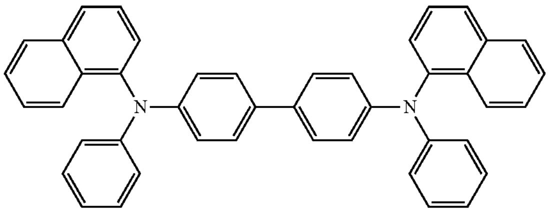

HT2

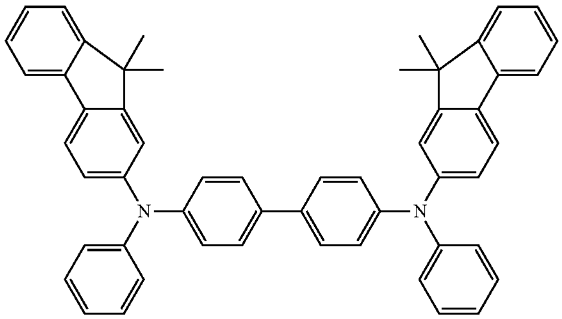

HT3

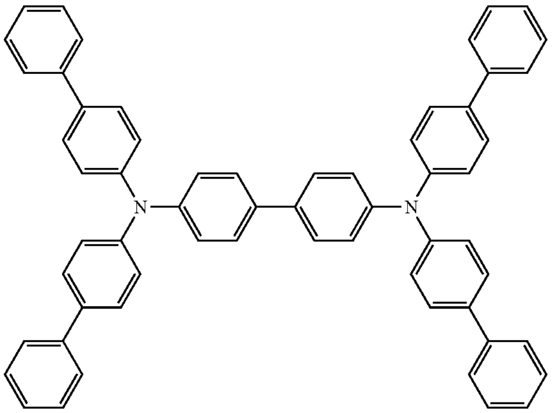

HT4

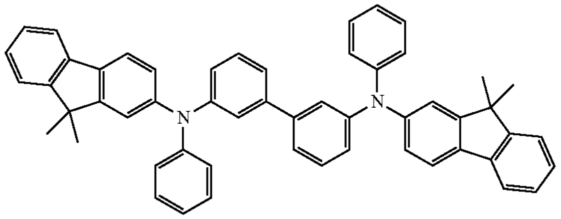

HT5

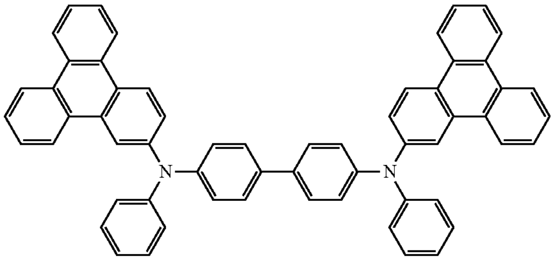

HT6

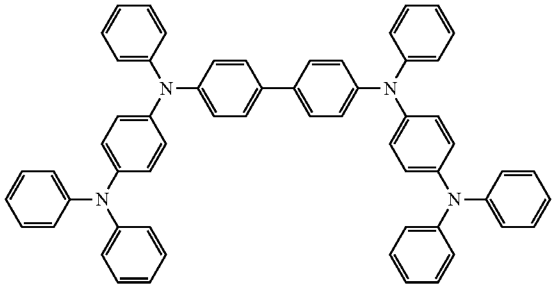

-continued
HT7
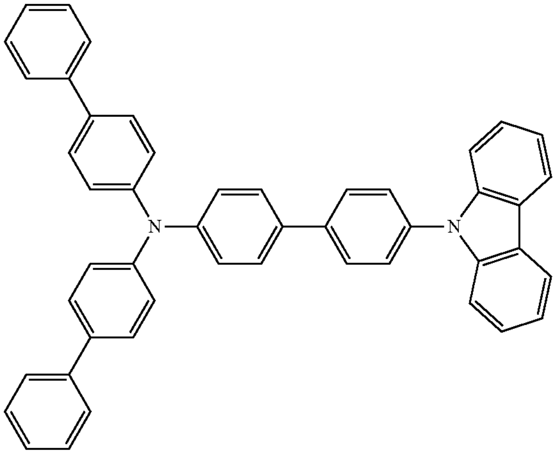
HT8
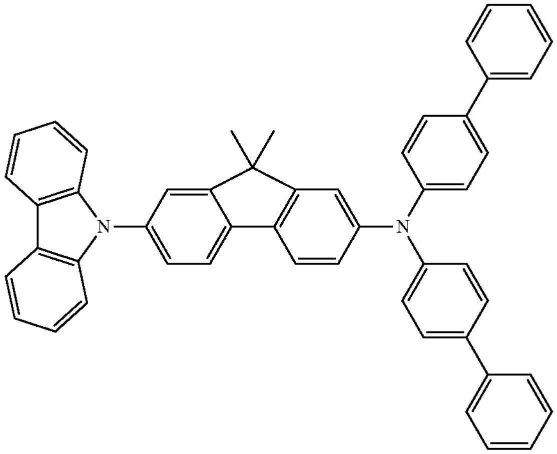
HT9
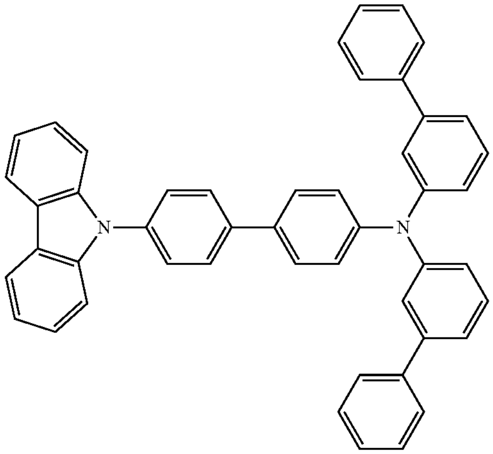
HT10
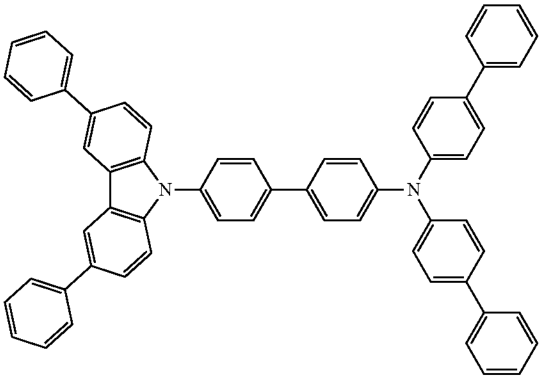
HT11
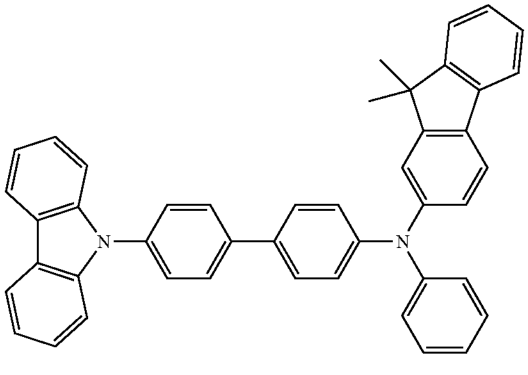
HT12
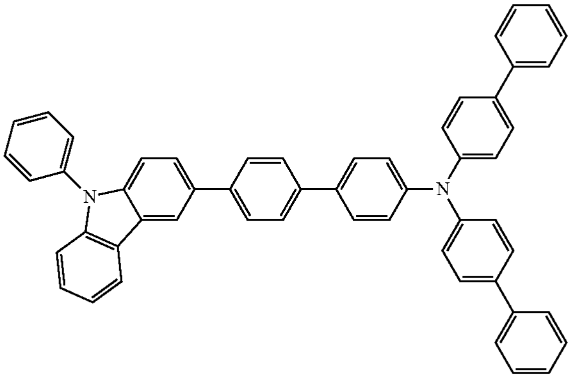

-continued
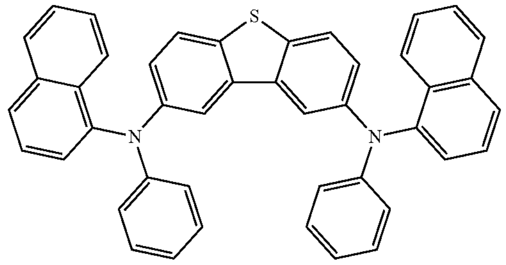
HT13
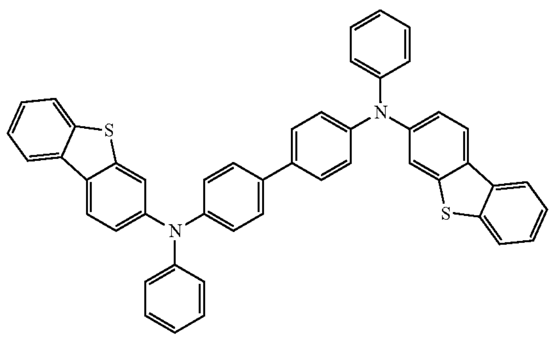
HT14
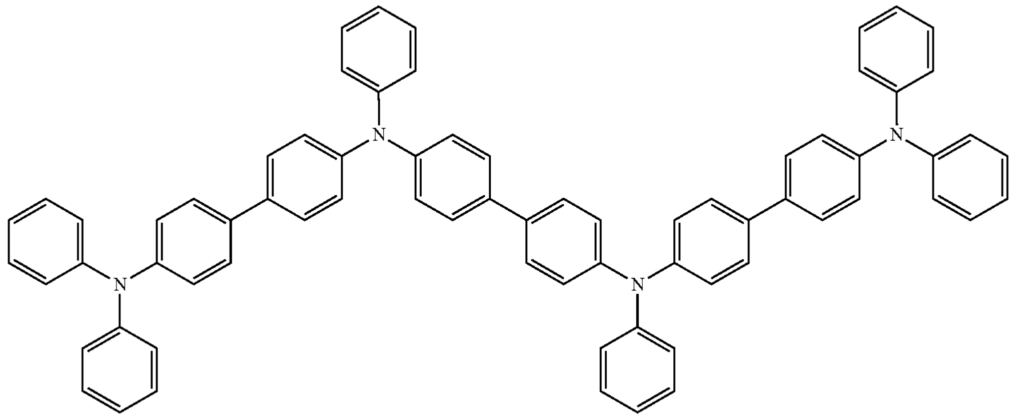
HT15
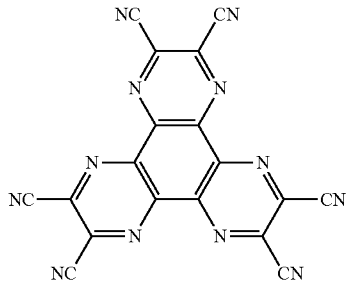
HT16
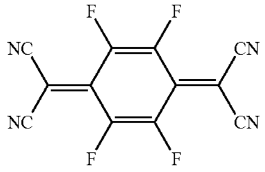
HT17
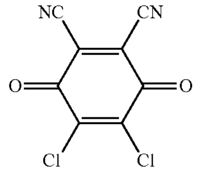
HT18
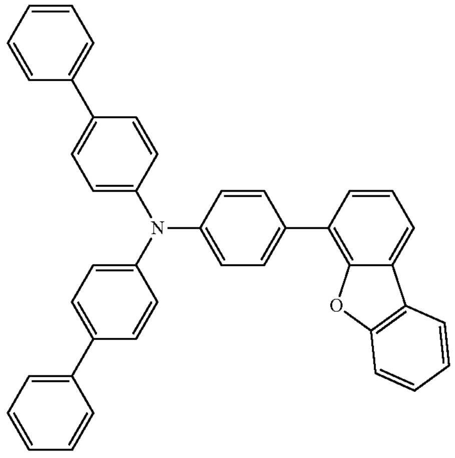
HT19

Among the hole transport materials illustrated above, HT16 to HT18 can be used in the layer in contact with the anode to reduce the driving voltage. HT16 is widely used in organic light-emitting devices. HT2, HT3, HT4, HT5, HT6, HT10, and HT12 may be used in an organic compound layer adjacent to HT16. Multiple materials may be used in a single organic compound layer.

Examples of a light-emitting material mainly related to a light-emitting function include fused-ring compounds, such as fluorene derivatives, naphthalene derivatives, pyrene derivatives, perylene derivatives, tetracene derivatives, anthracene derivatives, and rubrene, quinacridone derivatives, coumarin derivatives, stilbene derivatives, organoaluminum complexes, such as tris(8-quinolinolato)aluminum, iridium complexes, platinum complexes, rhenium complexes, copper complexes, europium complexes, ruthenium complexes, and polymer derivatives, such as poly(phenylene vinylene) derivatives, polyfluorene derivatives, and polyphenylene derivatives. Non-limiting specific examples of a compound used as a light-emitting material are described below.

BD1

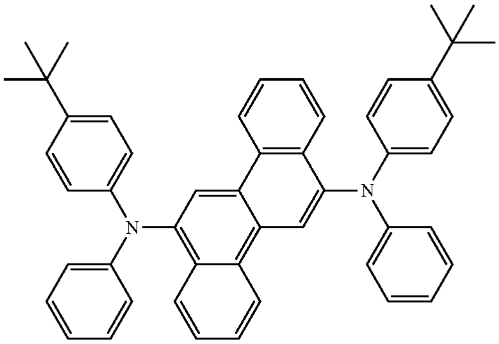

BD2

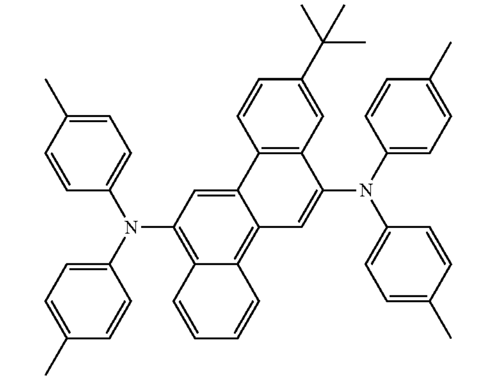

-continued

BD3

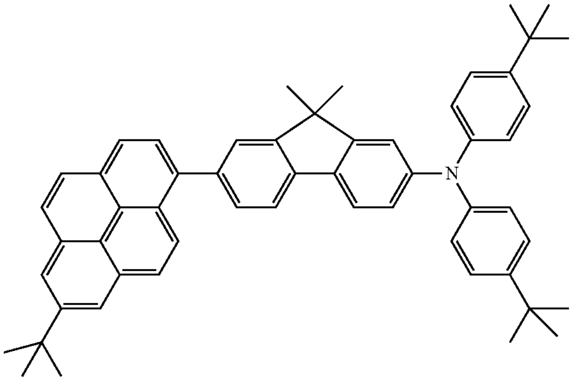

BD4

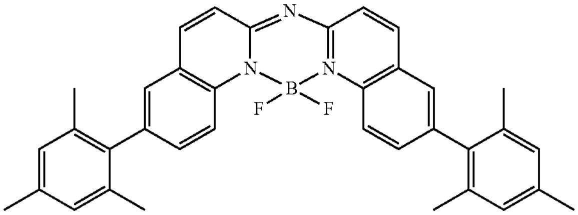

BD5

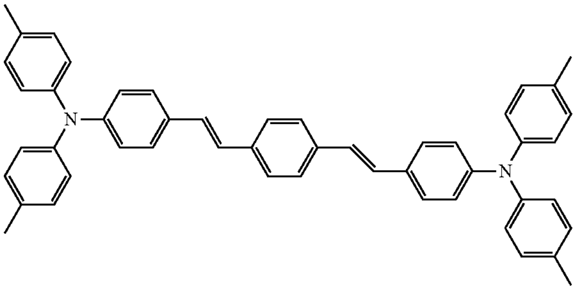

BD6

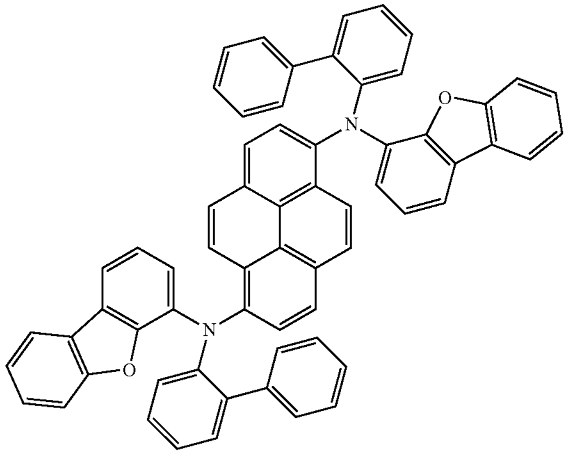

-continued
BD7
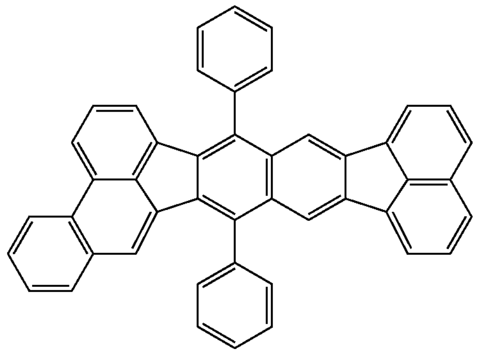
BD8
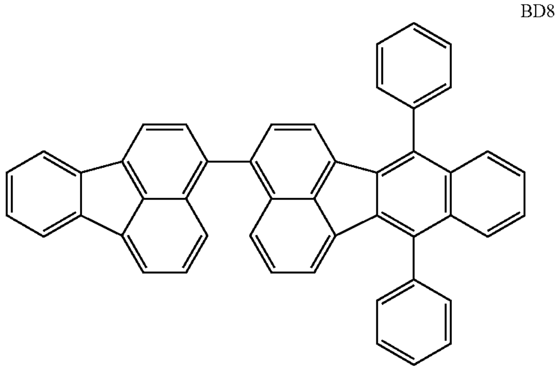
BD9
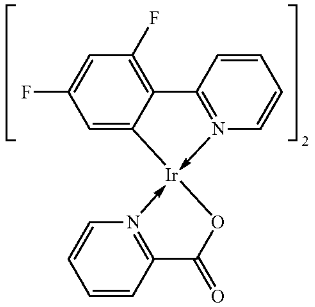
BD10
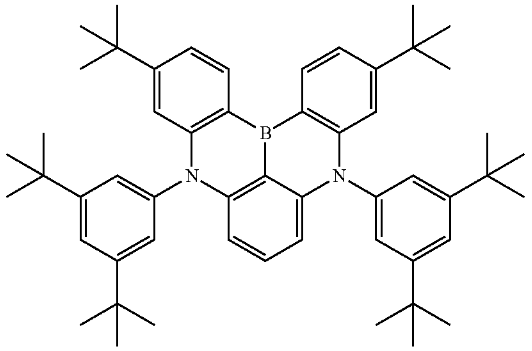
-continued
GD1
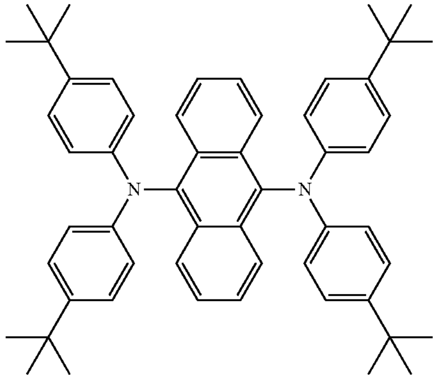
GD2
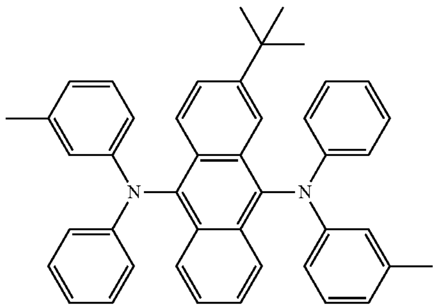
GD3
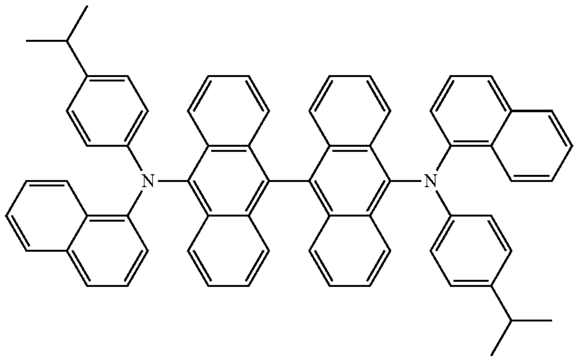
GD4
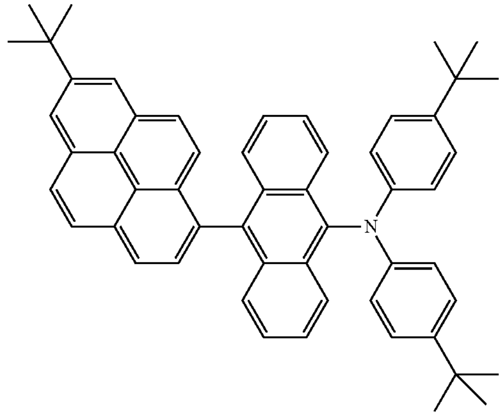

-continued
GD5
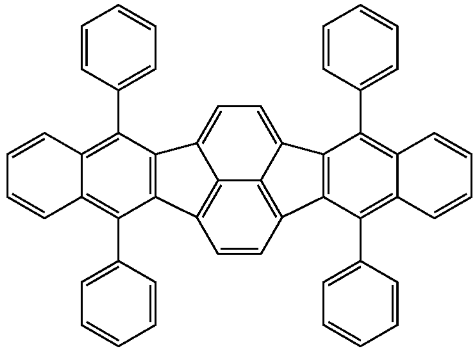
GD6
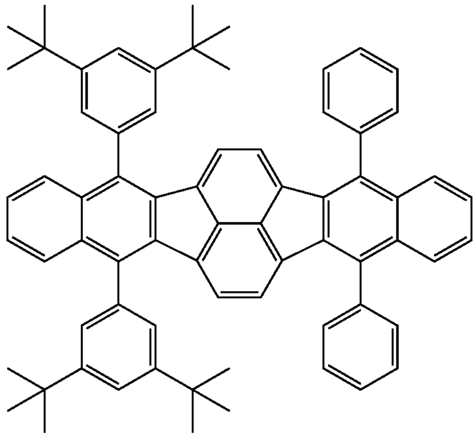
GD7
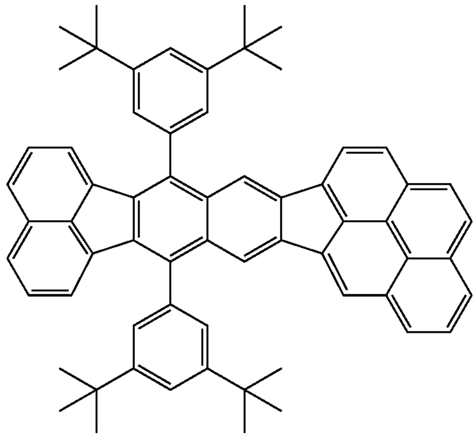
GD8
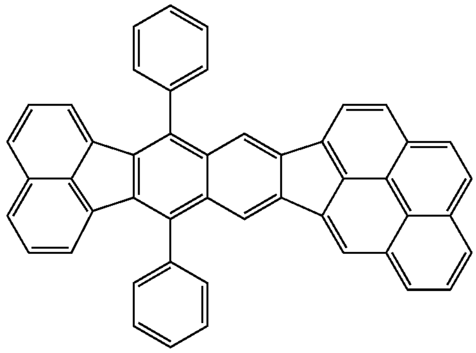
-continued
GD9
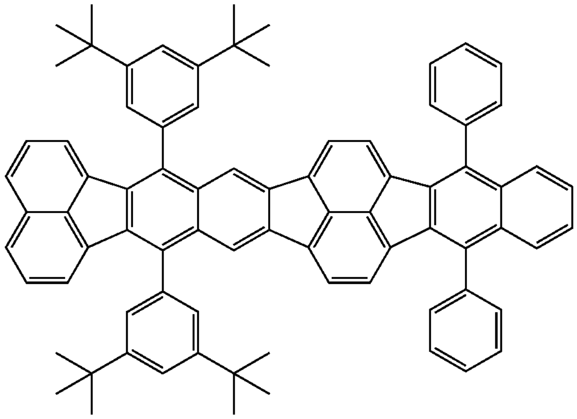
GD10
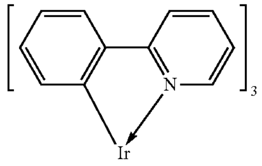
GD11
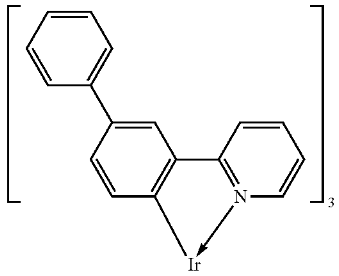
GD12
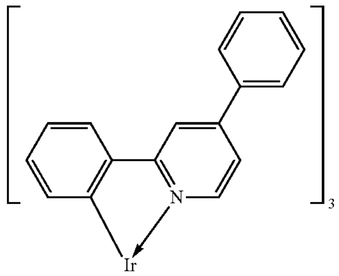
GD13
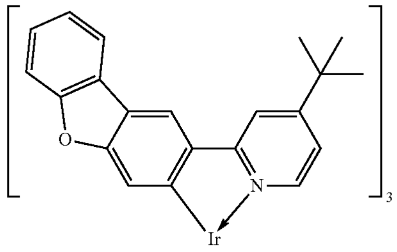

-continued
GD14
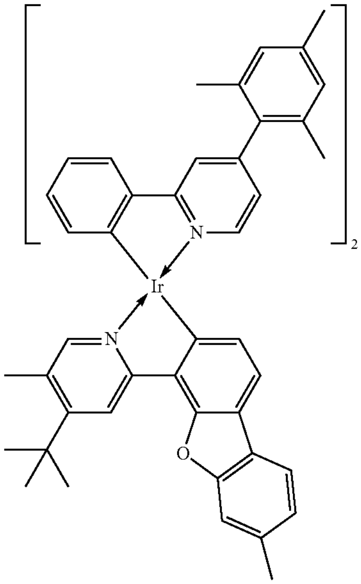
GD15
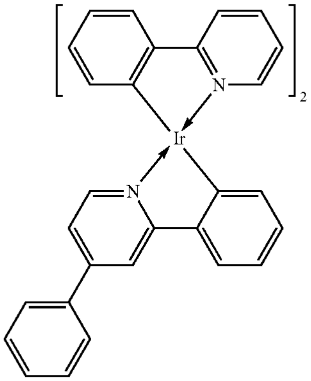
RD1
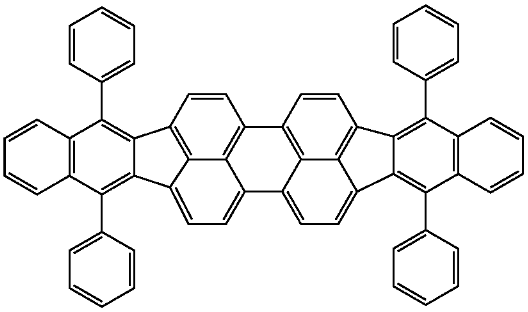
-continued
RD2
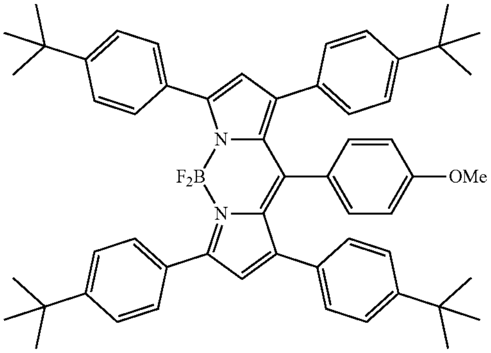
RD3
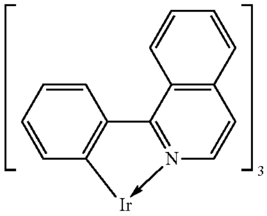
RD4
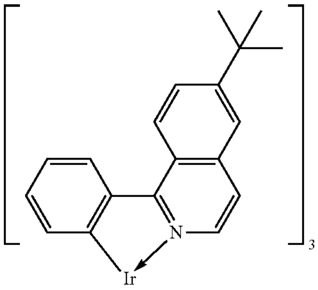
RD5
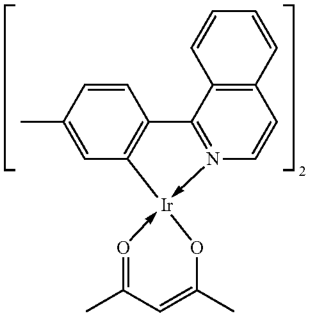
RD6
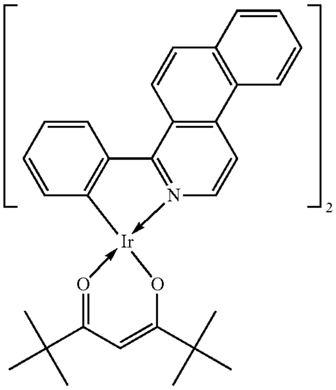

-continued

RD7

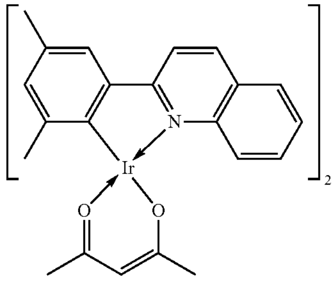

RD8

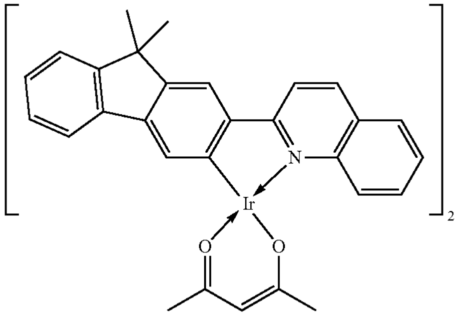

RD9

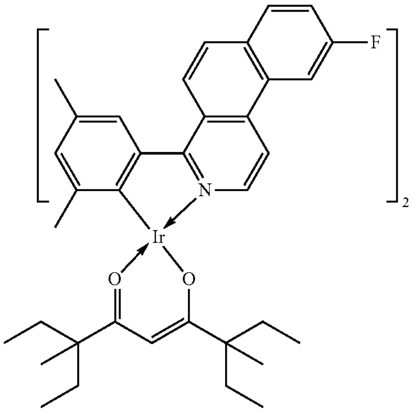

-continued

RD10

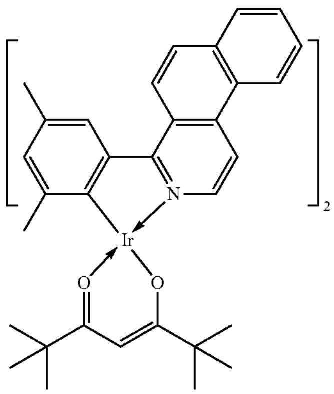

When the light-emitting material is a hydrocarbon compound, the material can reduce a decrease in luminous efficiency due to exciplex formation and a decrease in color purity due to a change in the emission spectrum of the light-emitting material caused by exciplex formation. The hydrocarbon compound is a compound consisting only of carbon and hydrogen. Among the above exemplified compounds, BD7, BD8, GD5 to GD9, and RD1 are hydrocarbon compounds.

When the light-emitting material is a fused polycyclic compound containing a five-membered ring, the material has a high ionization potential and high resistance to oxidation. This can provide a highly durable device with a long life. Among the above exemplified compounds, BD7, BD8, GD5 to GD9, and RD1 are the fused polycyclic compounds.

Examples of a host or assist material in the light-emitting layer include aromatic hydrocarbon compounds and derivatives thereof, carbazole derivatives, dibenzofuran derivatives, dibenzothiophene derivatives, organoaluminum complexes, such as tris(8-quinolinolato)aluminum, and organoberyllium complexes. Non-limiting specific examples of a compound used as a host or assist material in the light-emitting layer will be illustrated below.

EM1

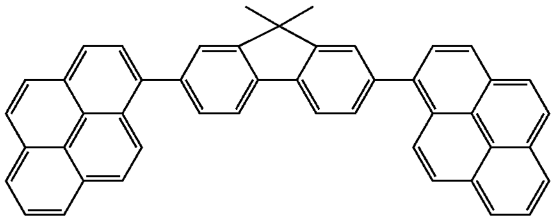

EM2

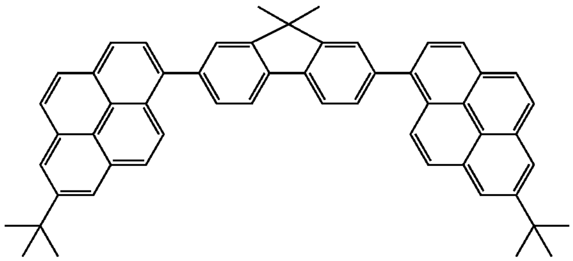

EM3

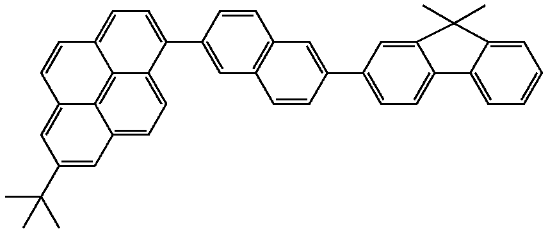

EM4

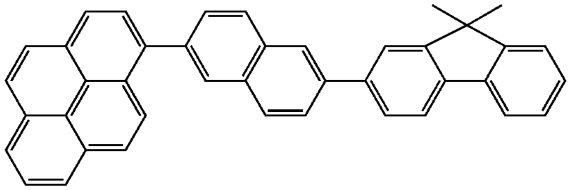

-continued
EM5
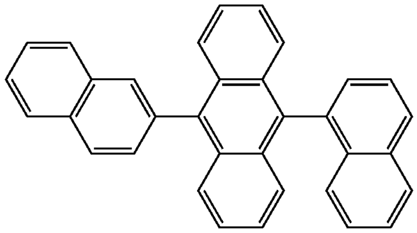
EM6
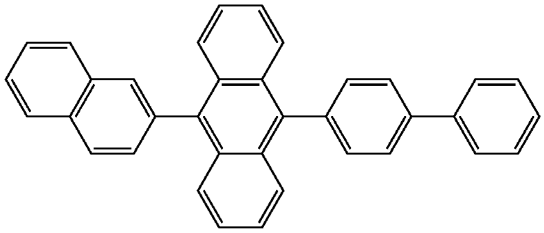
EM7
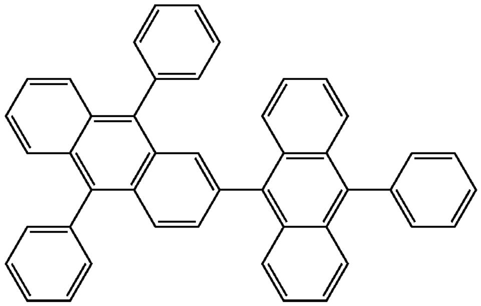
EM8
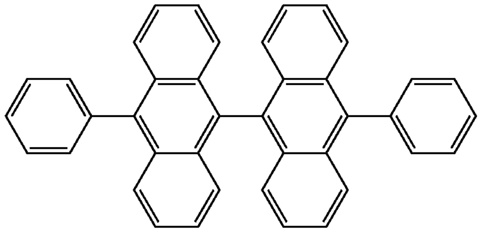
EM9
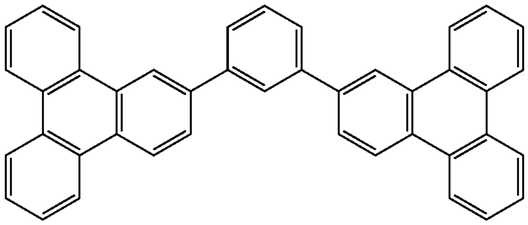
EM10
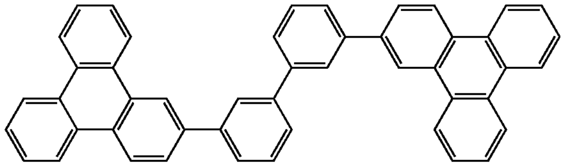
EM11
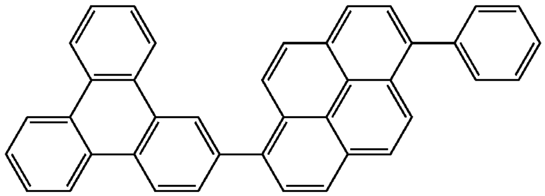
EM12
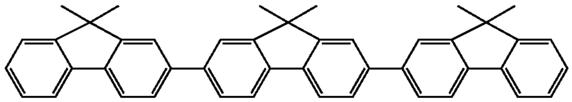
EM13
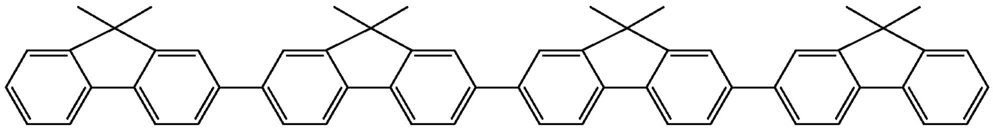
EM14
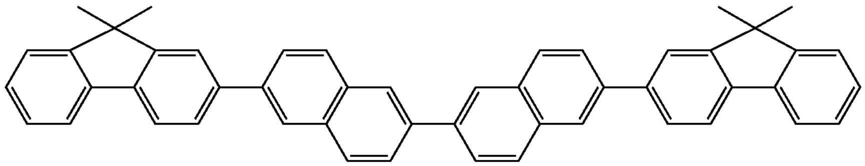

-continued
EM15
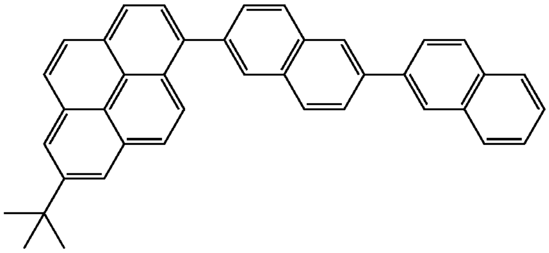
EM16
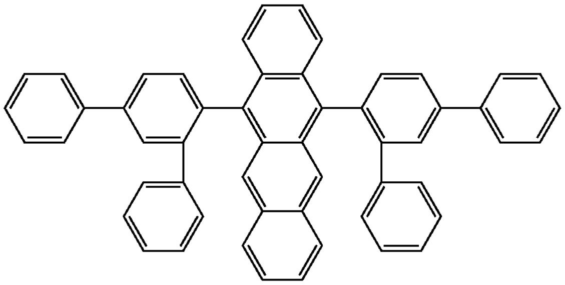
EM17
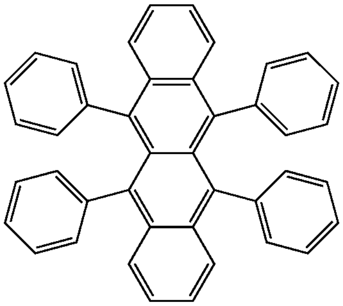
EM18
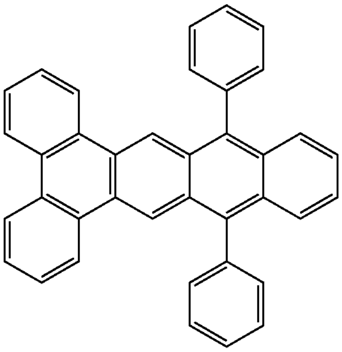
EM19
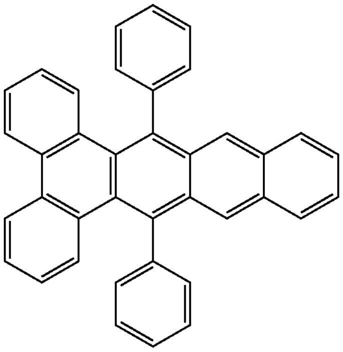
EM20
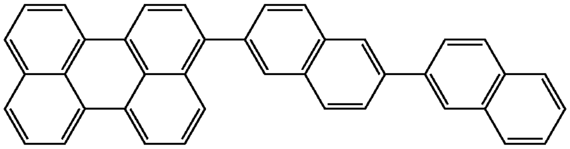
EM21
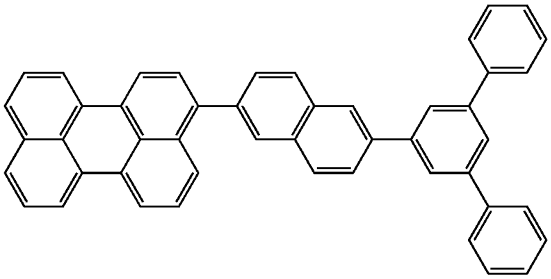
EM22
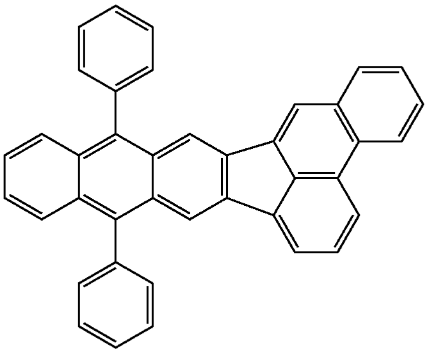

-continued
EM23
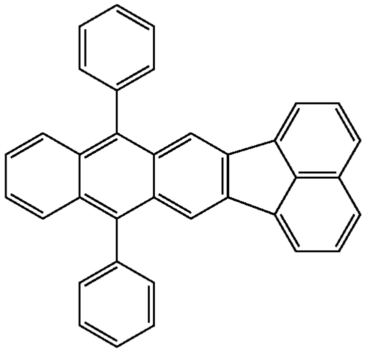
EM24
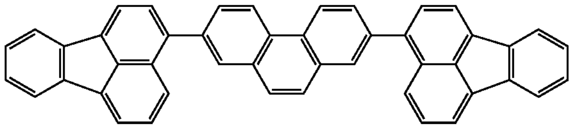
EM25
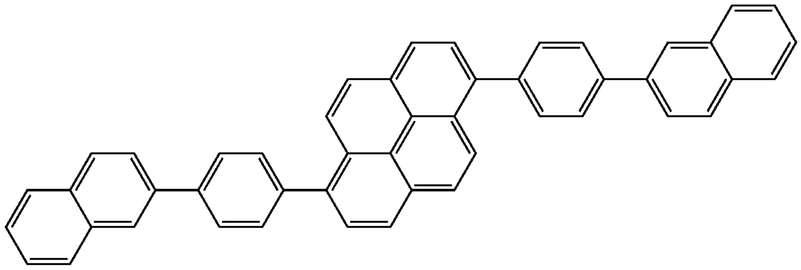
EM26
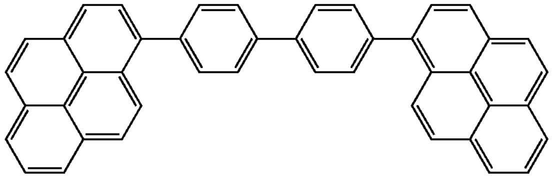
EM27
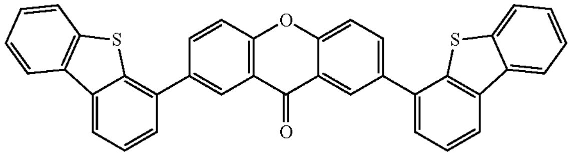
EM28
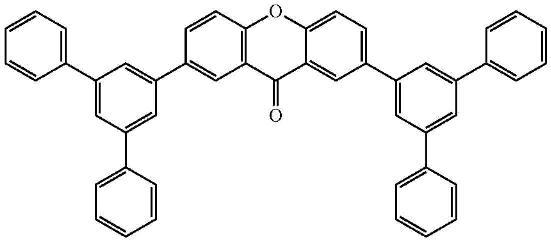
EM29
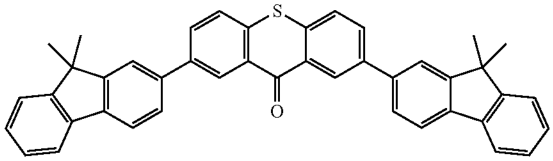
EM30
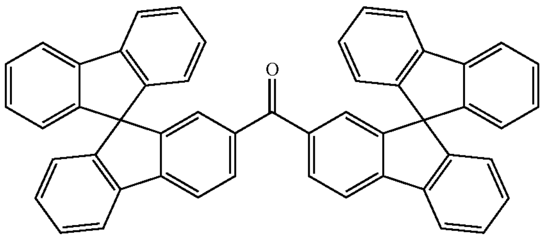
EM31
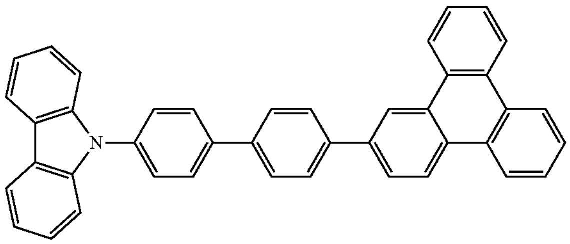
EM32
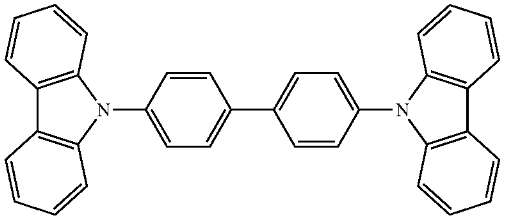

When the host material is a hydrocarbon compound, the compound according to the present embodiment can easily trap electrons and holes to contribute greatly to higher efficiency. The hydrocarbon compound is a compound consisting only of carbon and hydrogen. Among the above exemplified compounds, EM1 to EM26 are hydrocarbon compounds.

The electron transport material can be freely-selected from materials capable of transporting electrons injected from the cathode to the light-emitting layer and is selected in consideration of, for example, the balance with the hole mobility of the hole transport material. Examples of a material having the ability to transport electrons include oxadiazole derivatives, oxazole derivatives, pyrazine derivatives, triazole derivatives, triazine derivatives, quinoline derivatives, quinoxaline derivatives, phenanthroline derivatives, organoaluminum complexes, and fused-ring compounds, such as fluorene derivatives, naphthalene derivatives, chrysene derivatives, and anthracene derivatives. The electron transport materials can be used for the hole-blocking layer. Non-limiting specific examples of a compound used as the electron transport material will be described below.

ET1

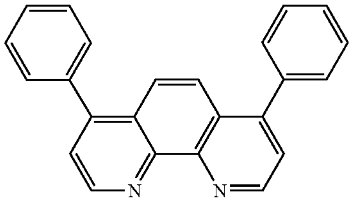

ET2

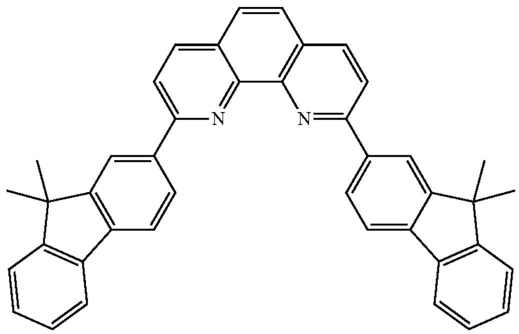

ET3

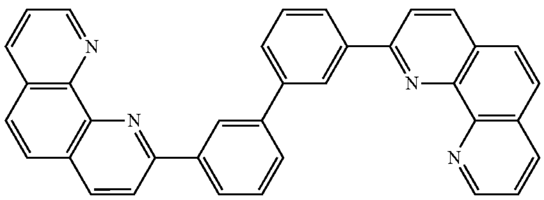

ET4

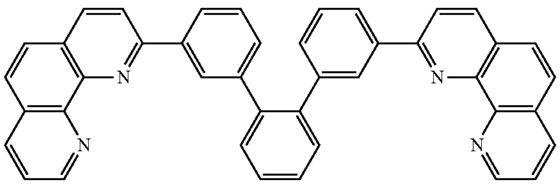

-continued

ET5

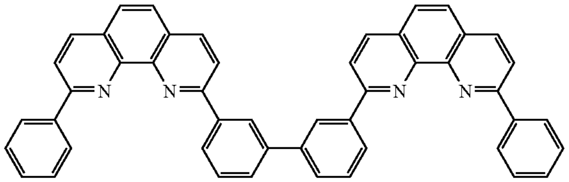

ET6

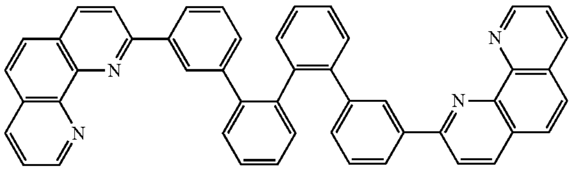

ET7

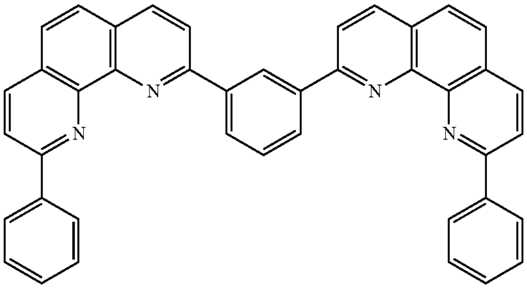

ET8

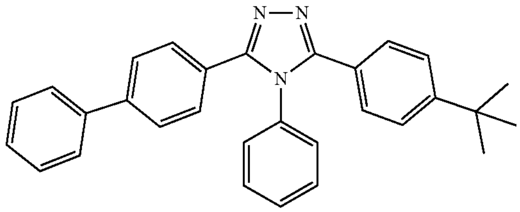

ET9

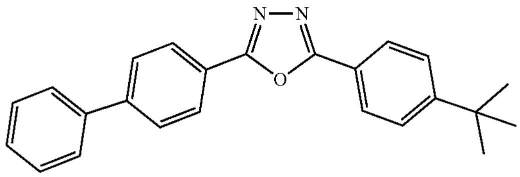

ET10

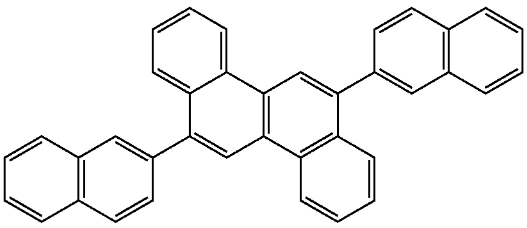

-continued
ET11
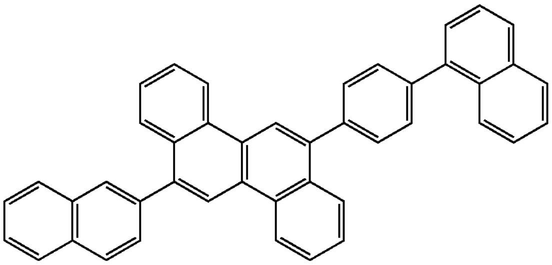
ET12
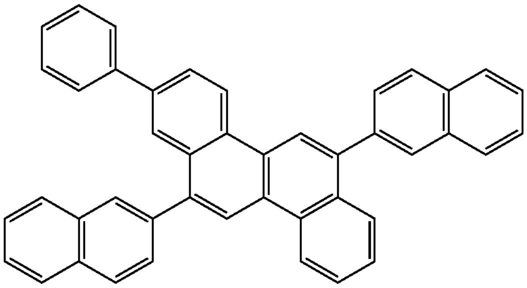
ET13
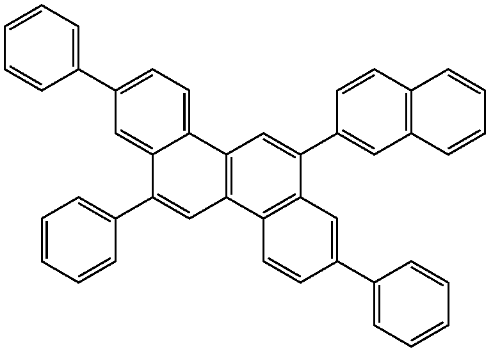
ET14
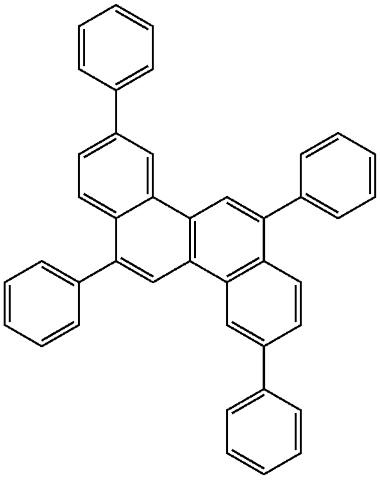
-continued
ET15
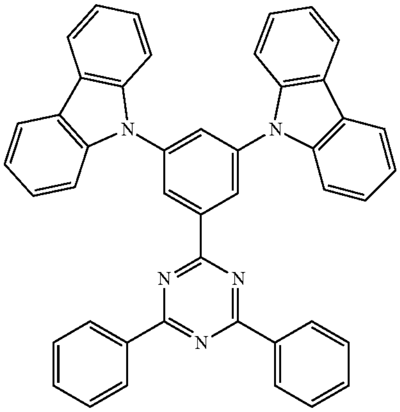
ET16
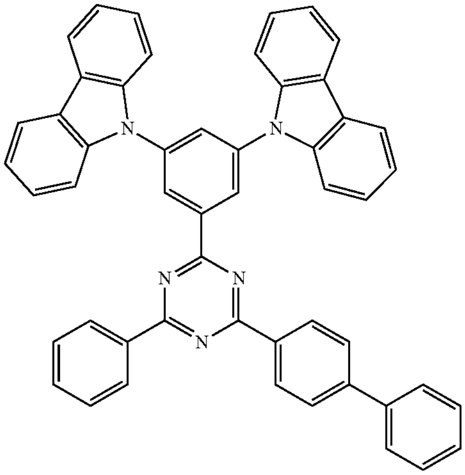
ET17
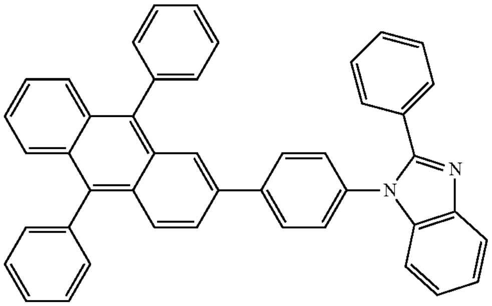
ET18
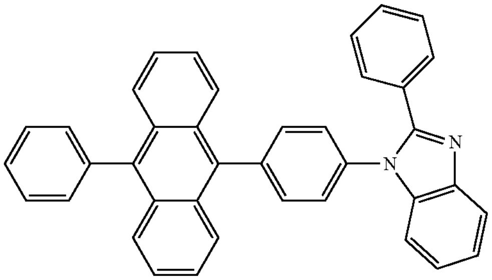

-continued

ET19

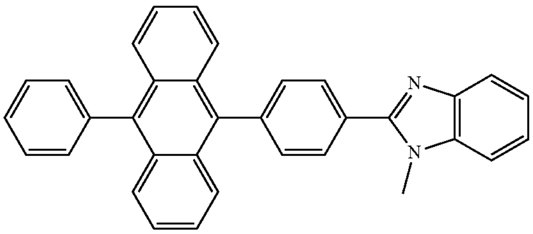

ET20

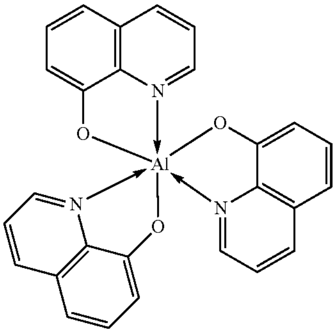

ET21

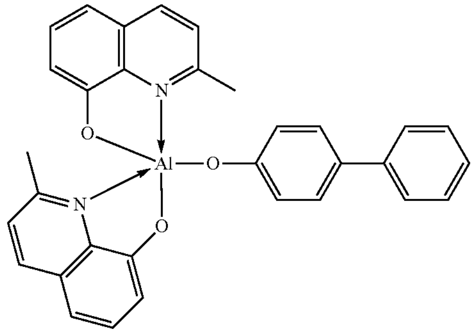

ET22

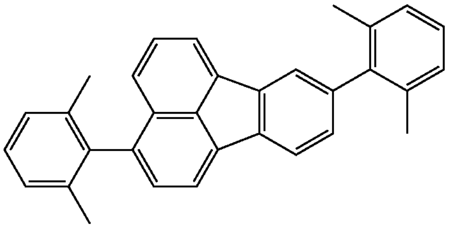

ET23

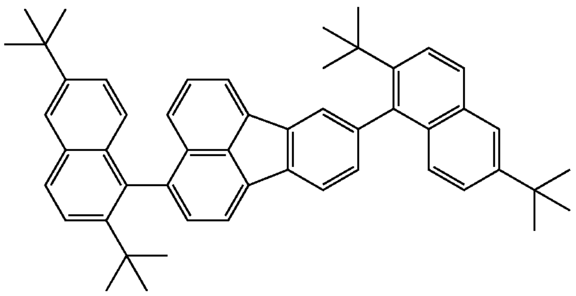

An electron injection material can be freely-selected from materials capable of easily injecting electrons from the cathode and is selected in consideration of, for example, the balance with the hole injectability. As the organic compound, n-type dopants and reducing dopants are also included. Examples thereof include alkali metal-containing compounds such as lithium fluoride, lithium complexes such as lithium quinolinolate, benzimidazolidene derivatives, imidazolidene derivatives, fulvalene derivatives, and acridine derivatives. It can also be used in combination with the above-mentioned electron transport material.

Configuration of Organic Light-Emitting Device

The organic light-emitting device includes an insulating layer, a first electrode, an organic compound layer, a second electrode over a substrate. A protective layer, a color filter, a microlens may be disposed over the second electrode. In the case of disposing the color filter, a planarization layer may be disposed between the protective layer and the color filter. The planarization layer can be composed of, for example, an acrylic resin. The same applies when a planarization layer is provided between the color filter and the microlens.

Substrate

Examples of the substrate include silicon wafers, quartz substrates, glass substrates, resin substrates, and metal substrates. The substrate may include a switching element, such as a transistor, a line, and an insulating layer thereon. Any material can be used for the insulating layer as long as a contact hole can be formed in such a manner that a line can be coupled to the first electrode and as long as insulation with a non-connected line can be ensured. For example, a resin, such as polyimide, silicon oxide, or silicon nitride, can be used.

Electrode

A pair of electrodes can be used. The pair of electrodes may be an anode and a cathode.

When an electric field is applied in the direction in which the organic light-emitting device emits light, an electrode having a higher potential is the anode, and the other is the cathode. It can also be said that the electrode that supplies holes to the light-emitting layer is the anode and that the electrode that supplies electrons is the cathode.

As the component material of the anode, a material having a work function as high as possible can be used. Examples of the material that can be used include elemental metals, such as gold, platinum, silver, copper, nickel, palladium, cobalt, selenium, vanadium, and tungsten, mixtures thereof, alloys of combinations thereof, and metal oxides, such as tin oxide, zinc oxide, indium oxide, indium-tin oxide (ITO), and indium-zinc oxide. Additionally, conductive polymers, such as polyaniline, polypyrrole, and polythiophene, can be used.

These electrode materials may be used alone or in combination of two or more. The anode may be formed of a single layer or multiple layers.

When the anode is used as a reflective electrode, for example, chromium, aluminum, silver, titanium, tungsten, molybdenum, an alloy thereof, or a stack thereof can be used. These materials can also be used to act as a reflective film that does not have the role of an electrode. When the anode is used as a transparent electrode, a transparent conductive oxide layer composed of, for example, indium-tin oxide (ITO) or indium-zinc oxide can be used; however, the anode is not limited thereto.

The electrode can be formed by photolithography.

As the component material of the cathode, a material having a lower work function can be used. Examples thereof include elemental metals such as alkali metals, e.g., lithium, alkaline-earth metals, e.g., calcium, aluminum, titanium, manganese, silver, lead, and chromium, and mixtures thereof. Alloys of combinations of these elemental metals can also be used. For example, magnesium-silver, aluminum-lithium, aluminum-magnesium, silver-copper, and zinc-silver can be used. Metal oxides, such as indium-tin oxide (ITO), can also be used. These electrode materials may be used alone or in combination of two or more. The cathode may have a single-layer structure or a multilayer structure. In particular, silver can be used. To reduce the aggregation of silver, a silver alloy can be used. Any alloy ratio may be used as long as the aggregation of silver can be reduced. The ratio of silver to another metal may be, for example, 1:1 or 3:1.

A top emission device may be provided using the cathode formed of a conductive oxide layer composed of, for example, ITO. A bottom emission device may be provided using the cathode formed of a reflective electrode composed of, for example, aluminum (Al). Any type of cathode may be used. Any method for forming the cathode may be employed. For example, a direct-current or alternating-current sputtering technique can be employed because good film coverage is obtained and thus the resistance is easily reduced.

Organic Compound Layer

The organic compound layer may be formed of a single layer or multiple layers. When multiple layers are present, they may be referred to as a hole injection layer, a hole transport layer, an electron-blocking layer, a light-emitting layer, a hole-blocking layer, an electron transport layer, or an electron injection layer in accordance with their functions. The organic compound layer is mainly composed of an organic compound, and may contain inorganic atoms and an inorganic compound. For example, the organic compound layer may contain, for example, copper, lithium, magnesium, aluminum, iridium, platinum, molybdenum, or zinc. The organic compound layer may be disposed between the first electrode and the second electrode, and may be disposed in contact with the first electrode and the second electrode.

The organic compound layer, such as the hole injection layer, the hole transport layer, the electron-blocking layer, the light-emitting layer, the hole-blocking layer, the electron transport layer, or the electron injection layer, included in the organic light-emitting device according to an embodiment of the present disclosure is formed by a method described below.

For the organic compound layer included in the organic light-emitting device according to an embodiment of the present disclosure, a dry process, such as a vacuum evaporation method, an ionized evaporation method, sputtering, or plasma, may be employed. Alternatively, instead of the dry process, it is also possible to employ a wet process in which a material is dissolved in an appropriate solvent and then a film is formed by a known coating method, such as spin coating, dipping, a casting method, a Langmuir-Blodgett (LB) technique, or an ink jet method.

When the layer is formed by, for example, the vacuum evaporation method or the solution coating method, crystallization and so forth are less likely to occur, and good stability with time is obtained. In the case of forming a film by the coating method, the film may be formed in combination with an appropriate binder resin.

Non-limiting examples of the binder resin include poly (vinyl carbazole) resins, polycarbonate resins, polyester resins, acrylonitrile butadiene styrene (ABS) resins, acrylic resins, polyimide resins, phenolic resins, epoxy resins, silicone resins, and urea resins.

These binder resins may be used alone as a homopolymer or copolymer or in combination as a mixture of two or more. Furthermore, additives, such as a known plasticizer, antioxidant, and ultraviolet absorber, may be used, as needed.

Protective Layer

A protective layer may be disposed on the second electrode. For example, a glass member provided with a moisture absorbent can be bonded to the second electrode to reduce the entry of, for example, water into the organic compound layer, thereby reducing the occurrence of display defects. In another embodiment, a passivation film composed of, for example, silicon nitride may be disposed on the second electrode to reduce the entry of, for example, water into the organic compound layer. For example, after the formation of the second electrode, the substrate may be transported to another chamber without breaking the vacuum, and a silicon nitride film having a thickness of 2 μm may be formed by a chemical vapor deposition (CVD) method to provide a protective layer. After the film deposition by the CVD method, a protective layer may be formed by an atomic layer deposition (ALD) method. Non-limiting examples of the material of the layer formed by the ALD method may include silicon nitride, silicon oxide, and aluminum oxide. Silicon nitride may be deposited by the CVD method on the layer formed by the ALD method. The film formed by the ALD method may have a smaller thickness than the film formed by the CVD method. Specifically, the thickness may be 50% or less, even 10% or less.

Color Filter

A color filter may be disposed on the protective layer. For example, a color filter may be disposed on another substrate in consideration of the size of the organic light-emitting device and bonded to the substrate provided with the organic light-emitting device. A color filter may be formed by patterning on the protective layer using photolithography. The color filter may be composed of a polymer.

Planarization Layer

A planarization layer may be disposed between the color filter and the protective layer. The planarization layer is provided for the purpose of reducing the unevenness of the layer underneath. The planarization layer may be referred to as a "material resin layer" without limiting its purpose. The planarization layer may be composed of an organic compound. A low- or high-molecular-weight organic compound may be used. A high-molecular-weight organic compound can be used.

The planarization layers may be disposed above and below (or on) the color filter and may be composed of the same or different component materials. Specific examples thereof include poly(vinyl carbazole) resins, polycarbonate resins, polyester resins, acrylonitrile butadiene styrene (ABS) resins, acrylic resins, polyimide resins, phenolic resins, epoxy resins, silicone resins, and urea resins.

Microlens

The organic light-emitting device or an organic light-emitting apparatus may include an optical component, such as a microlens, on the outgoing light side. The microlens can be composed of, for example, an acrylic resin or an epoxy resin. The microlens may be used to increase the amount of light emitted from the organic light-emitting device or the organic light-emitting apparatus and to control the direction of the light emitted. The microlens may have a hemispherical shape. In the case of a hemispherical shape, among tangents to the hemisphere, there is a tangent parallel to the insulating layer. The point of contact of the tangent with the hemisphere is the vertex of the microlens. The vertex of the microlens can be determined in the same way for any cross-sectional view. That is, among the tangents to the semicircle of the microlens in the cross-sectional view, there is a tangent parallel to the insulating layer, and the point of contact of the tangent with the semicircle is the vertex of the microlens.

The midpoint of the microlens can be defined. In the cross section of the microlens, when a segment is hypothetically drawn from the point where an arc shape ends to the point where another arc shape ends, the midpoint of the segment can be referred to as the midpoint of the microlens. The cross section to determine the vertex and midpoint may be a cross section perpendicular to the insulating layer.

Opposite Substrate

An opposite substrate may be disposed on the planarization layer. The opposite substrate is disposed at a position corresponding to the substrate described above and thus is called an opposite substrate. The opposite substrate may be composed of the same material as the substrate described above. When the above-described substrate is referred to as a first substrate, the opposite substrate may be referred to as a second substrate.

Pixel Circuit

An organic light-emitting apparatus including organic light-emitting devices may include pixel circuits coupled to the organic light-emitting devices. Each of the pixel circuits may be of an active matrix type, which independently controls the emission of first and second light-emitting devices. The active matrix type circuit may be voltage programming or current programming. A driving circuit includes the pixel circuit for each pixel. The pixel circuit may include a light-emitting device, a transistor to control the luminance of the light-emitting device, a transistor to control the timing of the light emission, a capacitor to retain the gate voltage of the transistor to control the luminance, and a transistor to connect to GND without using the light-emitting device.

The light-emitting apparatus includes a display area and a peripheral area disposed around the display area. The display area includes a pixel circuit, and the peripheral area includes a display control circuit. The mobility of a transistor contained in the pixel circuit may be lower than the mobility of a transistor contained in the display control circuit.

The gradient of the current-voltage characteristics of the transistor contained in the pixel circuit may be smaller than the gradient of the current-voltage characteristic of the transistor contained in the display control circuit. The gradient of the current-voltage characteristics can be measured by what is called Vg-Ig characteristics. The transistor contained in the pixel circuit is a transistor coupled to a light-emitting device, such as a first light-emitting device.

Pixel

An organic light-emitting apparatus including an organic light-emitting device may include multiple pixels. Each pixel includes subpixels configured to emit colors different from each other. The subpixels may have respective red, green, and blue (RGB) emission colors.

Light emerges from a region of the pixel, also called a pixel aperture. This region is the same as a first region. The pixel aperture may be 15 μm or less, and may be 5 μm or more. More specifically, the pixel aperture may be, for example, 11 μm, 9.5 μm, 7.4 μm, or 6.4 μm. The distance between subpixels may be 10 μm or less. Specifically, the distance may be 8 μm, 7.4 μm, or 6.4 μm.

The pixels may be arranged in a known pattern in plan view. For example, a stripe pattern, a delta pattern, a Pen Tile matrix pattern, or the Bayer pattern may be used. The shape of each subpixel in plan view may be any known shape. Examples of the shape of the subpixel include quadrilaterals, such as rectangles and *rhombi*, and hexagons. Of course, if the shape is close to a rectangle, rather than an exact shape, it is included in the rectangle. The shape of the subpixel and the pixel arrangement can be used in combination.

Application of Organic Light-Emitting Device According to Embodiment of the Present Embodiment The organic light-emitting device according to the present embodiment can be used as a component member of a display apparatus or lighting apparatus. Other applications include exposure light sources for electrophotographic image-forming apparatuses, backlights for liquid crystal displays, and light-emitting apparatuses including white-light sources and color filters.

The display apparatus may be an image information-processing unit having an image input unit that receives image information from an area or linear CCD sensor, a memory card, or any other source, an information-processing unit that processes the input information, and a display unit that displays the input image. The display apparatus includes multiple pixels, and at least one of the multiple pixels may include the organic light-emitting device according to the present embodiment and a transistor coupled to the organic light-emitting device.

The display unit of an image pickup apparatus or an inkjet printer may have a touch panel function. The driving mode of the touch panel function may be, but is not particularly limited to, an infrared mode, an electrostatic capacitance mode, a resistive film mode, or an electromagnetic inductive mode. The display apparatus may also be used for a display unit of a multifunction printer.

Figure 1B:
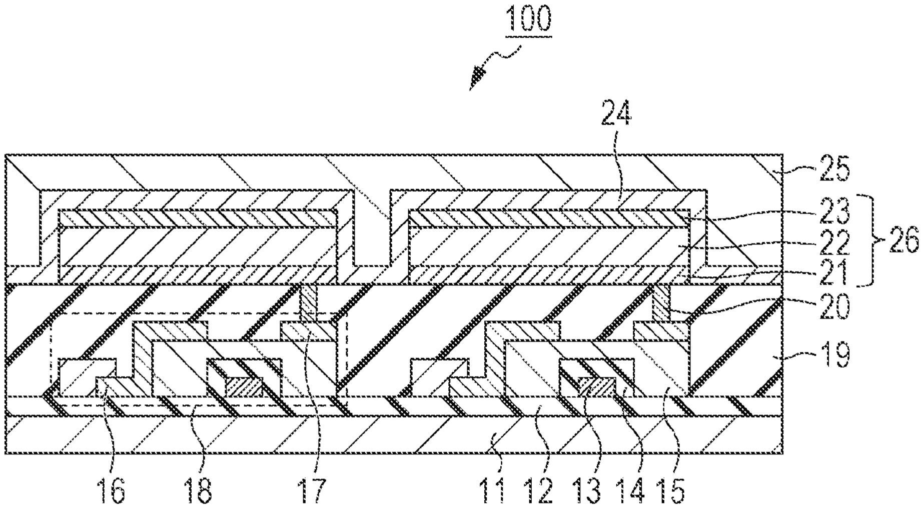
FIG. 1B is a schematic cross-sectional view of an example of a display apparatus including organic light-emitting devices according to an embodiment of the present disclosure.

The following describes a display apparatus according to the present embodiment with reference to the attached drawings. FIGS. 1A and 1B are each a schematic cross-sectional view of an example of a display apparatus including organic light-emitting devices and transistors coupled to the respective organic light-emitting devices. Each of the transistors is an example of an active element. The transistors may be thin-film transistors (TFTs).

FIG. 1A is an example of pixels that are components of the display apparatus according to the present embodiment. Each of the pixels includes subpixels 10. The subpixels are separated into 10R, 10G, and 10B according to their light emission. The emission color may be distinguished based on the wavelength of light emitted from the light-emitting layer. Alternatively, light emitted from the subpixels may be selectively transmitted or color-converted with, for example, a color filter. Each subpixels 10 includes a reflective electrode serving as a first electrode 2, an insulating layer 3 covering the edge of the first electrode 2, an organic compound layer 4 covering the first electrode 2 and the insulating layer 3, a transparent electrode serving as a second electrode 5, a protective layer 6, and a color filter 7 over an interlayer insulating layer 1.

The transistors and capacitive elements may be disposed under or in the interlayer insulating layer 1.

Each transistor may be electrically coupled to a corresponding one of the first electrodes 2 through a contact hole (not illustrated).

The insulating layer 3 is also called a bank or pixel separation film. The insulating layer 3 covers the edge of each first electrode 2 and surrounds the first electrode 2. Portions that are not covered with the insulating layer 3 are in contact with the organic compound layer 4 and serve as light-emitting regions.

The organic compound layer 4 includes a hole injection layer 41, a hole transport layer 42, a first light-emitting layer 43, a second light-emitting layer 44, and an electron transport layer 45.

The second electrode 5 may be a transparent electrode, a reflective electrode, or a semi-transparent electrode.

The protective layer 6 reduces the penetration of moisture into the organic compound layer 4. Although the protective layer 6 is illustrated as a single layer, the protective layer 6 may include multiple layers, and each layer may be an inorganic compound layer or an organic compound layer.

The color filter 7 is separated into 7R, 7G, and 7B according to its color. The color filter 7 may be disposed on a planarization film (not illustrated). A resin protective layer (not illustrated) may be disposed on the color filter 7. The color filter 7 may be disposed on the protective layer 6. Alternatively, the color filter 7 may be disposed on an opposite substrate, such as a glass substrate, and then bonded.

A display apparatus 100 illustrated in FIG. 1B includes organic light-emitting devices 26 and TFTs 18 as an example of transistors. A substrate 11 composed of a material, such as glass or silicon is provided, and an insulating layer 12 is disposed thereon. Active elements, such as the TFTs 18, are disposed on the insulating layer 12. The gate electrode 13, the gate insulating film 14, and the semiconductor layer 15 of each of the active elements are disposed thereon. Each TFT 18 further includes a drain electrode 16 and a source electrode 17. The TFTs 18 are overlaid with an insulating film 19. Anode 21 included in the organic light-emitting devices 26 is coupled to the source electrodes 17 through contact holes 20 provided in the insulating film 19.

The mode of electrical connection between the electrodes (anode 21 and cathode 23) included in each organic light-emitting device 26 and the electrodes (source electrode 17 and drain electrode 16) included in a corresponding one of the TFTs 18 is not limited to the mode illustrated in FIG. 1B. That is, it is sufficient that any one of the anode 21 and the cathode 23 is electrically coupled to any one of the source electrode 17 and the drain electrode 16 of the TFT 18. The term "TFT" refers to a thin-film transistor.

In the display apparatus 100 illustrated in FIG. 1B, although each organic compound layer 22 is illustrated as a single layer, the organic compound layer 22 may include multiple layers. To reduce the deterioration of the organic light-emitting devices 26, a first protective layer 24 and a second protective layer 25 are disposed on the cathodes 23.

In the display apparatus 100 illustrated in FIG. 1B, although the transistors are used as switching devices, other switching devices may be used instead.

The transistors used in the display apparatus 100 illustrated in FIG. 1B are not limited to transistors using a single-crystal silicon wafer, but may also be thin-film transistors including active layers on the insulating surface of a substrate. Examples of the material of the active layers include single-crystal silicon, non-single-crystal silicon, such as amorphous silicon and microcrystalline silicon; and non-single-crystal oxide semiconductors, such as indium zinc oxide and indium gallium zinc oxide. Thin-film transistors are also called TFT elements.

The transistors in the display apparatus 100 illustrated in FIG. 1B may be formed in the substrate, such as a Si substrate. The expression "formed in the substrate" indicates that the transistors are produced by processing the substrate, such as a Si substrate. In the case where the transistors are formed in the substrate, the substrate and the transistors can be deemed to be integrally formed.

In the organic light-emitting device according to the present embodiment, the luminance is controlled by the TFT devices, which are an example of switching devices; thus, an image can be displayed at respective luminance levels by arranging multiple organic light-emitting devices in the plane. The switching devices according to the present embodiment are not limited to the TFT devices and may be low-temperature polysilicon transistors or active-matrix drivers formed on a substrate such as a Si substrate. The expression "on a substrate" can also be said to be "in the substrate". Whether transistors are formed in the substrate or TFT devices are used is selected in accordance with the size of a display unit. For example, in the case where the display unit has a size of about 0.5 inches, organic light-emitting devices can be disposed on a Si substrate.

Figure 2:
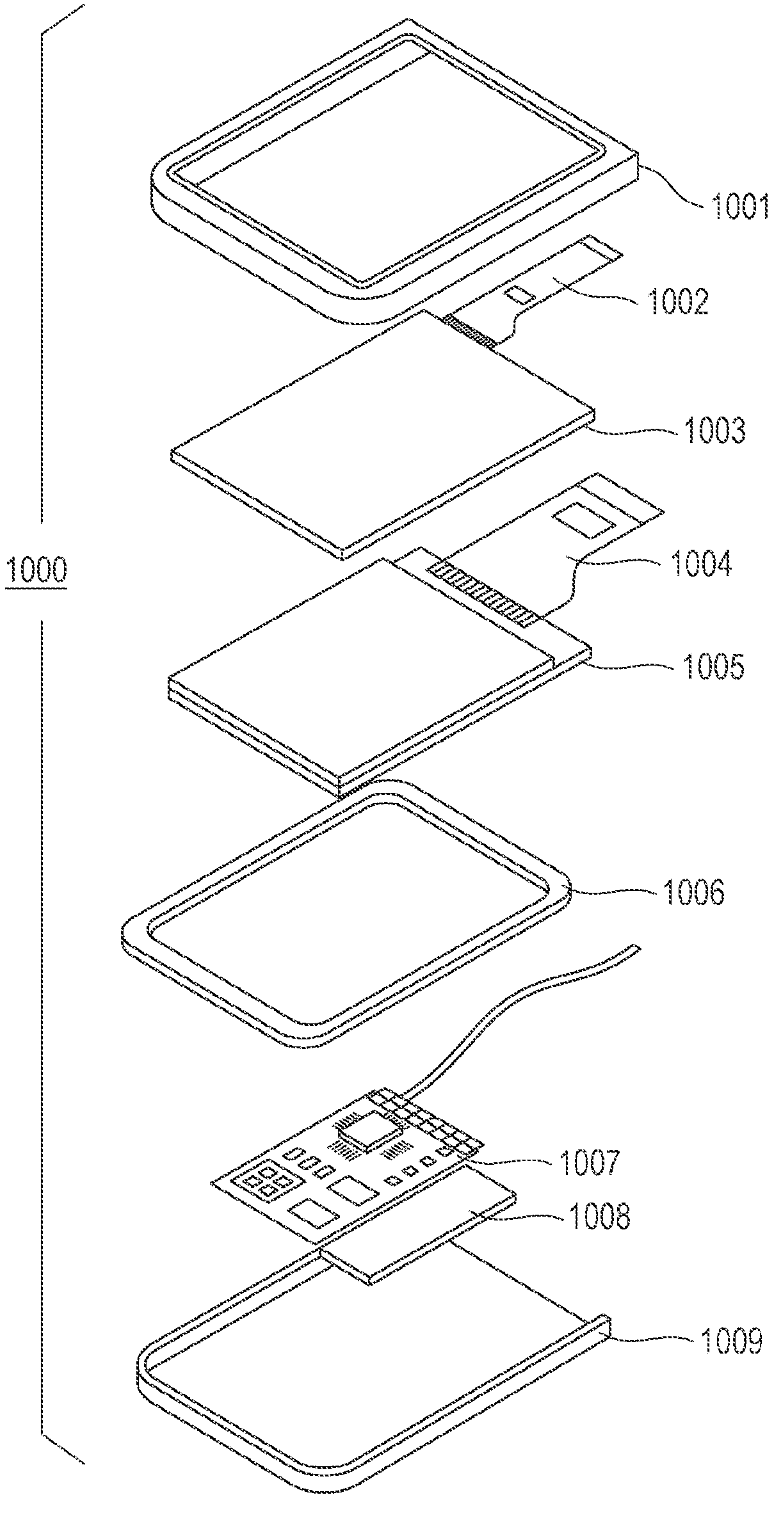
FIG. 2 is a schematic view of an example of a display apparatus according to an embodiment of the present disclosure.

FIG. 2 is a schematic view illustrating an example of a display apparatus according to the present embodiment. A display apparatus 1000 may include a touch panel 1003, a display panel 1005, a frame 1006, a circuit substrate 1007, and a battery 1008 disposed between an upper cover 1001 and a lower cover 1009. The touch panel 1003 and the display panel 1005 are coupled to flexible printed circuits FPCs 1002 and 1004, respectively. The circuit substrate 1007 includes printed transistors. The battery 1008 need not be provided unless the display apparatus is a portable apparatus. The battery 1008 may be disposed at a different position even if the display apparatus is a portable apparatus.

The display apparatus according to the present embodiment may include a color filter having red, green, and blue portions. In the color filter, the red, green, and blue portions may be arranged in a delta arrangement.

The display apparatus according to the present embodiment may be used for the display unit of a portable terminal. In that case, the display apparatus may have both a display function and an operation function. Examples of the portable terminal include mobile phones such as smartphones, tablets, and head-mounted displays.

The display apparatus according to the present embodiment may be used for a display unit of an image pickup apparatus including an optical unit including multiple lenses and an image pickup device that receives light passing through the optical unit. The image pickup apparatus may include a display unit that displays information acquired by the image pickup device. The display unit may be a display unit exposed to the outside of the image pickup apparatus or a display unit disposed in a finder. The image pickup apparatus may be a digital camera or a digital camcorder.

Figure 3A:
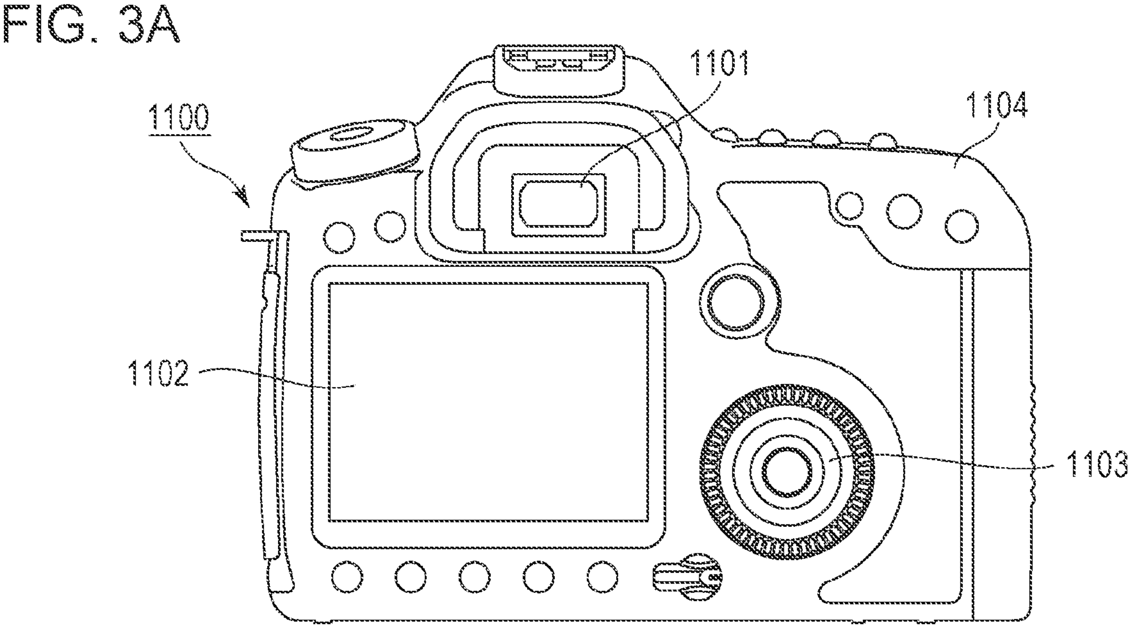
FIG. 3A is a schematic view of an example of an image pickup apparatus according to an embodiment of the present disclosure.

FIG. 3A is a schematic view illustrating an example of an image pickup apparatus according to the present embodiment. An image pickup apparatus 1100 may include a viewfinder 1101, a rear display 1102, an operation unit 1103, and a housing 1104. The viewfinder 1101 may include the display apparatus according to the present embodiment. In this case, the display apparatus may display environmental information, imaging instructions, and so forth in addition to an image to be captured. The environmental information may include, for example, the intensity of external light, the direction of external light, the moving speed of a subject, and the possibility that a subject is shielded by a shielding material.

The timing suitable for imaging is only for a short time; thus, the information may be displayed as soon as possible. The display apparatus including the organic light-emitting device according to the present disclosure can be used more suitably than liquid crystal displays because the organic light-emitting device has a fast response time. The display apparatus including the organic light-emitting device can be used more suitably than liquid crystal displays for such apparatuses required to have a high display speed.

The image pickup apparatus 1100 includes an optical unit (not illustrated). The optical unit includes multiple lenses and is configured to form an image on an image pickup device in the housing 1104. The relative positions of the multiple lenses can be adjusted to adjust the focal point. This operation can also be performed automatically. The image pickup apparatus may translate to a photoelectric conversion apparatus. Examples of an image capturing method employed in the photoelectric conversion apparatus may include a method for detecting a difference from the previous image and a method of cutting out an image from images always recorded, instead of sequentially capturing images.

Figure 3B:
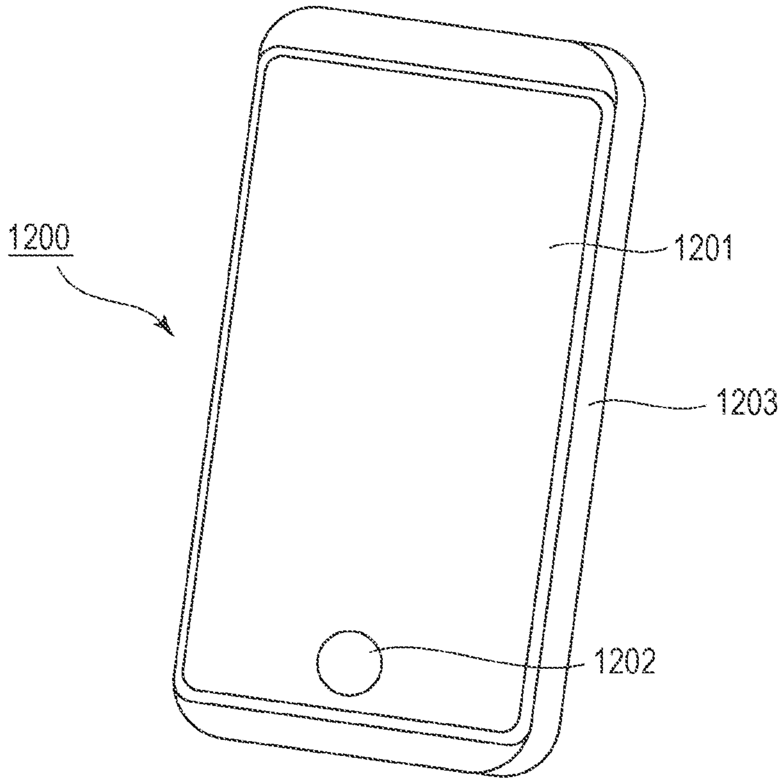
FIG. 3B is a schematic view of an example of an electronic apparatus according to an embodiment of the present disclosure.

FIG. 3B is a schematic view illustrating an example of an electronic apparatus according to the present embodiment. An electronic apparatus 1200 includes a display unit 1201, an operation unit 1202, and a housing 1203. The housing 1203 may accommodate a circuit, a printed circuit board including the circuit, a battery, and a communication unit. The operation unit 1202 may be a button or a touch-screen-type reactive unit. The operation unit 1202 may be a biometric recognition unit that recognizes a fingerprint to release the lock or the like. An electronic apparatus having a communication unit can also be referred to as a communication apparatus. The electronic apparatus 1200 may further have a camera function by being equipped with a lens and an image pickup device. An image captured by the camera function is displayed on the display unit 1201. Examples of the electronic apparatus 1200 include smartphones and notebook computers.

Figure 4A:
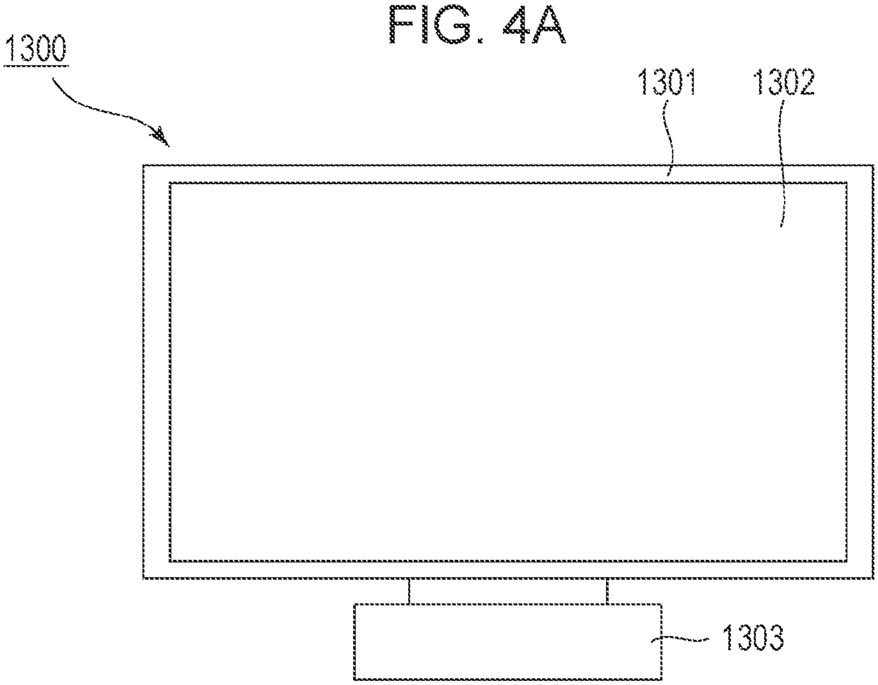
FIG. 4A is a schematic view of an example of a display apparatus according to an embodiment of the present disclosure.

FIG. 4A is a schematic view illustrating an example of the display apparatus according to the present embodiment. FIG. 4A illustrates a display apparatus, such as a television monitor or a PC monitor. A display apparatus 1300 includes a frame 1301 and a display unit 1302. The light-emitting device according to the present embodiment may be used for the display unit 1302. The display apparatus 1300 includes a base 1303 that supports the frame 1301 and the display unit 1302. The base 1303 is not limited to the structure illustrated in FIG. 4A. The lower side of the frame 1301 may also serve as a base. The frame 1301 and the display unit 1302 may be curved. These may have a radius of curvature of 5,000 mm or more and 6,000 mm or less.

Figure 4B:
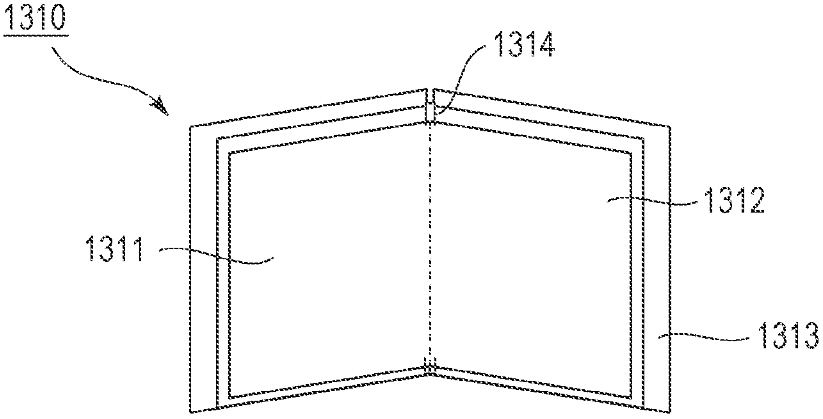
FIG. 4B is a schematic view of an example of a foldable display apparatus.

FIG. 4B is a schematic view illustrating another example of a display apparatus according to the present embodiment. A display apparatus 1310 illustrated in FIG. 4B can be folded and is what is called a foldable display apparatus. The display apparatus 1310 includes a first display portion 1311, a second display portion 1312, a housing 1313, and an inflection point 1314. The first display portion 1311 and the second display portion 1312 may include the light-emitting device according to the present embodiment. The first display portion 1311 and the second display portion 1312 may be a single, seamless display apparatus. The first display portion 1311 and the second display portion 1312 can be divided from each other at the inflection point. The first display portion 1311 and the second display portion 1312 may display different images. Alternatively, a single image may be displayed in the first and second display portions.

Figure 5A:
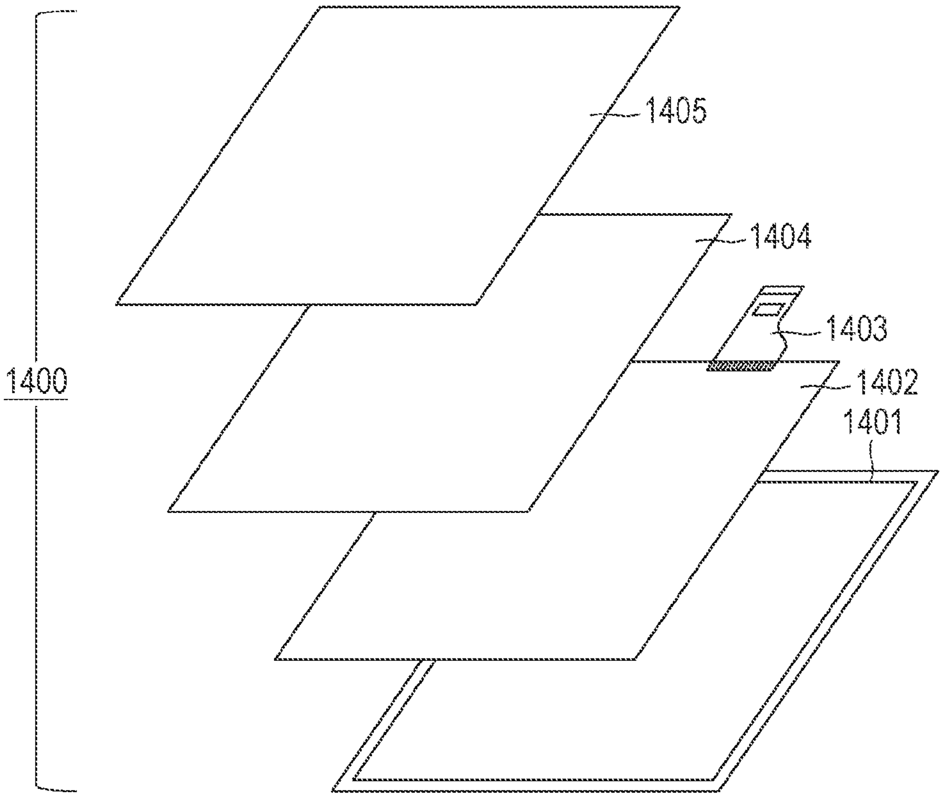
FIG. 5A is a schematic view of an example of a lighting apparatus according to an embodiment of the present disclosure.

FIG. 5A is a schematic view illustrating an example of a lighting apparatus according to the present embodiment. A lighting apparatus 1400 may include a housing 1401, a light source 1402, a circuit board 1403, an optical filter 1404 that transmits light emitted from the light source 1402, and a light diffusion unit 1405. The light source 1402 may include an organic light-emitting device according to the present embodiment. The optical filter 1404 may be a filter that improves the color rendering properties of the light source. The light diffusion unit 1405 can effectively diffuse light from the light source to deliver the light to a wide range when used for illumination and so forth. The optical filter 1404 and the light diffusion unit 1405 may be disposed at the light emission side of the lighting apparatus. A cover may be disposed at the outermost portion, as needed.

The lighting apparatus is, for example, an apparatus that lights a room. The lighting apparatus may emit light of white, neutral white, or any color from blue to red. A light control circuit that controls the light may be provided.

The lighting apparatus may include the organic light-emitting device according to the present embodiment and a power supply circuit coupled thereto. The power supply circuit is a circuit that converts an AC voltage into a DC voltage. The color temperature of white is 4,200 K, and the color temperature of neutral white is 5,000 K. The lighting apparatus may include a color filter.

The lighting apparatus according to the present embodiment may include a heat dissipation unit. The heat dissipation unit is configured to release heat in the device to the outside of the device and is composed of, for example, a metal having a high specific heat and liquid silicone.

Figure 5B:
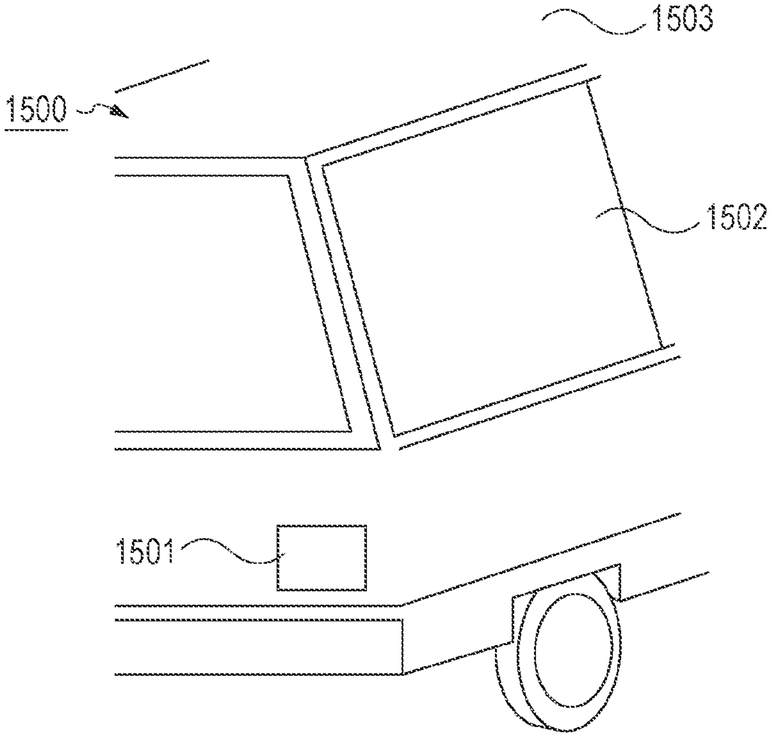
FIG. 5B is a schematic view of an example of a moving object including an automotive lighting unit according to an embodiment of the present disclosure.

FIG. 5B is a schematic view illustrating an automobile as an example of a moving object according to the present embodiment. The automobile includes a tail lamp, which is an example of lighting units. An automobile 1500 includes a tail lamp 1501 and may be configured to light the tail lamp when a brake operation or the like is performed.

The tail lamp 1501 may include an organic light-emitting device according to the present embodiment. The tail lamp 1501 may include a protective member that protects the organic light-emitting device. The protective member may be composed of any transparent material having high strength to some extent and can be composed of, for example, polycarbonate. The polycarbonate may be mixed with, for example, a furandicarboxylic acid derivative or an acrylonitrile derivative.

The automobile 1500 may include an automobile body 1503 and windows 1502 attached thereto. The windows 1502 may be transparent displays if the windows are not used to check the front and back of the automobile. The transparent displays may include an organic light-emitting device according to the present embodiment.

In this case, the components, such as the electrodes, of the organic light-emitting device are formed of transparent members.

The moving object according to the present embodiment may be, for example, a ship, an aircraft, or a drone. The moving object may include a body and a lighting unit attached to the body. The lighting unit may emit light to indicate the position of the body. The lighting unit includes the organic light-emitting device according to the present embodiment.

Examples of applications of the display apparatuses of the above embodiments will be described with reference to FIGS. 6A and 6B. The display apparatuses can be used for systems that can be worn as wearable devices, such as smart glasses, head-mounted displays (HMDs), and smart contacts. An image pickup and display apparatus used in such an example of the applications has an image pickup apparatus that can photoelectrically convert visible light and a display apparatus that can emit visible light.

Figure 6A:
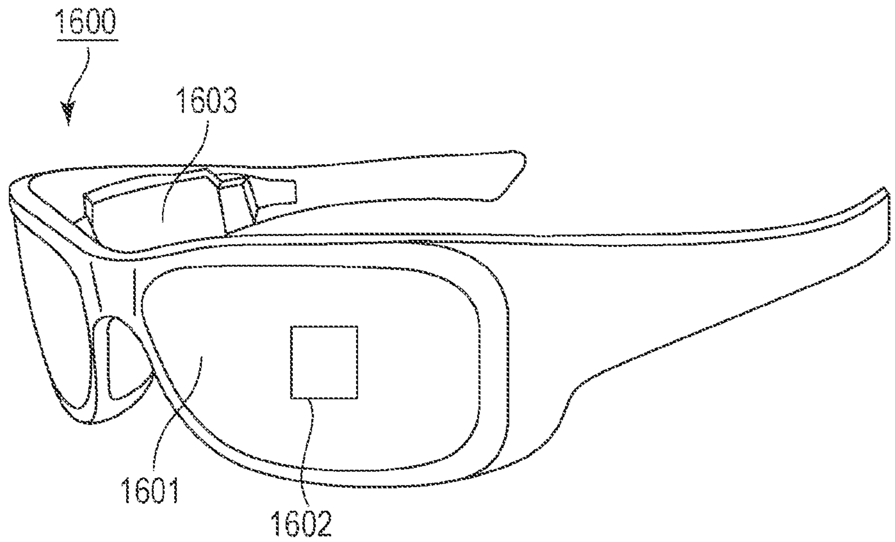
FIG. 6A is a schematic view illustrating an example of a wearable device according to an embodiment of the present disclosure.

FIG. 6A is a schematic view illustrating an example of a wearable device according to an embodiment of the present disclosure. Glasses 1600 (smart glasses) according to an example of applications will be described with reference to FIG. 6A. An image pickup apparatus 1602, such as a complementary metal-oxide semiconductor (CMOS) sensor or a single-photon avalanche diode (SPAD), is provided on a front side of a lens 1601 of the glasses 1600. The display apparatus according to any of the above-mentioned embodiments is provided on the back side of the lens 1601.

The glasses 1600 further include a control unit 1603. The control unit 1603 functions as a power source that supplies electric power to the image pickup apparatus 1602 and the display apparatus. The control unit 1603 controls the operation of the image pickup apparatus 1602 and the display apparatus. The lens 1601 has an optical system for focusing light on the image pickup apparatus 1602.

Figure 6B:
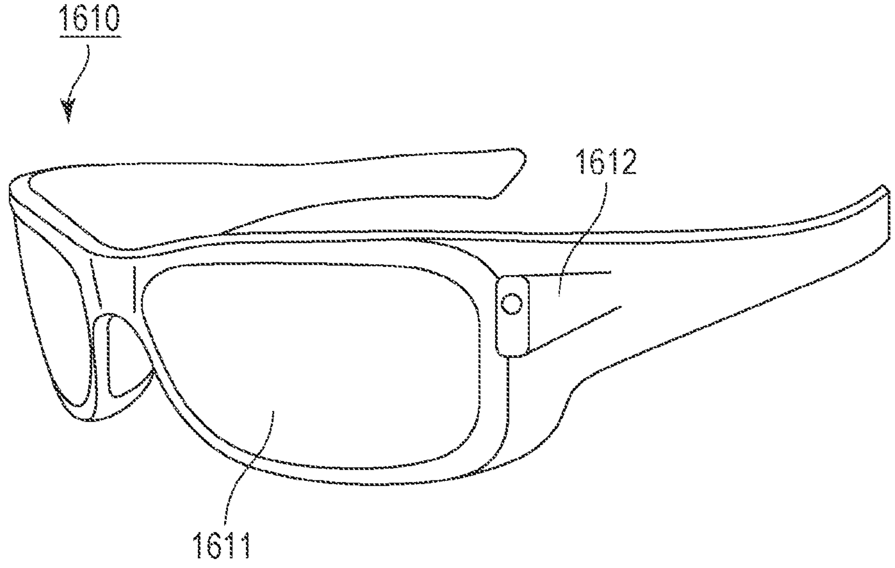
FIG. 6B is a schematic view of another example of a wearable device according to an embodiment of the present disclosure.

FIG. 6B is a schematic view illustrating another example of a wearable device according to an embodiment of the present disclosure. Glasses 1610 (smart glasses) according to an example of applications will be described with reference to FIG. 6B. The glasses 1610 include a control unit 1612. The control unit 1612 includes an image pickup apparatus corresponding to the image pickup apparatus 1602 illustrated in FIG. 6A and a display apparatus. A lens 1611 is provided with the image pickup apparatus in the control unit 1612 and an optical system that projects light emitted from the display apparatus. An image is projected onto the lens 1611. The control unit 1612 functions as a power source that supplies electric power to the image pickup apparatus and the display apparatus and controls the operation of the image pickup apparatus and the display apparatus.

The control unit 1612 may include a gaze detection unit that detects the gaze of a wearer. Infrared light may be used for gaze detection. An infrared light-emitting unit emits infrared light to an eyeball of a user who is gazing at a displayed image. An image of the eyeball is captured by detecting the reflected infrared light from the eyeball with an image pickup unit having light-receiving elements. The deterioration of image quality is reduced by providing a reduction unit that reduces light from the infrared light-emitting unit to the display unit when viewed in plan. The user's gaze at the displayed image is detected from the image of the eyeball captured with the infrared light. Any known method can be employed to the gaze detection using the captured image of the eyeball. As an example, a gaze detection method based on a Purkinje image of the reflection of irradiation light on a cornea can be employed. More specifically, the gaze detection process is based on a pupil-corneal reflection method. Using the pupil-corneal reflection method, the user's gaze is detected by calculating a gaze vector representing the direction (rotation angle) of the eyeball based on the image of the pupil and the Purkinje image contained in the captured image of the eyeball.

A display apparatus according to an embodiment of the present disclosure may include an image pickup apparatus including light-receiving elements, and may control an image displayed on the display apparatus based on the gaze information of the user from the image pickup apparatus. Specifically, in the display apparatus, a first field of view at which the user gazes and a second field of view other than the first field of view are determined on the basis of the gaze information. The first field of view and the second field of view may be determined by the control unit of the display apparatus or may be determined by receiving those determined by an external control unit. In the display area of the display apparatus, the display resolution of the first field of view may be controlled to be higher than the display resolution of the second field of view. That is, the resolution of the second field of view may be lower than that of the first field of view.

The display area includes a first display area and a second display area different from the first display area. Based on the gaze information, an area of higher priority is determined from the first display area and the second display area. The first display area and the second display area may be determined by the control unit of the display apparatus or may be determined by receiving those determined by an external control unit. The resolution of an area of higher priority may be controlled to be higher than the resolution of an area other than the area of higher priority. In other words, the resolution of an area of a relatively low priority may be low.

Artificial intelligence (AI) may be used to determine the first field of view or the high-priority area. The AI may be a model configured to estimate the angle of gaze from the image of the eyeball and the distance to a target object located in the gaze direction, using the image of the eyeball and the actual direction of gaze of the eyeball in the image as teaching data. The AI program may be stored in the display apparatus, the image pickup apparatus, or an external apparatus. When the AI program is stored in the external apparatus, the AI program is transmitted to the display apparatus via communications.

In the case of controlling the display based on visual detection, smart glasses that further include an image pickup apparatus that captures an external image can be used. The smart glasses can display the captured external information in real time.

Figure 7A:
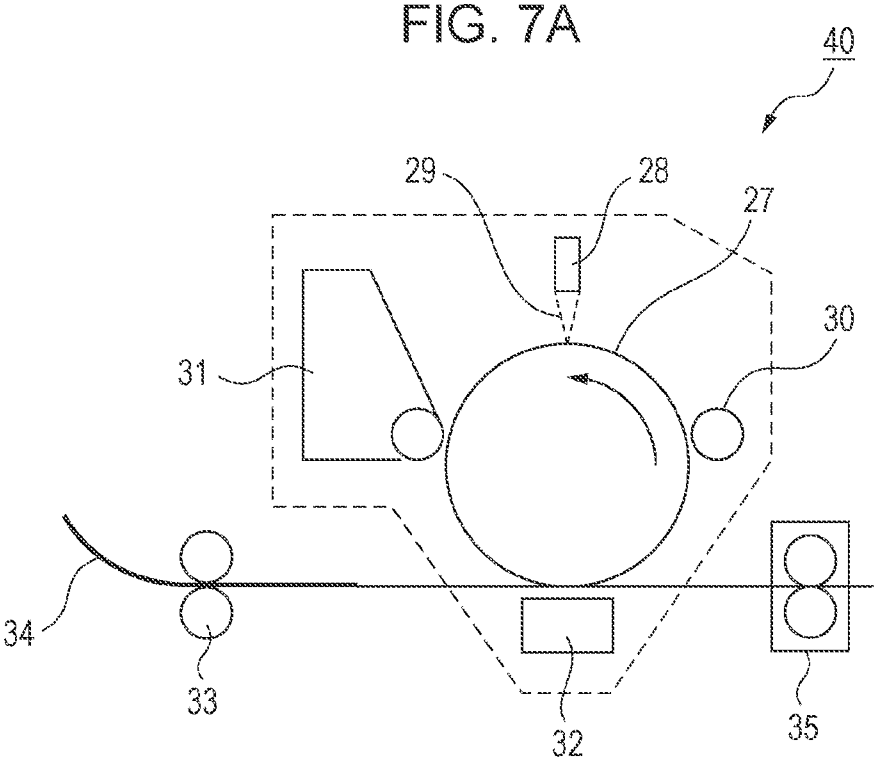
FIG. 7A is a schematic view of an example of an image-forming apparatus according to an embodiment of the present disclosure.

FIG. 7A is a schematic view of an example of an image-forming apparatus according to an embodiment of the present disclosure. An image-forming apparatus 40 is an electrophotographic image-forming apparatus and includes a photoconductor 27, an exposure light source 28, a charging unit 30, a developing unit 31, a transfer unit 32, a transport roller 33, and a fusing unit 35. The irradiation of light 29 is performed from the exposure light source 28 to form an electrostatic latent image on the surface of the photoconductor 27. The exposure light source 28 includes the organic light-emitting device according to the present embodiment. The developing unit 31 contains, for example, a toner. The charging unit 30 charges the photoconductor 27. The transfer unit 32 transfers the developed image to a recording medium 34. The transport roller 33 transports the recording medium 34. The recording medium 34 is paper, for example. The fusing unit 35 fixes the image formed on the recording medium 34.

Figure 7B:
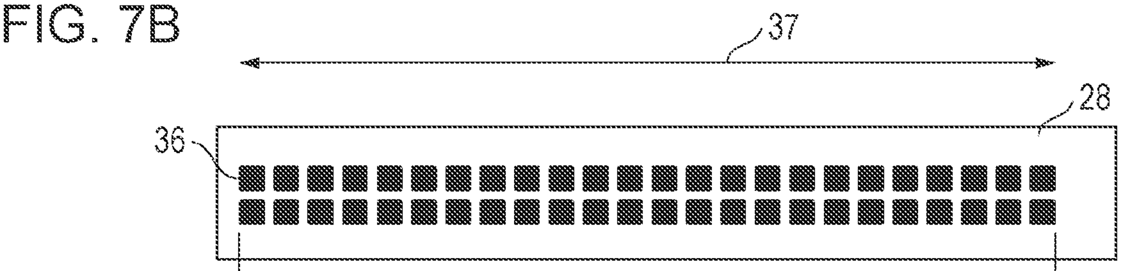
FIGS. 7B and 7C are each a schematic view of an example of an exposure light source of an image-forming apparatus according to an embodiment of the present disclosure.
Figure 7C:
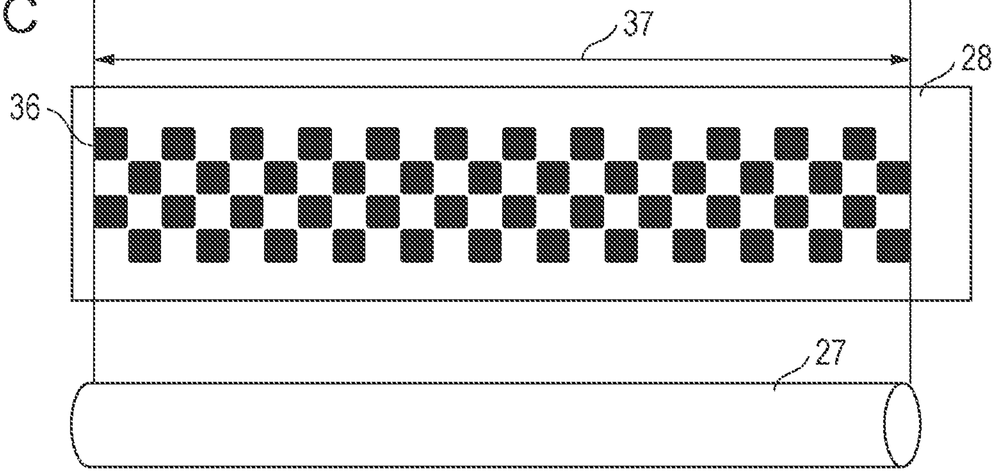

FIGS. 7B and 7C each illustrate the exposure light source 28 and are each a schematic view illustrating multiple light-emitting portions 36 arranged on a long substrate. Arrows 37 are parallel to the axis of the photoconductor and each represent the row direction in which the organic light-emitting devices are arranged. The row direction is the same as the direction of the axis on which the photoconductor 27 rotates. This direction can also be referred to as the long-axis direction of the photoconductor 27.

FIG. 7B illustrates a configuration in which the light-emitting portions 36 are arranged in the long-axis direction of the photoconductor 27. FIG. 7C is different from FIG. 7B in that the light-emitting portions 36 are arranged alternately in the row direction in a first row and a second row. The first row and the second row are located at different positions in the column direction. In the first row, the multiple light-emitting portions 36 are spaced apart.

The second row has the light-emitting portions 36 at positions corresponding to the positions between the light-emitting portions 36 in the first row. In other words, the multiple light-emitting portions 36 are also spaced apart in the column direction. The arrangement in FIG. 7C can be rephrased as, for example, a lattice arrangement, a staggered arrangement, or a checkered pattern.

As described above, the use of an apparatus including the organic light-emitting device according to the present embodiment enables a stable display with good image quality even for a long time.

EXAMPLES

While the present disclosure will be described below by examples, the present disclosure is not limited to these examples.

Example 1: Synthesis of Exemplified Compound C-1

Exemplified compound C-1 was synthesized according to the following scheme.

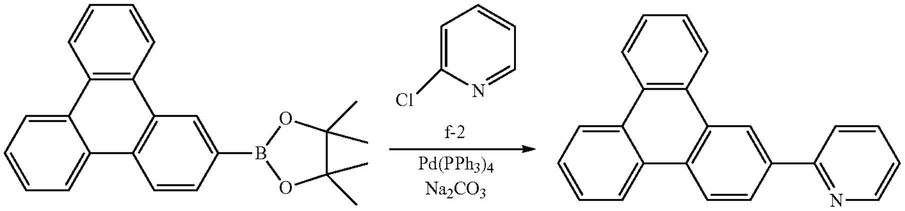

f-1 f-3

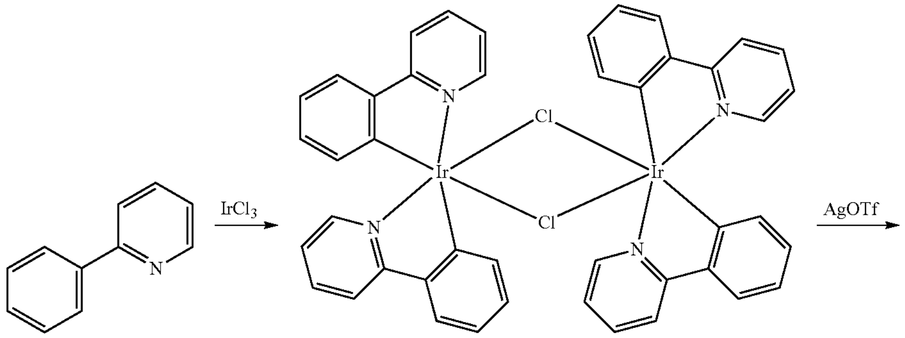

f-4 f-4

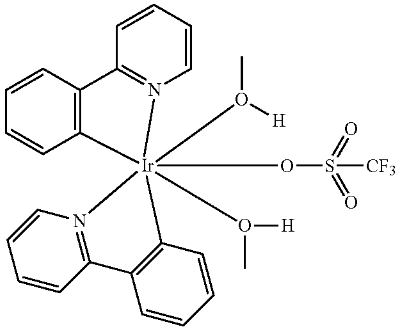

f-6

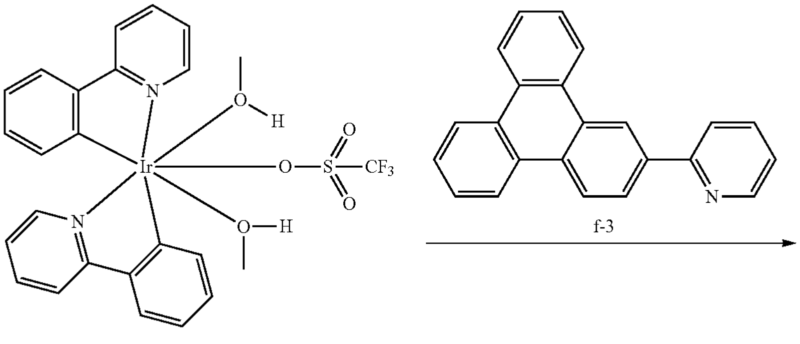

f-6

-continued

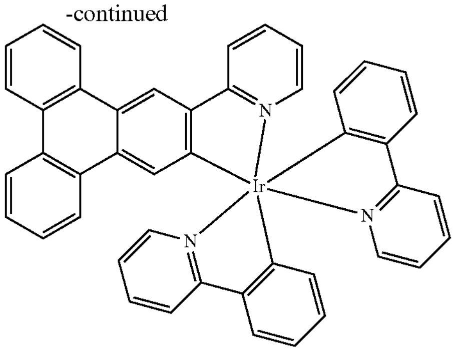

C-1

(1) Synthesis of Compound f-3

The following reagents and solvents were placed in a 200-mL recovery flask.

Compound f-1: 7.08 g (20.0 mmol)

Compound f-2: 2.27 g (20.0 mmol)

Sodium carbonate: 5.3 g (50.0 mmol)

$Pd(PPh_3)_4$: 578 mg

Toluene: 35 mL

Water: 35 mL

Ethanol: 10 mL

The reaction solution was heated and stirred at 60° C. for 5 hours under a stream of nitrogen. After the completion of the reaction, the mixture was extracted with toluene, and then the organic layer was concentrated to dryness. The resulting solid was purified by silica gel column chromatography (toluene-ethyl acetate mixture) to give 3.5 g (yield: 57%) of a transparent solid (f-3).

(2) Synthesis of Compound f-5

The following reagents and solvents were placed in a 50-mL recovery flask.

Compound f-4: 3.10 g (20.0 mmol)

Iridium chloride hydrate: 1.60 g

Ethoxyethanol: 18 mL

Water: 6 mL

The reaction solution was heated and stirred at 130° C. for 5 hours under a stream of nitrogen. After the completion of the reaction, the reaction solution was filtered, and the resulting solid was washed on the filter with water and methanol to give 3.4 g (yield: 63%) of a yellow solid (f-5).

(3) Synthesis of Compound f-6

The following reagents and solvents were placed in a 100-mL recovery flask.

Compound f-5: 1.07 g (1.00 mmol)

Silver triflate: 0.514 g (2.00 mmol)

Methylene chloride: 30 mL

Methanol: 1.3 mL

The reaction solution was stirred at room temperature for 7 hours under a stream of nitrogen. After the completion of the reaction, the solvents were removed from the reaction solution at 40° C. to give 1.56 g of a yellowish brown solid (f-6).

(4) Synthesis of Exemplified Compound C-1

The following reagents and solvent were placed in a 50-mL recovery flask.

Compound f-6: 1.50 g

Compound f-3: 3.05 g (1.00 mmol)

Ethanol: 50 mL

The reaction solution was heated and stirred at 90° C. for 6 hours under a stream of nitrogen. After the completion of the reaction, the reaction solution was filtered, and the resulting solid was washed on the filter with water and methanol. The resulting solid was purified by silica gel column chromatography (toluene-ethyl acetate mixture) to give 0.15 g (yield: 19%) of a yellow solid (exemplified compound C-1).

Exemplified compound C-1 was subjected to mass spectrometry with MALDI-TOF-MS (Bruker Autoflex LRF).

MALDI-TOF-MS

Measured value: m/z=805

Calculated value: $C_{45}H_{30}IrN_3$=805

Examples 2 to 14: Syntheses of Exemplified Compounds

As presented in Tables 5 and 6, exemplified compounds of Examples 2 to 14 were synthesized as in Example 1, except that raw material f-1 of Example 1 was changed to raw material 1, raw material f-2 to raw material 2, and raw material f-4 to raw material 3. The resulting exemplified compounds were subjected to mass spectrometry as in Example 1. The measured values (m/z) are presented.

TABLE 5
| Exam-ple | Exemplified compound | Raw material 1 | Raw material 2 | Raw material 3 | m/z |
|---|---|---|---|---|---|
| 2 | A-1 | 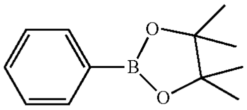 | 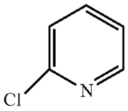 | 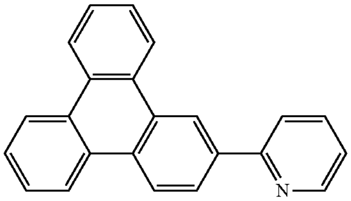 [SMILES: c1ccc(-c2ccc3c4ccccc4c4ccccc4c3c2)nc1] | 955 |
| 3 | A-5 | 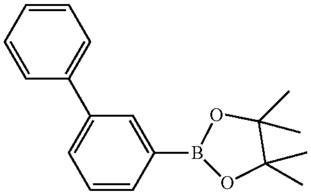 [SMILES: CC1(C)OB(c2cccc(-c3ccccc3)c2)OC1(C)C] | 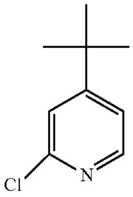 | 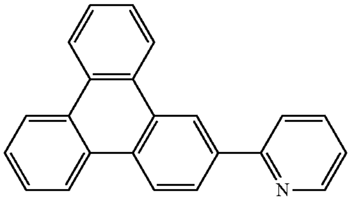 | 1087 |
| 4 | A-7 | 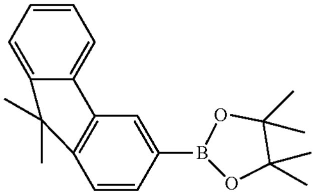 | 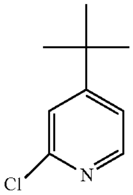 | 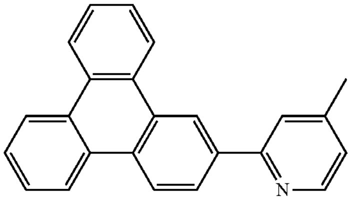 | 1141 |
| 5 | A-11 | 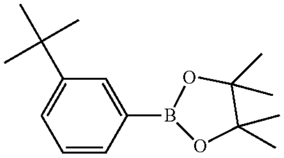 [SMILES: CC(C)(C)c1cccc(B2OC(C)(C)C(C)(C)O2)c1] | 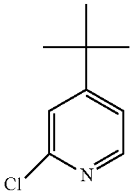 | 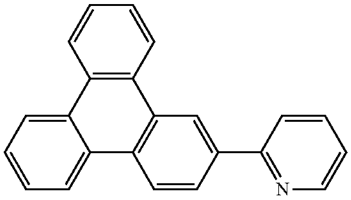 [SMILES: c1ccc(-c2ccc3c4ccccc4c4ccccc4c3c2)nc1] | 1081 |
| 6 | B-1 | 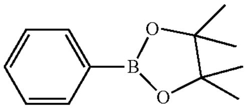 | 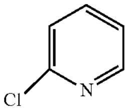 | 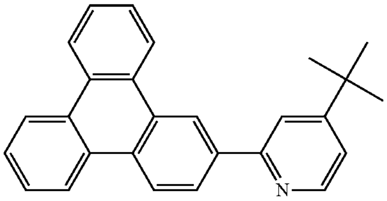 [SMILES: CC(C)(C)c1ccnc(-c2ccc3c4ccccc4c4ccccc4c3c2)c1] | 1011 |
| 7 | B-5 | 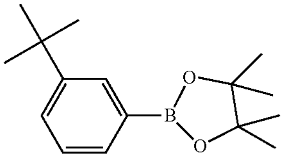 [SMILES: CC(C)(C)c1cccc(B2OC(C)(C)C(C)(C)O2)c1] | 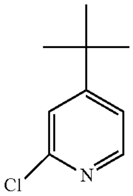 | 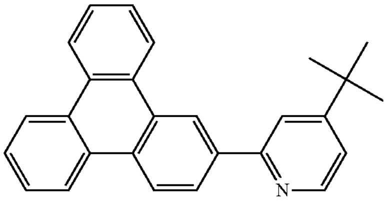 [SMILES: CC(C)(C)c1ccnc(-c2ccc3c4ccccc4c4ccccc4c3c2)c1] | 1123 |

TABLE 6
| Example | Exemplified compound | Raw material 1 | Raw material 2 | Raw material 3 | m/z |
|---|---|---|---|---|---|
| 8 | C-2 | 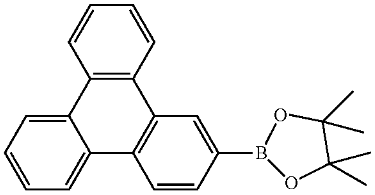 [SMILES: CC1(C)OB(c2ccc3c4ccccc4c4ccccc4c3c2)OC1(C)C] | 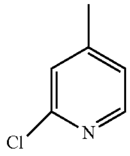 | 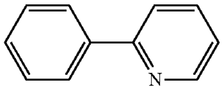 [SMILES: c1ccc(-c2ccccn2)cc1] | 819 |
| 9 | C-3 | 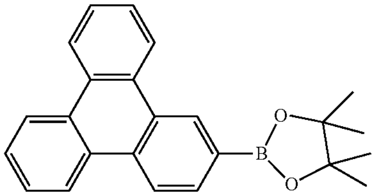 [SMILES: CC1(C)OB(c2ccc3c4ccccc4c4ccccc4c3c2)OC1(C)C] | 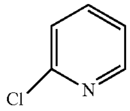 | 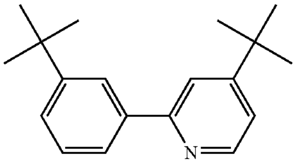 [SMILES: CC(C)(C)c1cccc(-c2cc(C(C)(C)C)ccn2)c1] | 1029 |
| 10 | D-1 | 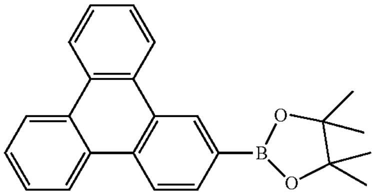 [SMILES: CC1(C)OB(c2ccc3c4ccccc4c4ccccc4c3c2)OC1(C)C] | 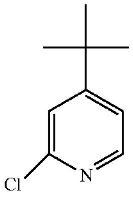 | 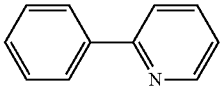 [SMILES: c1ccc(-c2ccccn2)cc1] | 861 |
| 11 | D-4 | 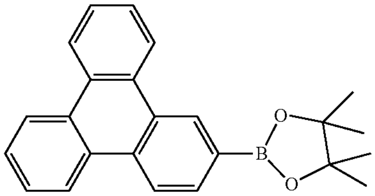 [SMILES: CC1(C)OB(c2ccc3c4ccccc4c4ccccc4c3c2)OC1(C)C] | 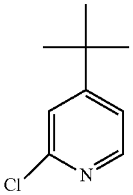 | 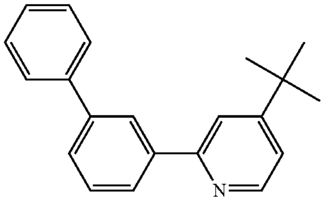 [SMILES: CC(C)(C)c1ccnc(-c2cccc(-c3ccccc3)c2)c1] | 1126 |
| 12 | D-5 | 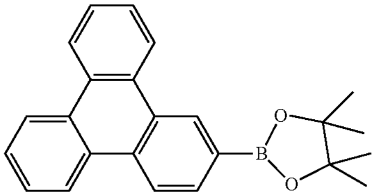 [SMILES: CC1(C)OB(c2ccc3c4ccccc4c4ccccc4c3c2)OC1(C)C] | 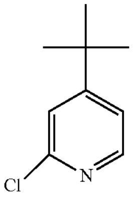 | 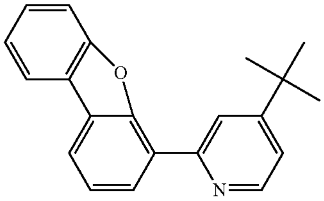 [SMILES: CC(C)(C)c1ccnc(-c2cccc3c2oc2ccccc23)c1] | 1153 |
| 13 | D-11 | 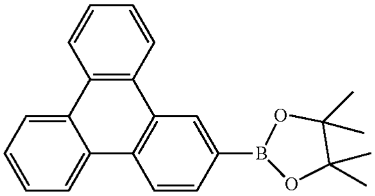 [SMILES: CC1(C)OB(c2ccc3c4ccccc4c4ccccc4c3c2)OC1(C)C] | 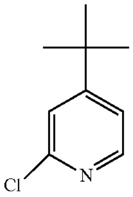 | 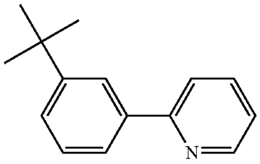 [SMILES: CC(C)(C)c1cccc(-c2ccccn2)c1] | 973 |
| 14 | D-12 | 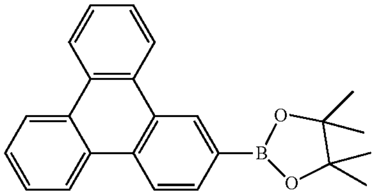 [SMILES: CC1(C)OB(c2ccc3c4ccccc4c4ccccc4c3c2)OC1(C)C] | 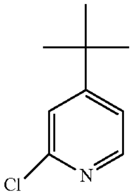 | 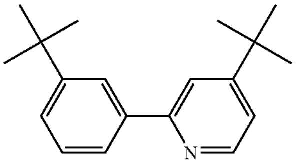 [SMILES: CC(C)(C)c1cccc(-c2cc(C(C)(C)C)ccn2)c1] | 1086 |

Example 15: Synthesis of Exemplified Compound A-16
Exemplified compound A-16 was synthesized according to the following scheme.
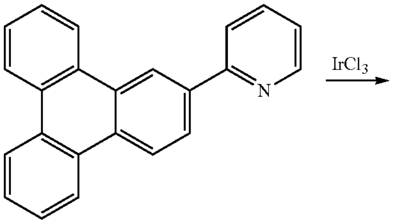
f-3
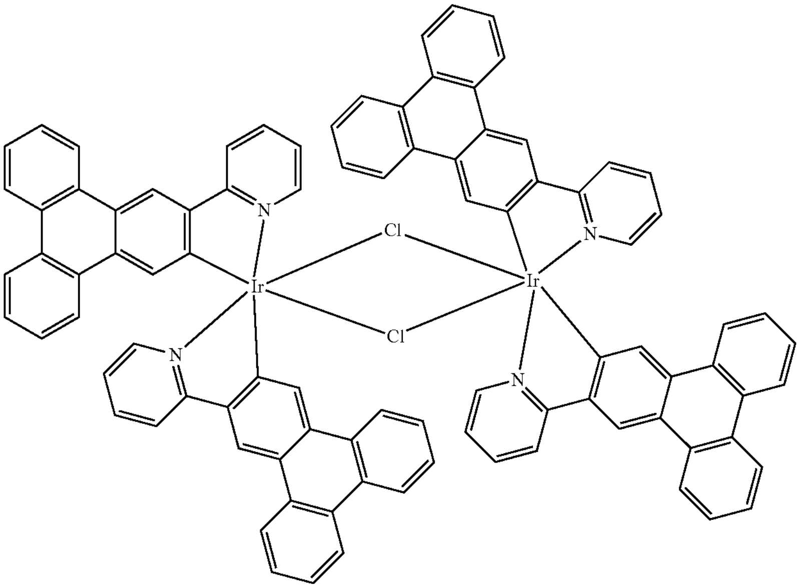
f-7
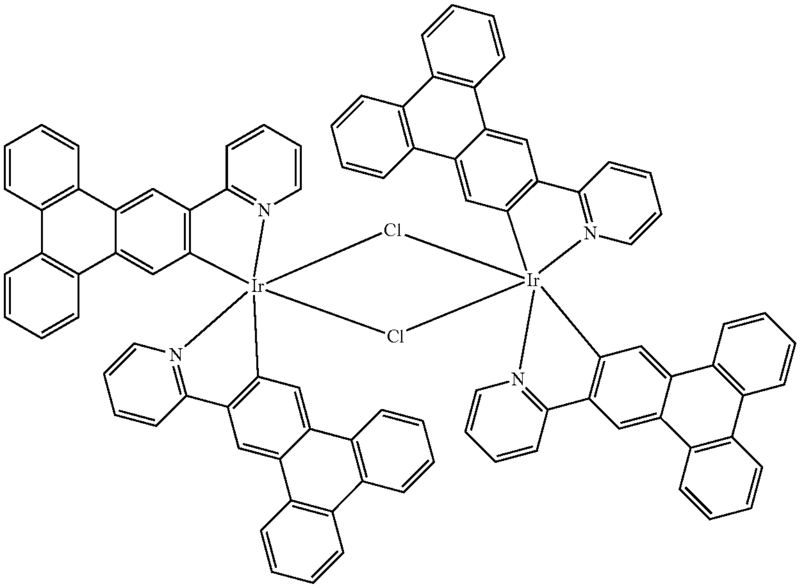
f-7
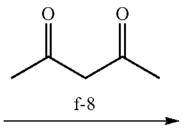

-continued

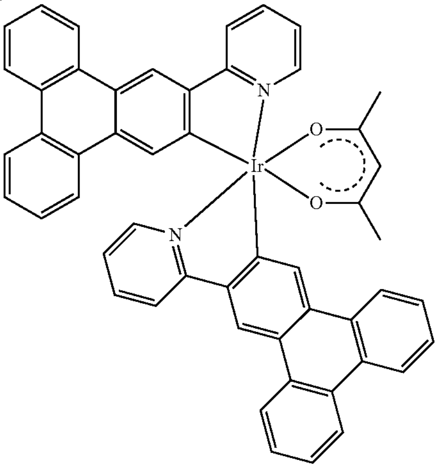

A-16

(1) Synthesis of Compound f-7

The following reagents and solvents were placed in a 50-mL recovery flask.

Compound f-3: 6.10 g (20.0 mmol)

Iridium chloride hydrate: 1.60 g

Ethoxyethanol: 36 mL

Water: 12 mL

The reaction solution was heated and stirred at 130° C. for 5 hours under a stream of nitrogen. After the completion of the reaction, the reaction solution was filtered, and the resulting solid was washed on the filter with water and methanol to give 4.3 g (yield: 51%) of a yellow solid (f-7).

(2) Synthesis of Exemplified Compound A-16

The following reagents and solvents were placed in a 100-mL recovery flask.

Compound f-7: 1.67 g (1.00 mmol)

Compound f-8: 0.40 g (4.00 mmol)

Sodium carbonate: 1.06 g (10.0 mmol)

Ethoxyethanol: 30 mL

Water: 12 mL

The reaction solution was heated and stirred at 100° C. for 6 hours under a stream of nitrogen. After cooling, methanol was added thereto. The mixture was filtered and then washed with methanol to give 0.42 g (yield: 46%) of a yellow solid (A-16).

The exemplified compound A-16 was subjected to mass spectrometry in the same manner as in Example 1.

MALDI-TOF-MS

Measured value: m/z=903

Calculated value: $C_{51}H_{38}IrO_2N_3$=900

Examples 16 to 19: Syntheses of Exemplified Compounds

As presented in Table 7, exemplified compounds of Examples 16 to 19 were synthesized as in Example 15, except that raw material f-3 of Example 15 was changed to raw material 1 and raw material f-8 to raw material 2. The resulting exemplified compounds were subjected to mass spectrometry as in Example 15. The measured values (m/z) are presented.

TABLE 7

| Example | Exemplified compound | Raw material 1 | Raw material 2 | m/z |
|---|---|---|---|---|
| 16 | A-17 | 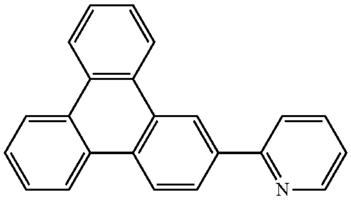 [SMILES: c1ccc(-c2ccc3c4ccccc4c4ccccc4c3c2)nc1] | 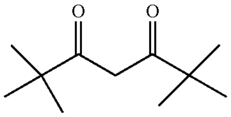 | 984 |
| 17 | B-11 | 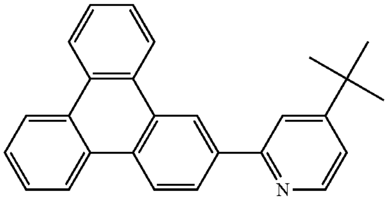 [SMILES: CC(C)(C)c1ccnc(-c2ccc3c4ccccc4c4ccccc4c3c2)c1] | 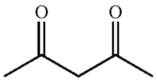 | 1012 |

TABLE 7-continued
| Example | Exemplified compound | Raw material 1 | Raw material 2 | m/z |
|---|---|---|---|---|
| 18 | B-12 | 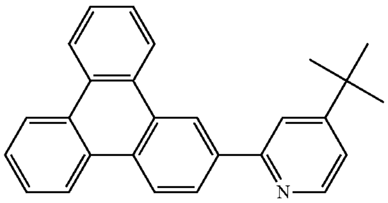 [SMILES: CC(C)(C)c1ccnc(-c2ccc3c4ccccc4c4ccccc4c3c2)c1] | 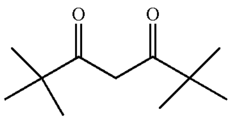 | 1097 |
| 19 | B-14 | 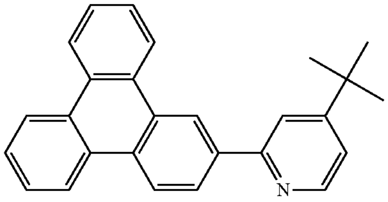 [SMILES: CC(C)(C)c1ccnc(-c2ccc3c4ccccc4c4ccccc4c3c2)c1] | 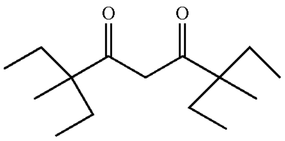 [SMILES: CCC(C)(CC)C(=O)CC(=O)C(C)(CC)CC] | 1040 |
Example 20: Synthesis of Exemplified Compound E-1
Exemplified compound E-1 was synthesized according to the following scheme.
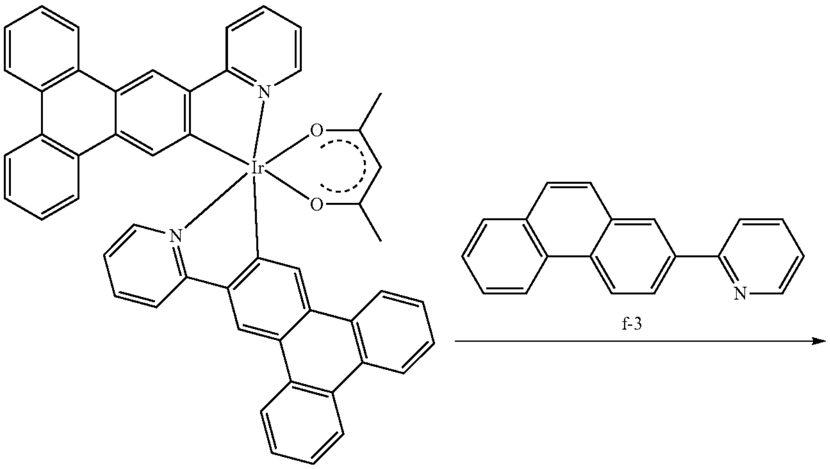
f-3
A-16

-continued

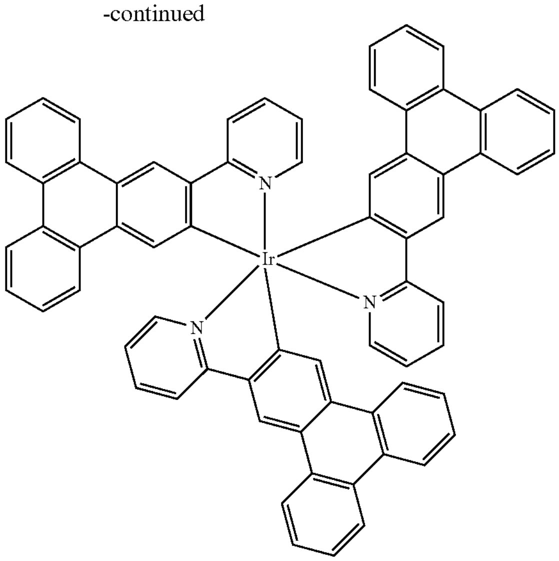

E-1

(1) Synthesis of Exemplified Compound E-1

The following reagents and solvent were placed in a 100-mL recovery flask.

Compound A-16: 0.90 g (1.00 mmol)

Compound f-3: 0.64 g (2.50 mmol)

Sodium carbonate: 1.06 g (10.0 mmol)

Glycerol: 30 mL

The reaction solution was subjected to degassing with nitrogen and then heated and stirred at 180° C. for 10 hours. After cooling, methanol was added thereto. The mixture was filtered and then washed with methanol. The resulting solid was purified by silica gel column chromatography (toluene-ethyl acetate mixture) to give 0.18 g (yield: 16%) of a yellow solid (exemplified compound E-1).

Exemplified compound E-1 was subjected to mass spectrometry in the same manner as in Example 1.

MALDI-TOF-MS

Measured value: m/z=1105

Calculated value: $C_{69}H_{42}IrN_3$=1105

Example 21

An organic light-emitting device having a bottom-emission structure was produced in which an anode, a hole injection layer, a hole transport layer, an electron-blocking layer, a light-emitting layer, a hole-blocking layer, an electron transport layer, an electron injection layer, and a cathode were sequentially formed on a substrate.

An ITO film was formed on a glass substrate and subjected to desired patterning to form an ITO electrode (anode). The ITO electrode had a thickness of 100 nm. The substrate on which the ITO electrode had been formed in this way was used as an ITO substrate in the following steps. Next, vapor deposition was performed by resistance heating in a vacuum chamber at $1.33\times10^{-4}$ Pa to continuously form organic compound layers and an electrode layer presented in Table 8 on the ITO substrate. Here, the opposing electrode (metal electrode layer, cathode) had an electrode area of 3 $mm^2$. A host material (first compound) had a higher lowest excited triplet energy level than a dopant material.

TABLE 8

| | | Material | | Thickness (nm) |
|---|---|---|---|---|
| Cathode | | Al | | 100 |
| Electron injection layer (EIL) | | LiF | | 1 |
| Electron transport layer (ETL) | | ET2 | | 25 |
| Hole-blocking layer (HBL) | | ET11 | | 15 |
| | host material | assist material | dopant material | |
| Light-emitting layer (EML) | Q-1-22 | S-1-5 | A-1 | 20 |
| Light-emitting layer, % by mass | 60 | 30 | 10 | |
| Electron-blocking layer (EBL) | | HT7 | | 10 |
| Hole transport layer (HTL) | | HT2 | | 20 |
| Hole injection layer (HIL) | | HT16 | | 5 |

The characteristics of the resulting device were measured and evaluated. As presented in Table 9, the light-emitting device had a maximum emission wavelength of 534 nm and an efficiency of 58 cd/A. The device was subjected to a continuous operation test at a current density of 50 $mA/cm^2$. The time when the percentage of luminance degradation reached 5% was measured.

With regard to measurement instruments, in the Examples, the current-voltage characteristics were measured with a Hewlett-Packard 4140B microammeter, and the luminance was measured with a Topcon BM7.

Examples 22 to 29

Organic light-emitting devices in Examples 22 to 29 were produced in the same manner as in Example 21, except that the materials of the light-emitting layers were appropriately changed to materials presented in Table 9. A host material (first compound) had a higher lowest excited triplet energy level than a dopant material. The resulting devices were evaluated in the same manner as in Example 21. The time when the percentage of luminance degradation reaches 5% is indicated by a ratio when the time in Example 21 is set to 1.0. Table 9 presents the measurement results.

TABLE 9

| | EML | | | | Emission | Ratio of |
|---|---|---|---|---|---|---|
| | Host material | Assist material | Dopant material | Efficiency Cd/A | wavelength nm | luminance degradation |
| Example 21 | Q-1-22 | S-1-5 | A-1 | 58 | 534 | 1.0 |
| Example 22 | Q-1-22 | S-1-4 | A-11 | 58 | 533 | 0.9 |
| Example 23 | Q-1-18 | S-1-5 | B-1 | 57 | 530 | 1.5 |
| Example 24 | Q-1-18 | S-1-5 | B-5 | 57 | 529 | 1.6 |
| Example 25 | Q-1-19 | S-1-4 | C-1 | 56 | 534 | 1.2 |
| Example 26 | Q-1-22 | S-1-5 | C-3 | 57 | 533 | 1.2 |
| Example 27 | Q-1-19 | S-1-4 | D-1 | 57 | 530 | 1.8 |
| Example 28 | Q-1-24 | S-1-4 | D-4 | 58 | 530 | 1.9 |
| Example 29 | Q-1-24 | S-1-4 | D-12 | 58 | 529 | 1.8 |

In Table 9, each of the dopant materials of Examples 23, 24, and 27 to 29 is a compound in which $R_{13}$ contains a tertiary alkyl group. Thus, the emission wavelength is 529 nm to 530 nm, which is the optimal emission wavelength as green. Each of the dopant materials of Examples 21, 22, 25, and 26 is a compound in which $R_{13}$ does not contain a tertiary alkyl group. Thus, the emission wavelength is longer than those of the dopant materials of Examples 23, 24, and 27 to 29.

Example 30

An organic light-emitting device was produced in the same manner as in Example 21, except that the compounds and thicknesses were changed to those presented in Table 10. A host material (first compound) had a higher lowest excited triplet energy level than a dopant material.

TABLE 10

| | | Material | | Thickness (nm) |
|---|---|---|---|---|
| Cathode | | Al | | 100 |
| Electron injection layer (EIL) | | LiF | | 1 |
| Electron transport layer (ETL) | | ET2 | | 25 |
| Hole-blocking layer (HBL) | | ET12 | | 15 |
| | host material | assist material | dopant material | |
| Light-emitting layer (EML) | Q-1-22 | S-1-5 | B-1 | 20 |
| Light-emitting layer, % by mass | 60 | 30 | 10 | |
| Electron-blocking layer (EBL) | | HT8 | | 10 |
| Hole transport layer (HTL) | | HT6 | | 20 |
| Hole injection layer (HIL) | | HT16 | | 5 |

The characteristics of the resulting device were measured and evaluated in the same way as in Example 21. As presented in Table 11, the light-emitting device had a maximum emission wavelength of 530 nm and an efficiency of 58 cd/A.

Examples 31 to 36 and Comparative Examples 1 to 5

Organic light-emitting devices in Examples 31 to 36 and Comparative examples 1 to 5 were produced in the same manner as in Example 30, except that the materials of the light-emitting layers were appropriately changed to materials presented in Table 11. A host material (first compound) had a higher lowest excited triplet energy level than a dopant material. Compounds Q-2-1 to Q-2-3 and S-4-1 are illustrated below.

Q-2-1

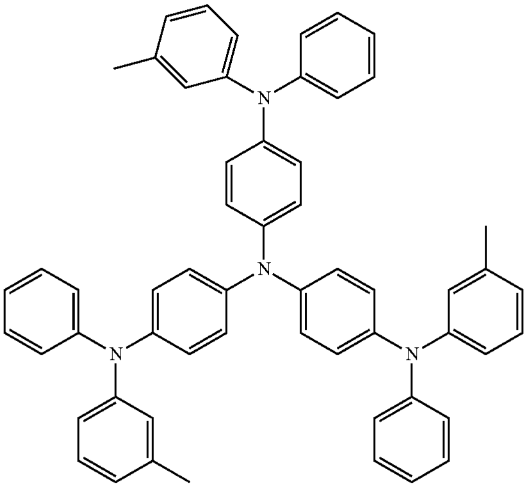

Q-2-2

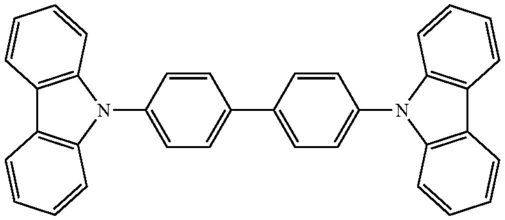

Q-2-3

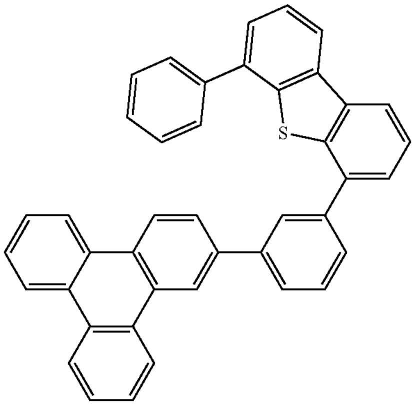

-continued

S-4-1

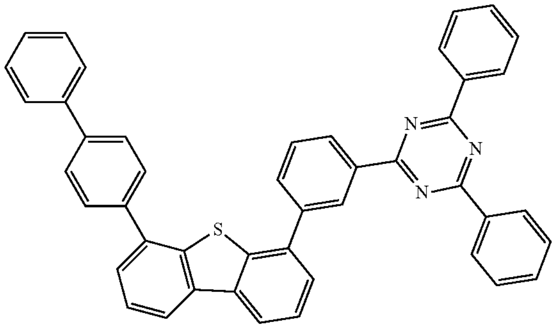

The resulting devices were evaluated in the same manner as in Example 30. The time when the percentage of luminance degradation reaches 5% is indicated by a ratio when the time when the percentage of luminance degradation in Example 30 reaches 5% is set to 1.0. Table 11 presents the measurement results.

TABLE 11

| | EML | | | | Emission | Ratio of |
|---|---|---|---|---|---|---|
| | Host material | Assist material | Dopant material | Efficiency Cd/A | wavelength nm | luminance degradation |
| Example 30 | Q-1-22 | S-1-5 | B-1 | 58 | 530 | 1.0 |
| Example 31 | Q-1-17 | S-1-4 | B-5 | 57 | 529 | 1.1 |
| Example 32 | Q-1-22 | S-1-4 | D-1 | 57 | 530 | 1.0 |
| Example 33 | Q-1-19 | S-2-8 | D-4 | 56 | 530 | 1.1 |
| Example 34 | Q-1-18 | S-3-3 | D-1 | 57 | 530 | 1.1 |
| Example 35 | Q-1-22 | no | B-1 | 53 | 530 | 0.7 |
| Example 36 | Q-1-17 | HT-2 | D-1 | 52 | 530 | 0.8 |
| Comparative example 1 | HT-2 | S-1-5 | D-4 | 53 | 530 | 0.3 |
| Comparative example 2 | Q-2-1 | no | B-1 | 51 | 530 | 0.2 |
| Comparative example 3 | Q-2-1 | S-1-4 | B-1 | 52 | 530 | 0.3 |
| Comparative example 4 | Q-2-2 | S-1-5 | B-1 | 52 | 530 | 0.1 |
| Comparative example 5 | Q-2-3 | S-4-1 | D-1 | 53 | 530 | 0.3 |

Table 12 presents the LUMO levels of the host materials and the assist materials used in Examples. Each LUMO level is calculated as follows: The ionization potential (IP) is determined with an AC-3 photoelectron spectrometer in air, available from Riken Keiki Co., Ltd. The LUMO level is calculated by subtracting the optical band gap (BG) determined with a UV-visible spectrophotometer, available from JASCO Corporation, from the resulting ionization potential.

TABLE 12

| | Material | LUMO level (eV) |
|---|---|---|
| Host | Q-1-22 | 2.8 |
| | Q-1-19 | 2.8 |
| | Q-1-18 | 2.8 |
| | Q-1-17 | 2.8 |
| | HT-2 | 2.5 |
| | Q-2-1 | 2.8 |
| | Q-2-2 | 2.7 |
| Assist | S-1-5 | 3.4 |
| | S-1-4 | 3.3 |
| | S-2-8 | 2.9 |
| | S-3-3 | 3.0 |

From Table 11, each of the host materials used in Comparative examples 1 to 5 contains nitrogen or sulfur, and the resulting devices have lower efficiency and shorter life than the devices in Examples 30 to 36 in which the host materials are hydrocarbon compounds. In addition, the devices of Examples 30 to 34 contain the assist materials having lower LUMO levels than the respective host materials. Thus, the efficiency is high, compared with Example 35, in which no assist material is contained, and Example 36, in which the assist material having a higher LUMO level than the host material is contained. From this, by selecting a hydrocarbon compound as the host material and an assist material having a lower LUMO level than the host material, it is possible to provide a device having high efficiency and long life.

The organic compound according to an embodiment of the present disclosure emits light suitable for green light emission and has high chemical stability. Thus, the use of the organic compound according to an embodiment of the present disclosure as the component material of the organic light-emitting device enables the organic light-emitting device to have superior light-emitting characteristics and superior durability characteristics.

The organic light-emitting device according to an embodiment of the present disclosure emits light having superior color purity as green and has high luminous efficiency and superior driving durability characteristics.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-158239 filed Sep. 28, 2021, which is hereby incorporated by reference herein in its entirety.

What is claimed is:

1. An organic compound which is any of the following compounds:

-continued
B-1
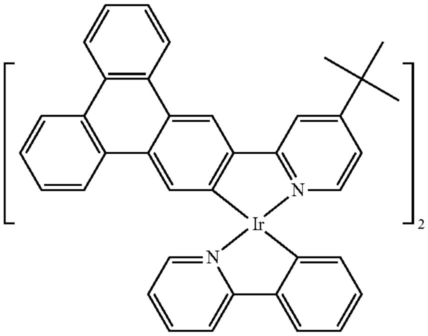
B-4
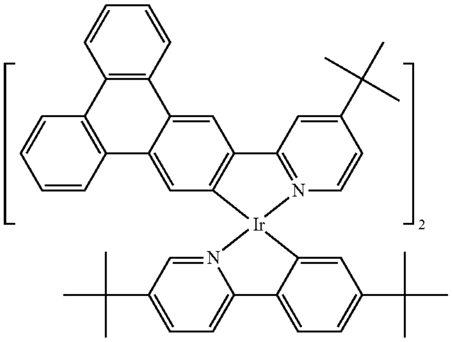
B-5
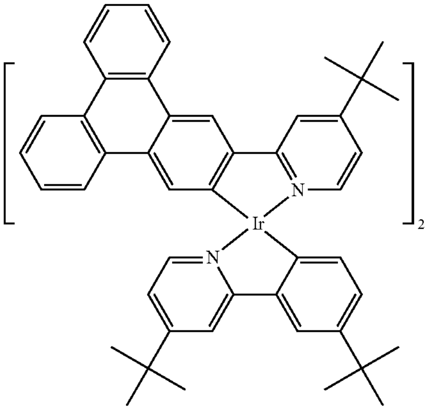
B-9
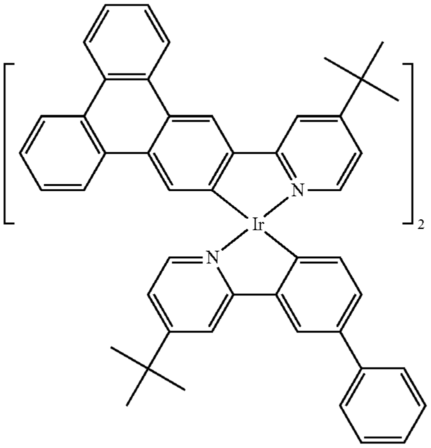
D-1
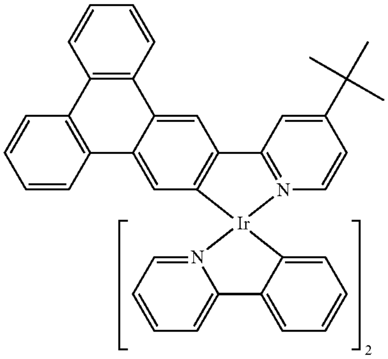
D-14
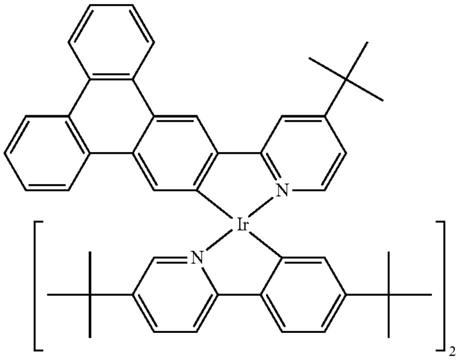
D-12
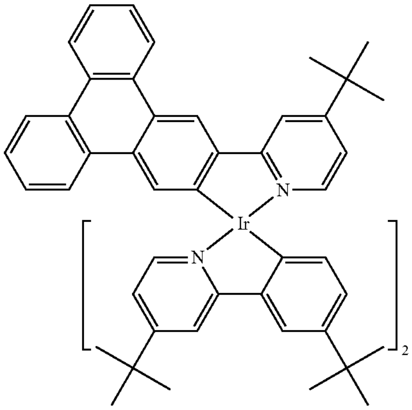
D-4
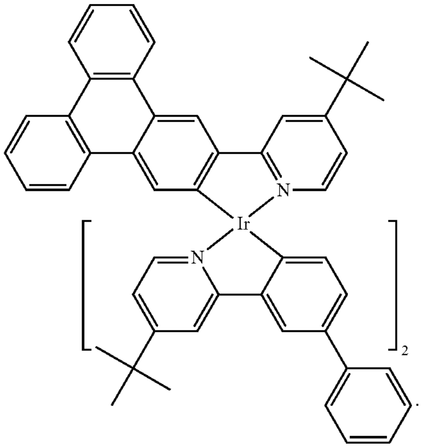
.

2. An organic light-emitting device, comprising, in sequence:

a first electrode;

a light-emitting layer; and a second electrode, wherein the light-emitting layer contains a dopant material and a first compound having a higher lowest excited triplet energy level than the dopant material, the dopant material is a compound represented by general formula [1], and the first compound is a hydrocarbon compound,

[1]

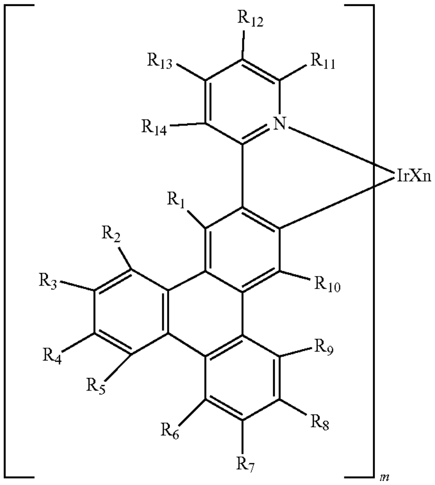

where in formula [1], $R_1$ to $R_{14}$ are each independently selected from a hydrogen atom, a deuterium atom, a halogen atom, a cyano group, a substituted or unsubstituted alkyl group, a substituted or unsubstituted aralkyl group, a substituted or unsubstituted alkoxy group, a substituted or unsubstituted aryloxy group, a substituted or unsubstituted heteroaryloxy group, a substituted or unsubstituted aryl group, and a substituted or unsubstituted heterocyclic group, provided that $R_1$ to $R_{14}$ do not contain a Si atom, m is an integer of 1 or more and 3 or less, and n is an integer of 0 or more and 2 or less, provided that m+n is 3, X is a bidentate ligand, and a partial structure IrX is any of structures represented by general formulae [2] and [3]:

[2]

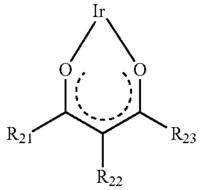

[3]

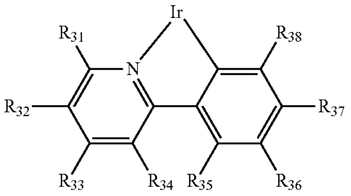

where in formulae [2] and [3], $R_{21}$ to $R_{23}$, and $R_{31}$ to $R_{38}$ are each independently selected from a hydrogen atom, a deuterium atom, a halogen atom, a cyano group, a substituted or unsubstituted alkyl group, a substituted or unsubstituted aralkyl group, a substituted or unsubstituted alkoxy group, a substituted or unsubstituted aryloxy group, a substituted or unsubstituted heteroaryloxy group, a substituted or unsubstituted aryl group, and a substituted or unsubstituted heterocyclic group, adjacent groups of $R_{35}$ to $R_{38}$ are optionally taken together to form a ring, and wherein at least one of $R_{11}$ to $R_{14}$ is a tert-butyl group.

3. The organic light-emitting device according to claim 2, wherein at least one of $R_1$ to $R_{14}$ is a hydrogen atom, a deuterium atom, a halogen atom, a cyano group, a substituted or unsubstituted alkyl group, or a substituted or unsubstituted alkoxy group.

4. The organic light-emitting device according to claim 2, wherein $R_{13}$ is the tert-butyl group.

5. The organic light-emitting device according to claim 2, wherein the dopant material is any of the following compounds:

B-1

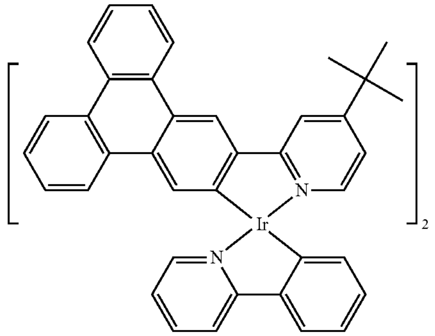

B-4

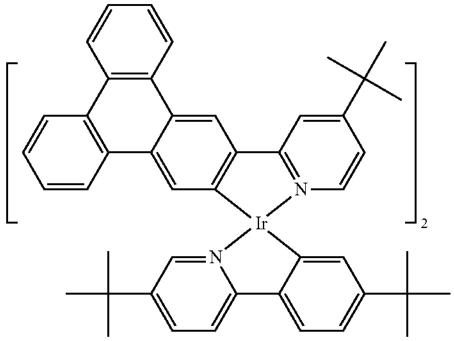

-continued

B-5

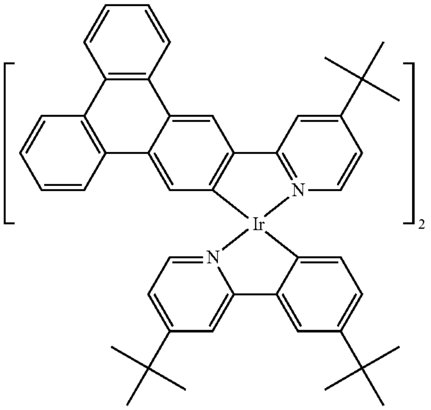

B-9

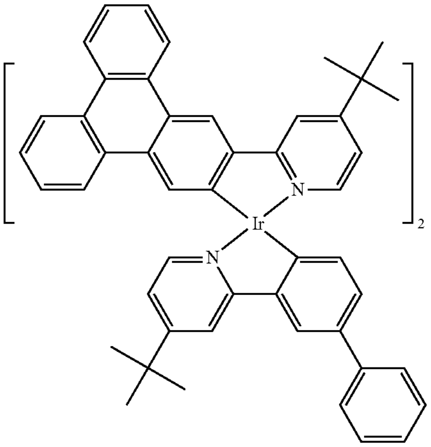

D-1

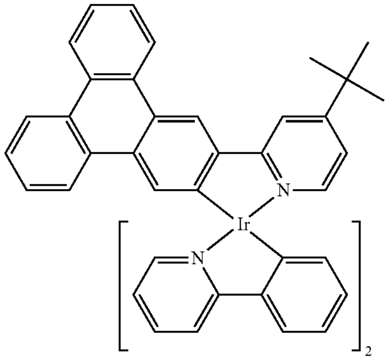

D-14

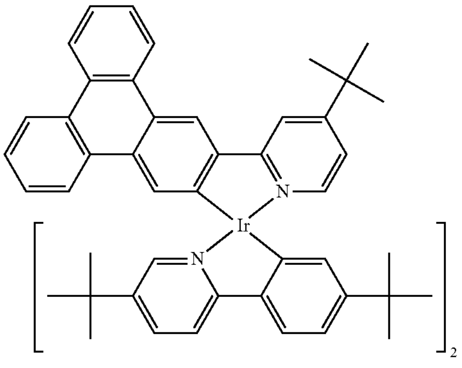

-continued

D-12

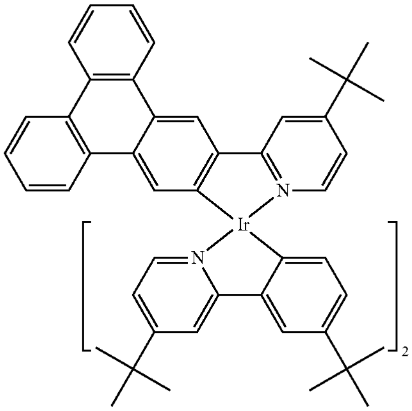

D-4

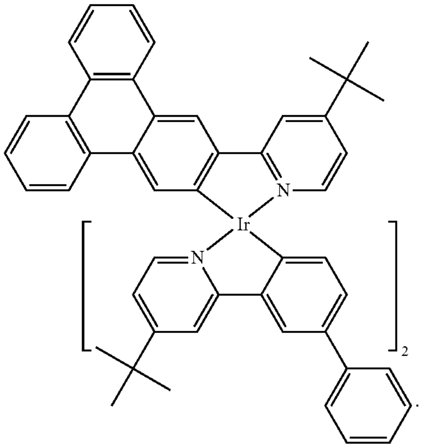

6. The organic light-emitting device according to claim 2, wherein the first compound has a skeleton including at least any of a triphenylene ring, a phenanthrene ring, a chrysene ring, and a fluoranthene ring.

7. The organic light-emitting device according to claim 2, wherein the light-emitting layer further contains a second compound, and the second compound has a lower lowest unoccupied molecular orbital (LUMO) level than the first compound (farther from the vacuum level).

8. The organic light-emitting device according to claim 7, wherein the second compound is a compound partially including any of the following structures:

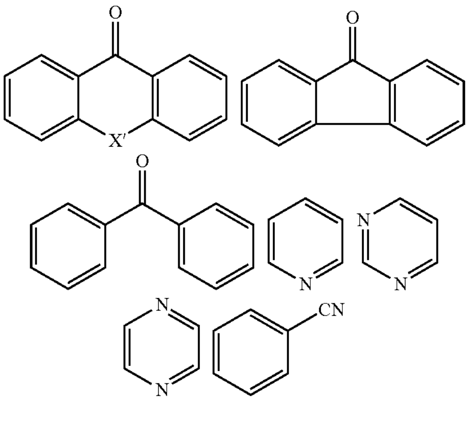

where X' is an oxygen atom, a sulfur atom, or a substituted or unsubstituted carbon atom.

9. A display apparatus, comprising:

multiple pixels, at least one of the multiple pixels including:

the organic light-emitting device according to claim 2, and a transistor coupled to the organic light-emitting device.

10. A photoelectric conversion apparatus, comprising:

an optical unit including multiple lenses;

an image pickup device configured to receive light passing through the optical unit; and a display unit configured to display an image captured by the image pickup device, wherein the display unit includes the organic light-emitting device according to claim 2.

11. An electronic apparatus, comprising:

a display unit including the organic light-emitting device according to claim 2;

a housing provided with the display unit; and a communication unit being disposed in the housing and communicating with an outside.

12. A lighting apparatus, comprising:

a light source including the organic light-emitting device according to claim 2; and a light diffusion unit or an optical filter configured to transmit light emitted from the light source.

13. A moving object, comprising:

a lighting unit including the organic light-emitting device according to claim 2; and a body provided with the lighting unit.

14. An exposure light source for an electrophotographic image-forming apparatus, comprising:

the organic light-emitting device according to claim 2.

15. An organic light-emitting device, comprising, in sequence:

a first electrode;

a light-emitting layer; and a second electrode, wherein the light-emitting layer contains a dopant material and a first compound having a higher lowest excited triplet energy level than the dopant material, the dopant material is a compound represented by general formula [1], and the first compound is a hydrocarbon compound,

[1]

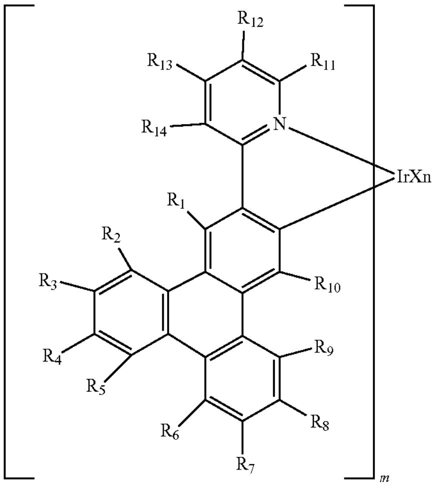

where in formula [1], $R_1$ to $R_{14}$ are each independently selected from a hydrogen atom, a deuterium atom, a halogen atom, a cyano group, a substituted or unsubstituted alkyl group, a substituted or unsubstituted aralkyl group, a substituted or unsubstituted alkoxy group, a substituted or unsubstituted aryloxy group, a substituted or unsubstituted heteroaryloxy group, a substituted or unsubstituted aryl group, and a substituted or unsubstituted heterocyclic group, provided that $R_1$ to $R_{14}$ do not contain a Si atom, m is an integer of 1 or more and 3 or less, and n is an integer of 0 or more and 2 or less, provided that m+n is 3, X is a bidentate ligand, and a partial structure IrX is any of structures represented by general formulae [2] and [3]:

[2]

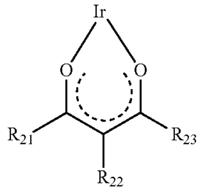

[3]

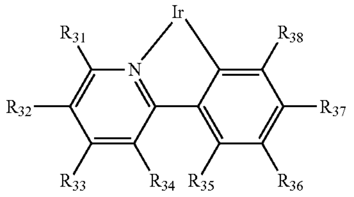

where in formulae [2] and [3], $R_{21}$ to $R_{23}$, and $R_{31}$ to $R_{38}$ are each independently selected from a hydrogen atom, a deuterium atom, a halogen atom, a cyano group, a substituted or unsubstituted alkyl group, a substituted or unsubstituted aralkyl group, a substituted or unsubstituted alkoxy group, a substituted or unsubstituted aryloxy group, a substituted or unsubstituted heteroaryloxy group, a substituted or unsubstituted aryl group, and a substituted or unsubstituted heterocyclic group, adjacent groups of $R_{35}$ to $R_{38}$ are optionally taken together to form a ring, and wherein the light-emitting layer further contains a second compound, and the second compound has a lower lowest unoccupied molecular orbital (LUMO) level than the first compound (farther from the vacuum level).

16. The organic light-emitting device according to claim 15, wherein the second compound is a compound partially including any of the following structures:

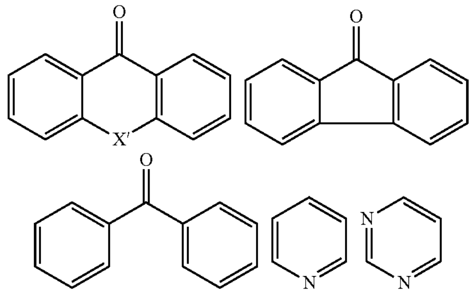

-continued

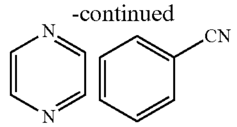

where X' is an oxygen atom, a sulfur atom, or a substituted or unsubstituted carbon atom.

17. The organic light-emitting device according to claim 15, wherein at least one of $R_1$ to $R_{14}$ is a tertiary alkyl group.

18. The organic light-emitting device according to claim 15, wherein at least one of $R_{11}$ to $R_{14}$ is a tertiary alkyl group.

19. The organic light-emitting device according to claim 15, wherein at least one of $R_1$ to $R_{14}$ is a hydrogen atom, a deuterium atom, a halogen atom, a cyano group, a substituted or unsubstituted alkyl group, or a substituted or unsubstituted alkoxy group.

* * * * *